(12) United States Patent
Itoi

(10) Patent No.: US 9,966,536 B2
(45) Date of Patent: May 8, 2018

(54) ORGANIC ELECTROLUMINESCENCE DEVICE

(71) Applicant: SAMSUNG DISPLAY CO., LTD., Yongin, Gyeonggi-Do (KR)

(72) Inventor: Hiroaki Itoi, Yokohama (JP)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 285 days.

(21) Appl. No.: 14/701,307

(22) Filed: Apr. 30, 2015

(65) Prior Publication Data
US 2016/0079542 A1     Mar. 17, 2016

(30) Foreign Application Priority Data

Sep. 9, 2014 (JP) ................. 2014-183625
Sep. 9, 2014 (JP) ................. 2014-183626

(51) Int. Cl.
*H01L 51/50*     (2006.01)
*H01L 51/00*     (2006.01)

(52) U.S. Cl.
CPC ........ *H01L 51/0061* (2013.01); *H01L 51/006* (2013.01); *H01L 51/0058* (2013.01);
(Continued)

(58) Field of Classification Search
CPC  H01L 51/0061; H01L 51/506; H01L 51/5064
(Continued)

(56) References Cited

U.S. PATENT DOCUMENTS

2010/0289008 A1*  11/2010  Jang ................... H01L 51/5052
                                                                  257/40
2011/0156016 A1*   6/2011  Kawamura ........... C07C 211/54
                                                                  257/40
(Continued)

FOREIGN PATENT DOCUMENTS

JP       2004-339066 A       12/2001
JP       2002241352 A   *    8/2002
(Continued)

OTHER PUBLICATIONS

Machine Translation of JP 2002241352 A (Year: 2017).*

*Primary Examiner* — Michael M Dollinger
(74) *Attorney, Agent, or Firm* — Lee & Morse, P.C.

(57) ABSTRACT

An organic electroluminescent (EL) device including an anode; an emission layer for obtaining luminescence via a singlet excited state; and a laminated structure between the anode and the emission layer, the laminated structure including at least three layers having different components, wherein the laminated structure includes a first layer including a hole transport compound, the hole transport compound being obtained by doping an electron accepting compound having a lowest unoccupied molecular orbital (LUMO) level of about −9.0 eV to about −4.0 eV; and a second layer between the first layer and the emission layer, the second layer being closer to the emission layer than the first layer and including a compound represented by the following Formula 1:

(Continued)

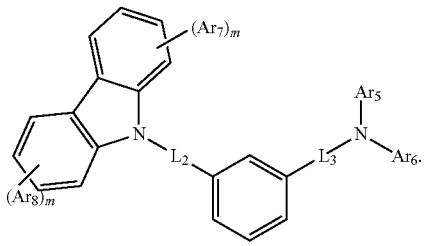

[Formula 1]

11 Claims, 1 Drawing Sheet

(52) U.S. Cl.
CPC ...... *H01L 51/0067* (2013.01); *H01L 51/0072* (2013.01); *H01L 51/0073* (2013.01); *H01L 51/0074* (2013.01); *H01L 51/0081* (2013.01); *H01L 51/5004* (2013.01); *H01L 51/506* (2013.01); *H01L 51/5012* (2013.01); *H01L 51/5056* (2013.01); *H01L 51/5064* (2013.01); *H01L 2251/308* (2013.01); *H01L 2251/552* (2013.01)

(58) Field of Classification Search
USPC .......................................................... 428/690
See application file for complete search history.

(56) References Cited

U.S. PATENT DOCUMENTS

| 2011/0215308 | A1* | 9/2011 | Im ........................ H01L 51/006 257/40 |
| 2012/0326137 | A1* | 12/2012 | Song ................... H01L 51/5064 257/40 |
| 2013/0049579 | A1 | 2/2013 | Kaiser et al. |
| 2014/0001444 | A1* | 1/2014 | Kim .................... H01L 51/5064 257/40 |

FOREIGN PATENT DOCUMENTS

| JP | 4770033 B2 | 7/2011 |
| JP | 2011-187959 A | 9/2011 |
| JP | 2013-522864 A | 6/2013 |
| KR | 10-2013-0007159 A | 1/2013 |
| WO | WO-2007/105906 A1 | 9/2007 |
| WO | WO-2008/145239 A2 | 12/2008 |

\* cited by examiner

ORGANIC ELECTROLUMINESCENCE DEVICE

CROSS-REFERENCE TO RELATED APPLICATIONS

Japanese Patent Application No. 2014-183625, filed on Sep. 9, 2014, and Japanese Patent Application No. 2014-183626 filed on Sep. 9, 2014 in the Japanese Patent Office, and entitled: "Organic Electroluminescent Device," are incorporated by reference herein in their entirety.

BACKGROUND

1. Field

Embodiments relate to an organic electroluminescent device.

2. Description of the Related Art

Recently, an organic electroluminescent display (organic EL display) is being actively developed as an image display apparatus. The organic EL display is, unlike a liquid crystal display or the like, a self-emitting type display which embodies display through light emission of a luminescent material including an organic compound of the light emitting layer by recombining holes and electrons injected from an anode and a cathode in an emission layer.

An example of an organic electroluminescent device (organic EL device) may include an anode, a hole transport layer disposed on the anode, an emission layer disposed on the hole transport layer, an electron transport layer disposed on the emission layer and a cathode disposed on the electron transport layer. Holes may be injected from the anode, and the injected holes are injected into the emission layer through the hole transport layer. Meanwhile, electrons are injected from the cathode, and the injected electrons are injected into the emission layer through the electron transport layer. The holes and the electrons injected into the emission layer are recombined, and excitons are generated in the emission layer. The organic EL device emits light by using light generated by the radiation deactivation of the excitons. The organic EL device is not limited to the aforementioned constitution, but many modifications thereof are possible.

SUMMARY

Embodiments are directed to an organic electroluminescent device.

Embodiments provide organic EL devices including a laminated structure of at least three layers having different components between an anode and an emission layer for obtaining luminescence mainly via a singlet excited state. The laminated structure includes a first layer including a hole transport compound obtained by doping an electron accepting compound having a lowest unoccupied molecular orbital (LUMO) level of about −9.0 eV to about −4.0 eV; and a second layer disposed between the first layer and the emission layer. The second layer is closer to the emission layer than the first layer and includes a compound represented by the following Formula 1.

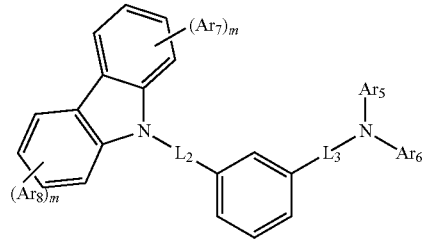

[Formula 1]

In Formula 1, $Ar_5$ to $Ar_8$ are a substituted or unsubstituted aryl group having 6 to 50 carbon atoms for forming a ring or a substituted or unsubstituted heteroaryl group having 5 to 50 carbon atoms for forming a ring, m is an integer from 0 to 4, and $L_2$ and $L_3$ are a single bond, a substituted or unsubstituted arylene group having 6 to 18 carbon atoms for forming a ring or a substituted or unsubstituted heteroarylene group having 5 to 15 carbon atoms for forming a ring.

The organic EL device according to an embodiment may help improve hole injection properties from an anode, passivate hole transport laminated structure from electrons not consumed in an emission layer, prevent diffusion of energy of an excited state generated in the emission layer into the hole transport laminated structure and control the charge balance of a whole device, thereby realizing the improvement of emission efficiency and long life.

In some embodiments, a third layer including a compound represented by the following Formula 2 may be included between the anode and the second layer.

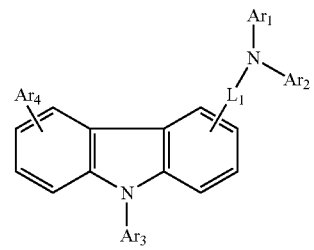

[Formula 2]

In Formula 2, $Ar_1$, $Ar_2$ and $Ar_3$ are a substituted or unsubstituted aryl group having 6 to 50 carbon atoms for forming a ring or a substituted or unsubstituted heteroaryl group having 5 to 50 carbon atoms for forming a ring, $Ar_4$ is a substituted or unsubstituted aryl group having 6 to 50 carbon atoms for forming a ring, a substituted or unsubstituted heteroaryl group having 5 to 50 carbon atoms for forming a ring or a substituted or unsubstituted alkyl group having 1 to 50 carbon atoms, and $L_1$ is a single bond, a substituted or unsubstituted arylene group having 6 to 18 carbon atoms for forming a ring or a substituted or unsubstituted heteroarylene group having 5 to 15 carbon atoms for forming a ring.

The organic EL device according to an embodiment includes a compound having a carbazolyl group in a hole transport laminated structure, and hole transport properties and current flow durability may be improved, emission efficiency may be improved, and long life may be realized.

In other embodiments, the first layer may include a compound represented by the above Formula 2.

The organic EL device according to an embodiment includes a compound having a carbazolyl group in a hole transport laminated structure, and hole transport properties and current flow durability may be improved, emission efficiency may be improved, and long life may be realized.

In still other embodiments, the emission layer may include a compound represented by the following Formula 3.

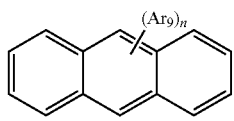

[Formula 3]

In Formula 3, each $Ar_9$ is independently a hydrogen atom, a deuterium atom, a substituted or unsubstituted alkyl group having 1 to 50 carbon atoms, a substituted or unsubstituted cycloalkyl group having 3 to 50 carbon atoms for forming a ring, a substituted or unsubstituted alkoxy group having 1 to 50 carbon atoms, a substituted or unsubstituted aralkyl group having 7 to 50 carbon atoms, a substituted or unsubstituted aryloxy group having 6 to 50 carbon atoms for forming a ring, a substituted or unsubstituted arylthio group having 6 to 50 carbon atoms for forming a ring, a substituted or unsubstituted alkoxycarbonyl group having 2 to 50 carbon atoms, a substituted or unsubstituted aryl group having 6 to 50 carbon atoms for forming a ring, a substituted or unsubstituted heteroaryl group having 5 to 50 carbon atoms for forming a ring, a substituted or unsubstituted silyl group, a carboxyl group, a halogen atom, a cyano group, a nitro group or a hydroxyl group, and n is an integer from 1 to 10.

In other embodiments, organic EL devices include a laminated structure of at least three layers having different components between an anode and an emission layer for obtaining luminescence mainly via a singlet excited state. The laminated structure includes a first layer formed by using an electron accepting compound having a LUMO level of about −9.0 eV to about −4.0 eV as a main component, and a second layer disposed between the first layer and the emission layer. The second layer is closer to the emission layer than the first layer and includes a compound represented by the following Formula 1.

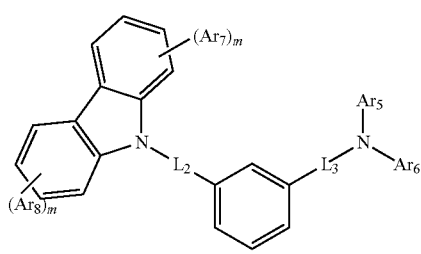

[Formula 1]

In Formula 1, $Ar_5$ to $Ar_8$ are a substituted or unsubstituted aryl group having 6 to 50 carbon atoms for forming a ring or a substituted or unsubstituted heteroaryl group having 5 to 50 carbon atoms for forming a ring, m is an integer from 0 to 4, and $L_2$ and $L_3$ are a single bond, a substituted or unsubstituted arylene group having 6 to 18 carbon atoms for forming a ring or a substituted or unsubstituted heteroarylene group having 5 to 15 carbon atoms for forming a ring.

The organic EL device according to an embodiment may improve hole injection properties from an anode, passivate hole transport laminated structure from electrons not consumed in an emission layer, prevent diffusion of energy of an excited state generated in the emission layer into the hole transport laminated structure and control the charge balance of a whole device, thereby realizing the improvement of emission efficiency and long life.

In some embodiments, a third layer including a compound represented by the following Formula 2 may be included between the first layer and the second layer.

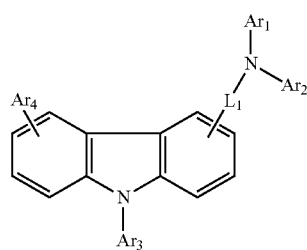

[Formula 2]

In Formula 2, $Ar_1$, $Ar_2$ and $Ar_3$ are a substituted or unsubstituted aryl group having 6 to 50 carbon atoms for forming a ring or a substituted or unsubstituted heteroaryl group having 5 to 50 carbon atoms for forming a ring, $Ar_4$ is a substituted or unsubstituted aryl group having 6 to 50 carbon atoms for forming a ring, a substituted or unsubstituted heteroaryl group having 5 to 50 carbon atoms for forming a ring or a substituted or unsubstituted alkyl group having 1 to 50 carbon atoms, and $L_1$ is a single bond, a substituted or unsubstituted arylene group having 6 to 18 carbon atoms for forming a ring or a substituted or unsubstituted heteroarylene group having 5 to 15 carbon atoms for forming a ring.

The organic EL device according to an embodiment includes a compound having a carbazolyl group in a hole transport laminated structure, and hole transport properties and current flow durability may be improved, emission efficiency may be improved, and long life may be realized.

In other embodiments, the emission layer may include a compound represented by the following Formula 3.

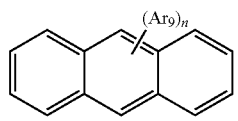

[Formula 3]

In Formula 3, each $Ar_9$ is independently a hydrogen atom, a deuterium atom, a substituted or unsubstituted alkyl group having 1 to 50 carbon atoms, a substituted or unsubstituted cycloalkyl group having 3 to 50 carbon atoms for forming a ring, a substituted or unsubstituted alkoxy group having 1 to 50 carbon atoms, a substituted or unsubstituted aralkyl group having 7 to 50 carbon atoms, a substituted or unsubstituted aryloxy group having 6 to 50 carbon atoms for forming a ring, a substituted or unsubstituted arylthio group having 6 to 50 carbon atoms for forming a ring, a substituted or unsubstituted alkoxycarbonyl group having 2 to 50 carbon atoms, a substituted or unsubstituted aryl group having 6 to 50 carbon atoms for forming a ring, a substituted or unsubstituted heteroaryl group having 5 to 50 carbon atoms for forming a ring, a substituted or unsubstituted silyl group, a carboxyl group, a halogen atom, a cyano group, a nitro group or a hydroxyl group, and n is an integer from 1 to 10.

The organic EL device according to an embodiment may realize the improvement of emission life and long life.

According to the present disclosure, an organic EL device having high efficiency and long life may be provided.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
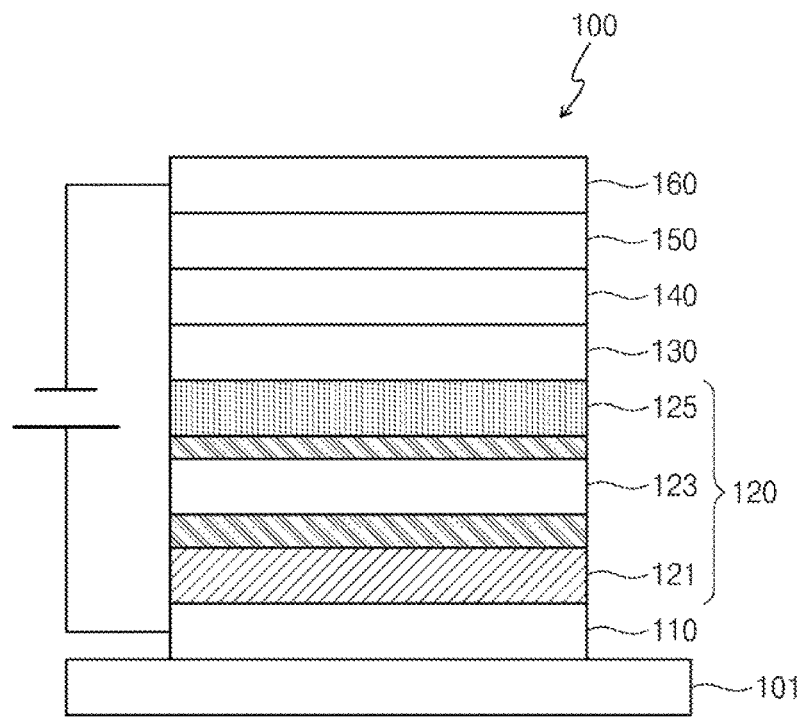
FIG. 1 illustrates a schematic diagram of an organic EL device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

Hole injection properties from an anode may be improved by disposing a layer formed by using an electron accepting compound adjacent to the anode. According to an embodiment, a laminated layer having hole transport properties between an emission layer and an anode may be regarded as a structure, and a hole transport layer doped with an electron accepting material may be laminated adjacent to, e.g., directly adjacent to, the anode in the laminated structure and an intermediate layer including an amine derivative having a carbazolyl derivative may be laminated adjacent to, e.g., directly adjacent to, the emission layer.

The organic EL device according to an embodiment will be explained. FIG. 1 illustrates a schematic diagram of an organic EL device 100 according to an embodiment. The organic EL device 100 may include, e.g., an anode 110 on a substrate 101, an emission layer 130, an electron transport layer 140, an electron injection layer 150 and a cathode 160. Between the anode 110 and the emission layer 130, a hole transport band 120 may be disposed. The hole transport band 120 may be a band for disposing or including a hole transport layer or a hole injection layer.

According to an embodiment, to realize an organic EL device having improved emission efficiency and long life, a laminated structure of at least three layers having different components may be provided in the hole transport band 120 between the anode 110 and the emission layer 130. The laminated structure may include at least a first layer 121 and a second layer 125. At least one layer (e.g., the first layer 121) disposed adjacent to the anode 110 may include a hole transport compound obtained by doping an electron accepting compound having a LUMO level from about −9.0 eV to about −4.0 eV. At least one layer (e.g., the second layer 125) disposed between the first layer 121 and the emission layer 130 and closer to the emission layer 130 may include a compound represented by the following Formula 1.

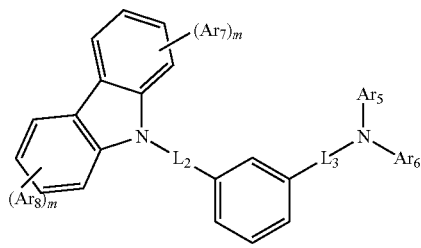

[Formula 1]

In Formula 1, $Ar_5$ to $Ar_8$ may each independently be or include, e.g., a substituted or unsubstituted aryl group having 6 to 50 ring carbon atoms or a substituted or unsubstituted heteroaryl group having 5 to 50 ring carbon atoms, each m may independently be an integer of 0 to 4, and $L_2$ and $L_3$ may each independently be or may include, e.g., a single bond, a substituted or unsubstituted arylene group having 6 to 18 ring carbon atoms or a substituted or unsubstituted heteroarylene group having 5 to 15 ring carbon atoms. In an implementation, adjacent ones of $Ar_5$ to $Ar_8$ may form a ring. For example, adjacent ones of $Ar_5$ and $Ar_6$ may be combined to form a ring. In an implementation, adjacent $Ar_7$s and/or adjacent $Ar_8$s may be combined to form a ring.

In an implementation, $Ar_5$ to $Ar_8$ may each independently include, e.g., a phenyl group, a biphenyl group, a terphenyl group, a naphthyl group, an anthryl group, a phenanthryl group, a fluorenyl group, an indenyl group, a pyrenyl group, an acetonaphthenyl group, a fluoranthenyl group, a triphenylenyl group, a pyridyl group, a pyranyl group, a quinolyl group, an isoquinolyl group, a benzofuranyl group, a benzothienyl group, an indolyl group, a carbazolyl group, a benzoxazolyl group, a benzothiazolyl group, a quinoxalyl group, a benzoxazolyl group, a dibenzofuranyl group, or a dibenzothienyl group. In an implementation, the phenyl group, the biphenyl group, the terphenyl group, the fluorenyl group, the carbazolyl group, the dibenzofuranyl group, or the like may be used.

In an implementation, $L_2$ and $L_3$, may each independently include, other than a single bond, e.g., a phenylene group, a biphenylylene group, a terphenylylene group, a naphthalene group, an anthrylene group, a phenanthrylene group, a fluorirane group, an indanediyl group, a pyrenediyl group, an acenaphthenediyl group, a fluoranthenediyl group, a triphenylenediyl group, a pyridinediyl group, a pyranediyl group, a quinolinediyl group, an isoquinolinediyl group, a benzofuranediyl group, a benzothiophenediyl group, an indolediyl group, a carbazolediyl group, a benzoxazolediyl group, a benzothiazolediyl group, a quinoxalinediyl group, a benzoimidazolediyl group, a dibenzofuranediyl group, or the like. In an implementation, the phenylene group, the terphenylene group, the fluorenediyl group, the carbazolediyl group, the dibenzofuranediyl group, or the like may be used.

In an implementation, the compound represented by Formula 1 may include, e.g., one of the following Compounds 1 to 22.

1
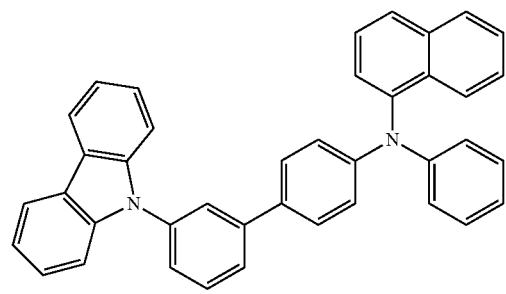
2
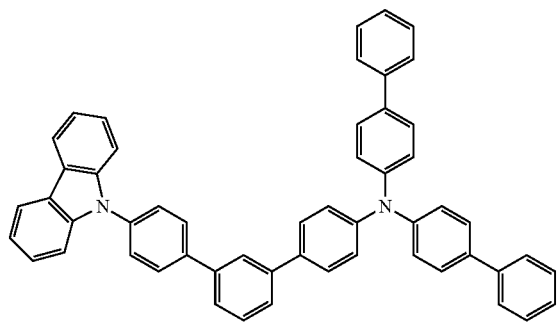
3
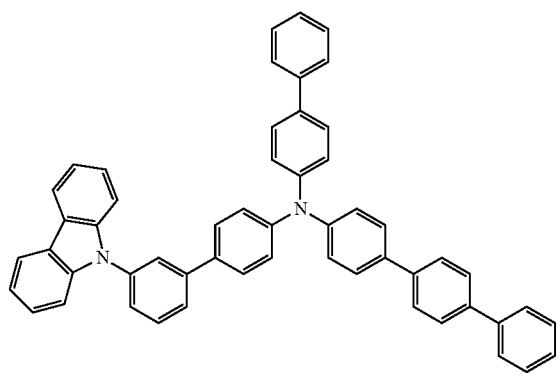
4
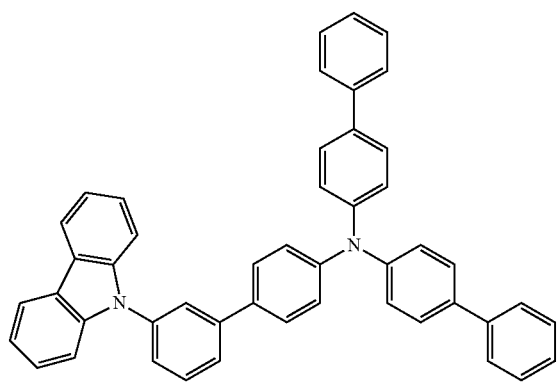
5
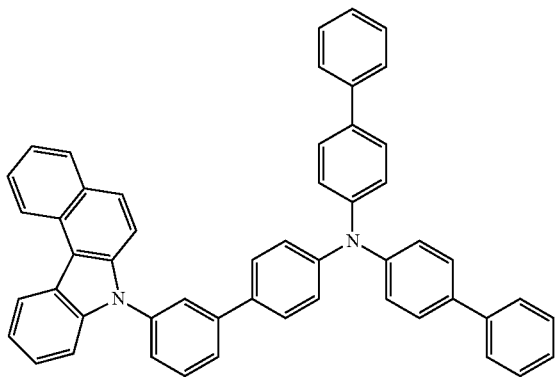
6
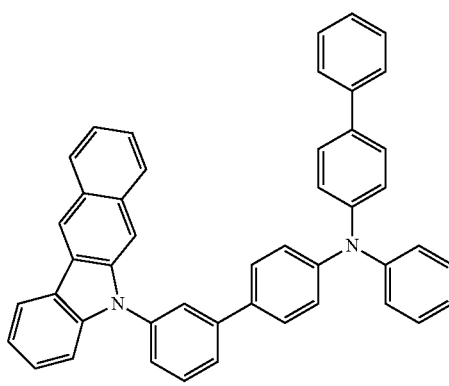
7
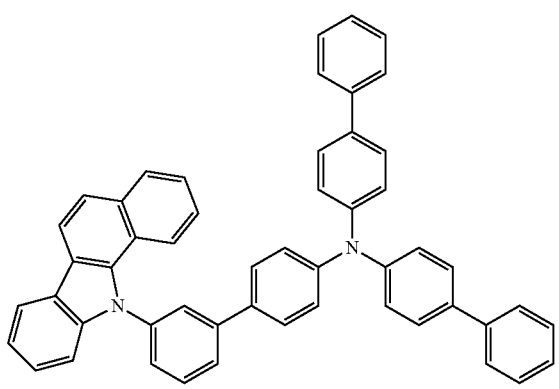
8
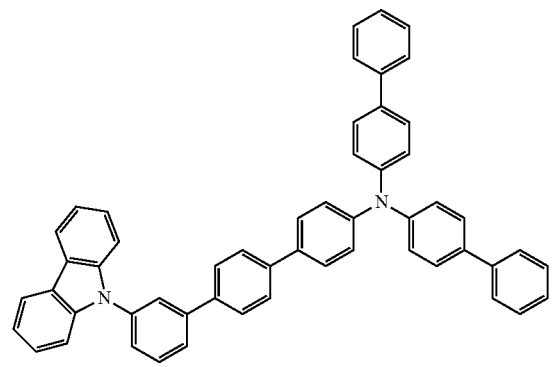

9
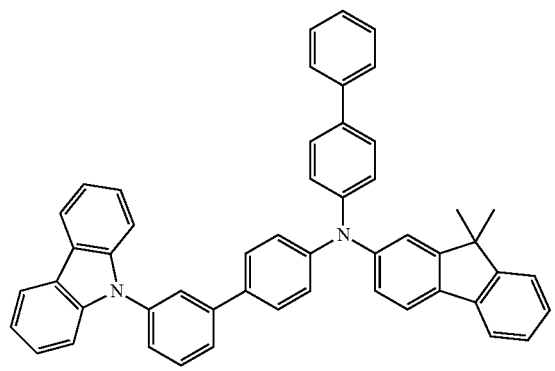
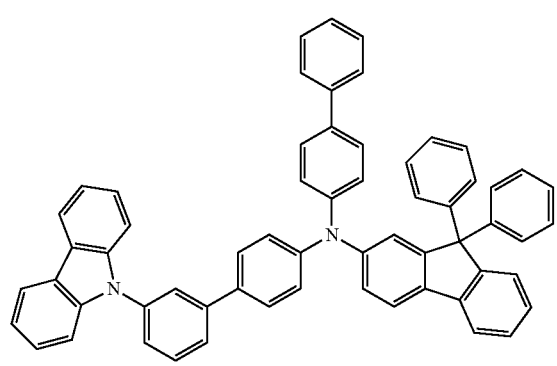
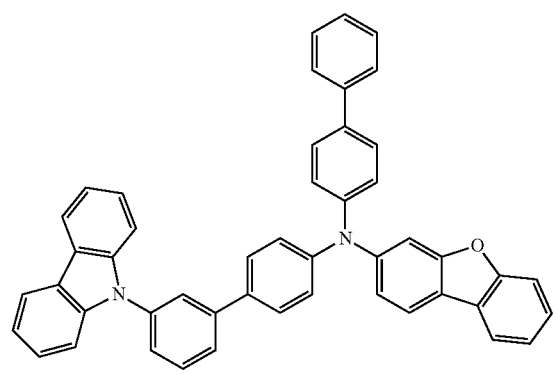
10
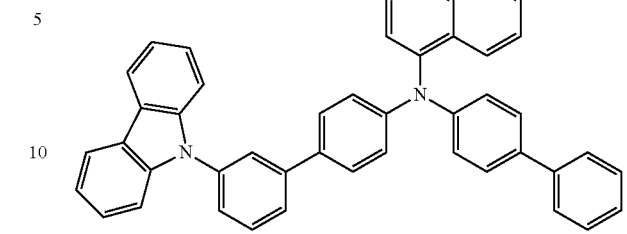
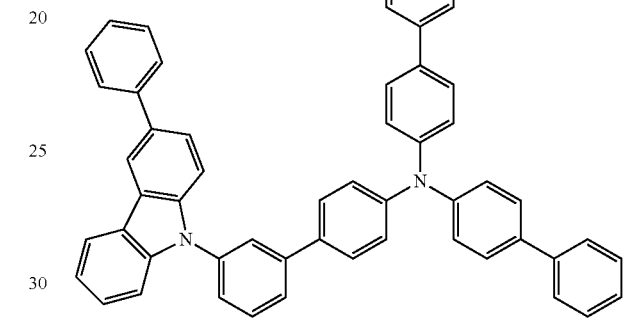
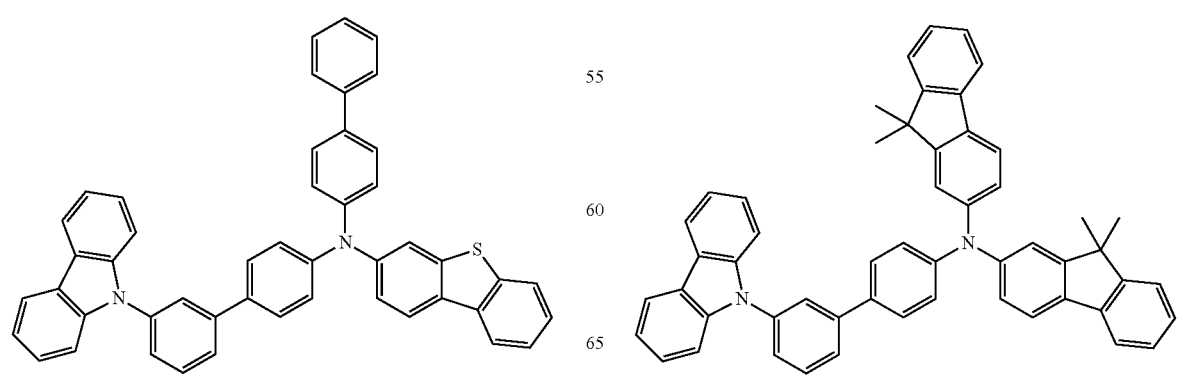

17

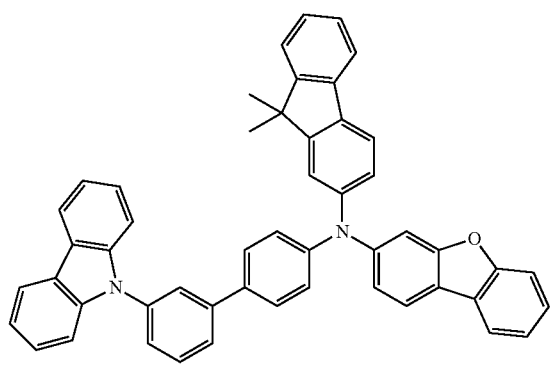

18

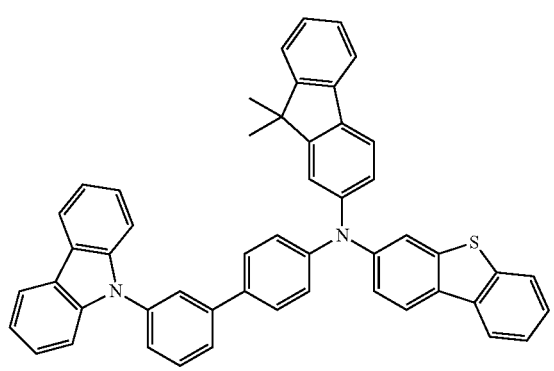

19

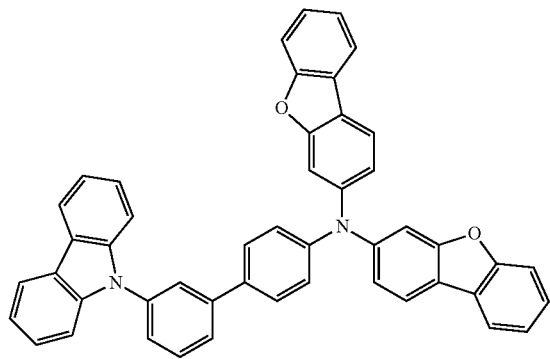

20

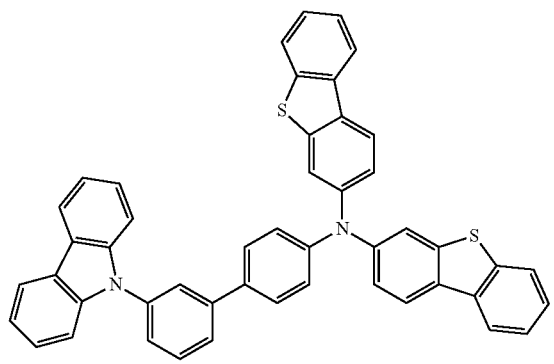

21

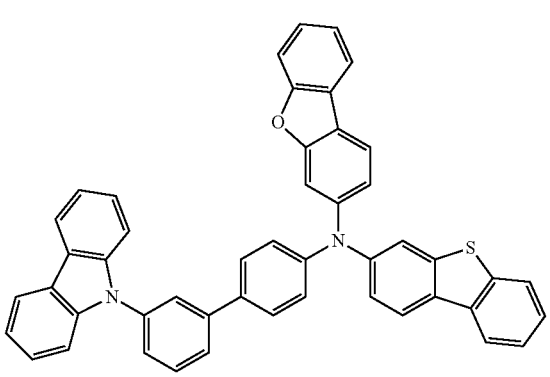

22

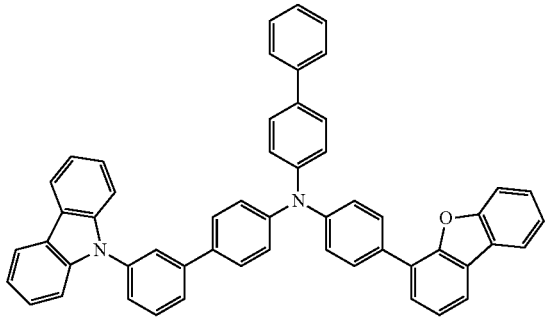

At least one layer (e.g., the first layer 121) disposed adjacent to, e.g., directly adjacent to, the anode 110 of the laminated structure may include a hole transport compound doped with an electron accepting compound having a LUMO level from about −9.0 eV to about −4.0 eV. The electron accepting compound doped in the first layer 121 may include, e.g., a compound represented by one of the following Formulae ac1 to ac14. In an implementation, a doping amount of the electron accepting compound may be, e.g., about 0.1 wt % to about 50 wt %, with respect to a total weight of all materials constituting the first layer 121. In an implementation, the doping amount may be, e.g., about 0.5 wt % to about 5 wt %.

ac1

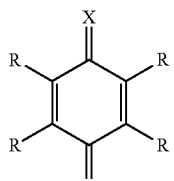

ac2

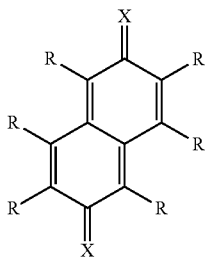

-continued ac3
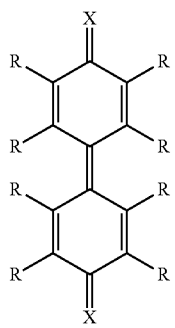

ac4
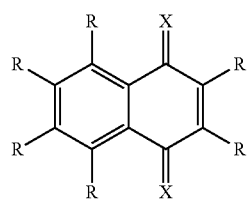

ac5
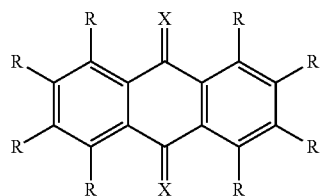

ac6
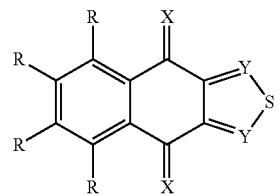

ac7
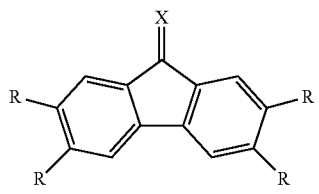

ac8
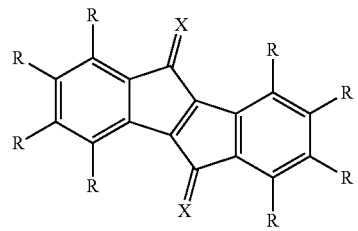

ac9
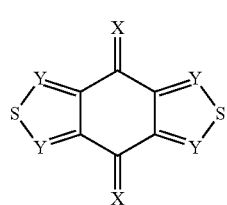

-continued ac10
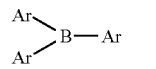

ac11
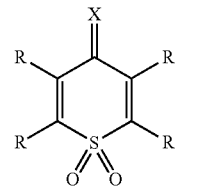

ac12
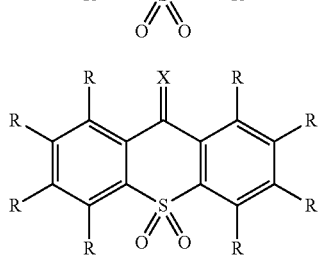

ac13
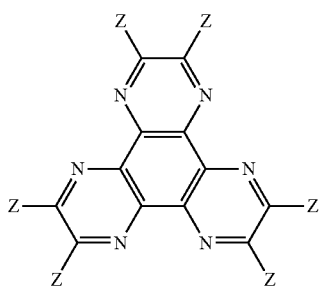

ac14
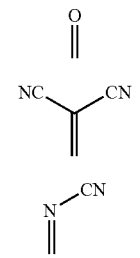

In Formulae ac1 to ac14, each R may independently be or include, e.g., a hydrogen atom, a deuterium atom, a halogen atom, a fluoroalkyl group having 1 to 10 carbon atoms, a cyano group, an alkoxy group having 1 to 10 carbon atoms, an alkyl group having 1 to 10 carbon atoms, or a substituted or unsubstituted aryl group having 6 to 30 ring carbon atoms. In an implementation, all Rs may not be the hydrogen atom, the deuterium atom, and/or the fluorine atom in the same molecule. Each Ar may independently be or include, e.g., a substituted or unsubstituted electron withdrawing aryl group having 6 to 30 ring carbon atoms or a substituted or unsubstituted heteroaryl group having 3 to 30 ring carbon atoms. Y may be, e.g., a methine group (—CH=) or a nitrogen atom (—N=). Z may be, e.g., pseudohalogen or sulfur (S). X may be, e.g., a group represented by one of the following Formulae X1 to X7.

x1 x2 x3

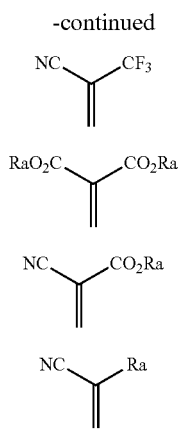

In Formulae X1 to X7, each Ra may independently be or include, e.g., a hydrogen atom, a deuterium atom, a halogen atom, a fluoroalkyl group having 1 to 10 carbon atoms, a cyano group, an alkoxy group having 1 to 10 carbon atoms, an alkyl group having 1 to 10 carbon atoms, a substituted or unsubstituted aryl group having 6 to 30 ring carbon atoms, or a substituted or unsubstituted heteroaryl group having 3 to 30 ring carbon atoms.

Examples of the substituted or unsubstituted aryl group having 6 to 30 ring carbon atoms or the substituted or unsubstituted heteroaryl group having 3 to 30 ring carbon atoms, represented by R, Ar, and Ra, may include a phenyl group, a 1-naphthyl group, a 2-naphthyl group, a 1-anthryl group, a 2-anthryl group, a 9-anthryl group, a 1-phenanthryl group, a 2-phenanthryl group, a 3-phenanthryl group, a 4-phenanthryl group, a 9-phenanthryl group, a 1-naphthacenyl group, a 2-naphthacenyl group, a 9-naphthacenyl group, a 1-pyrenyl group, a 2-pyrenyl group, a 4-pyrenyl group, a 2-biphenylyl group, a 3-biphenylyl group, a 4-biphenylyl group, a p-terphenyl-4-yl group, a p-terphenyl-3-yl group, a p-terphenyl-2-yl group, a m-terphenyl-4-yl group, a m-terphenyl-3-yl group, a m-terphenyl-2-yl group, an o-tolyl group, a m-tolyl group, a p-tolyl group, a p-t-butylphenyl group, a p-(2-phenylpropyl)phenyl group, a 3-methyl-2-naphthyl group, a 4-methyl-1-naphthyl group, a 4-methyl-1-anthryl group, a 4'-methylbiphenylyl group, a 4'''-t-butyl-p-terphenyl-4-yl group, a fluoranthenyl group, a fluorenyl group, a 1-pyrrolyl group, a 2-pyrrolyl group, a 3-pyrrolyl group, a pyrazinyl group, a 2-pyridinyl group, a 3-pyridinyl group, a 4-pyridinyl group, a 1-indolyl group, a 2-indolyl group, a 3-indolyl group, a 4-indolyl group, a 5-indolyl group, a 6-indolyl group, a 7-indolyl group, a 1-isoindolyl group, a 2-isoindolyl group, a 3-isoindolyl group, a 4-isoindolyl group, a 5-isoindolyl group, a 6-isoindolyl group, a 7-isoindolyl group, a 2-furyl group, a 3-furyl group, a 2-benzofuranyl group, a 3-benzofuranyl group, a 4-benzofuranyl group, a 5-benzofuranyl group, a 6-benzofuranyl group, a 7-benzofuranyl group, a 1-isobenzofuranyl group, a 3-isobenzofuranyl group, a 4-isobenzofuranyl group, a 5-isobenzofuranyl group, a 6-isobenzofuranyl group, a 7-isobenzofuranyl group, a quinolyl group, a 3-quinolyl group, a 4-quinolyl group, a 5-isoquinolyl group, a 3-isoquinolyl group, a 4-isoquinolyl group, a 5-isoquinolyl group, a 6-isoquinolyl group, a 7-isoquinolyl group, a 8-isoquinolyl group, a 2-quinoxalinyl group, a 5-quinoxalinyl group, a 6-quinoxalinyl group, a 1-carbazolyl group, a 2-carbazolyl group, a 3-carbazolyl group, a 4-carbazolyl group, a 9-carbazolyl group, a 1-phenanthridinyl group, a 2-phenanthridinyl group, a 3-phenanthridinyl group, a 4-phenanthridinyl group, a 6-phenanthridinyl group, a 7-phenanthridinyl group, a 8-phenanthridinyl group, a 9-phenanthridinyl group, a 10-phenanthridinyl group, a 1-acridinyl group, a 2-acridinyl group, a 3-acridinyl group, a 4-acridinyl group, a 9-acridinyl group, a 1,7-phenanthroline-2-yl group, a 1,7-phenanthroline-3-yl group, a 1,7-phenanthroline-4-yl group, a 1,7-phenanthroline-5-yl group, a 1,7-phenanthroline-6-yl group, a 1,7-phenanthroline-8-yl group, a 1,7-phenanthroline-9-yl group, a 1,7-phenanthroline-10-yl group, a 1,8-phenanthroline-2-yl group, a 1,8-phenanthroline-3-yl group, a 1,8-phenanthroline-4-yl group, a 1,8-phenanthroline-5-yl group, a 1,8-phenanthroline-6-yl group, a 1,8-phenanthroline-7-yl group, a 1,8-phenanthroline-9-yl group, a 1,8-phenanthroline-10-yl group, a 1,9-phenanthroline-2-yl group, a 1,9-phenanthroline-3-yl group, a 1,9-phenanthroline-4-yl group, a 1,9-phenanthroline-5-yl group, a 1,9-phenanthroline-6-yl group, a 1,9-phenanthroline-7-yl group, a 1,9-phenanthroline-8-yl group, a 1,9-phenanthroline-10-yl group, a 1,10-phenanthroline-2-yl group, a 1,10-phenanthroline-3-yl group, a 1,10-phenanthroline-4-yl group, a 1,10-phenanthroline-5-yl group, a 2,9-phenanthroline-1-yl group, a 2,9-phenanthroline-3-yl group, a 2,9-phenanthroline-4-yl group, a 2,9-phenanthroline-5-yl group, a 2,9-phenanthroline-6-yl group, a 2,9-phenanthroline-7-yl group, a 2,9-phenanthroline-8-yl group, a 2,9-phenanthroline-10-yl group, a 2,8-phenanthroline-1-yl group, a 2,8-phenanthroline-3-yl group, a 2,8-phenanthroline-4-yl group, a 2,8-phenanthroline-5-yl group, a 2,8-phenanthroline-6-yl group, a 2,8-phenanthroline-7-yl group, a 2,8-phenanthroline-9-yl group, a 2,8-phenanthroline-10-yl group, a 2,7-phenanthroline-1-yl group, a 2,7-phenanthroline-3-yl group, a 2,7-phenanthroline-4-yl group, a 2,7-phenanthroline-5-yl group, a 2,7-phenanthroline-6-yl group, a 2,7-phenanthroline-8-yl group, a 2,7-phenanthroline-9-yl group, a 2,7-phenanthroline-10-yl group, a 1-phenazinyl group, a 2-phenazinyl group, a 1-phenothiazinyl group, a 2-phenothiazinyl group, a 3-phenothiazinyl group, a 4-phenothiazinyl group, a 10-phenothiazinyl group, a 1-phenoxazinyl group, a 2-phenoxazinyl group, a 3-phenoxazinyl group, a 4-phenoxazinyl group, a 10-phenoxazinyl group, a 2-oxazolyl group, a 4-oxazolyl group, a 5-oxazolyl group, a 2-oxadiazolyl group, a 5-oxadiazolyl group, a 3-furazanyl group, a 2-thienyl group, a 3-thienyl group, a 2-methylpyrrol-1-yl group, a 2-methylpyrrole-3-yl group, a 2-methylpyrrole-4-yl group, a 2-methylpyrrole-5-yl group, a 3-methylpyrrole-1-yl group, a 3-methylpyrrole-2-yl group, a 3-methylpyrrole-4-yl group, a 3-methylpyrrole-5-yl group, a 2-t-butylpyrrole-4-yl group, a 3-(2-phenylpropyl)pyrrole-1-yl group, a 2-methyl-1-indolyl group, a 4-methyl-1-indolyl group, a 2-methyl-3-indolyl group, a 4-methyl-3-indolyl group, a 2-t-butyl-1-indolyl group, a 4-t-butyl-1-indolyl group, a 2-t-butyl-3-indolyl group, a 4-t-butyl-3-indolyl group, and the like.

Examples of the fluoroalkyl group having 1 to 10 carbon atoms, represented by R and Ra, may include a perfluoroalkyl group such as a trifluoromethyl group, a pentafluoroethyl group, a heptafluoropropyl group, a heptadecafluorooctane group, and the like. or a monofluoromethyl group, a difluoromethyl group, a trifluoroethyl group, a tetrafluoropropyl group, an octafluoropentyl group, and the like.

Examples of the alkyl group having 1 to 10 carbon atoms, represented by R and Ra, may include a methyl group, an ethyl group, a propyl group, an isopropyl group, a n-butyl group, a s-butyl group, an isobutyl group, a t-butyl group, a n-pentyl group, a n-hexyl group, a n-heptyl group, a n-octyl group, a hydroxymethyl group, a 1-hydroxyethyl group, a 2-hydroxyethyl group, a 2-hydroxyisobutyl group, a 1,2- dihydroxyethyl group, a 1,3-dihydroxyisopropyl group, a 2,3-dihydroxy-t-butyl group, a 1,2,3-trihydroxypropyl group, a chloromethyl group, a 1-chloroethyl group, a 2-chloroethyl group, a 2-chloroisobutyl group, a 1,2-dichloroethyl group, a 1,3-dichloroisopropyl group, a 2,3-dichloro-t-butyl group, a 1,2,3-trichloropropyl group, a bromomethyl group, a 1-bromoethyl group, a 2-bromoethyl group, a 2-bromoisobutyl group, a 1,2-dibromoethyl group, a 1,3-dibromoisopropyl group, a 2,3-dibromo-t-butyl group, a 1,2,3-tribromopropyl group, an iodomethyl group, a 1-iodoethyl group, a 2-iodoethyl group, a 2-iodoisobutyl group, a 1,2-diiodoethyl group, a 1,3-diiodoisopropyl group, a 2,3-diiodo-t-butyl group, a 1,2,3-triiodopropyl group, an aminomethyl group, a 1-aminoethyl group, a 2-aminoethyl group, a 2-aminoisobutyl group, a 1,2-diaminoethyl group, a 1,3-diaminoisopropyl group, a 2,3-diamino-t-butyl group, a 1,2,3-triaminopropyl group, a cyanomethyl group, a 1-cyanoethyl group, a 2-cyanoethyl group, a 2-cyanoisobutyl group, a 1,2-dicyanoethyl group, a 1,3-dicyanoisopropyl group, a 2,3-dicyano-t-butyl group, a 1,2,3-tricyanopropyl group, a nitromethyl group, a 1-nitroethyl group, a 2-nitroethyl group, a 2-nitroisobutyl group, a 1,2-dinitroethyl group, a 1,3-dinitroisopropyl group, a 2,3-dinitro-t-butyl group, a 1,2,3-trinitropropyl group, a cyclopropyl group, a cyclobutyl group, a cyclopentyl group, a cyclohexyl group, a 4-methylcyclohexyl group, a 1-adamantyl group, a 2-adamantyl group, a 1-norbomyl group, a 2-norbornyl group, and the like.

The alkoxy group having 1 to 10 carbon atoms, represented by R and Ra, is a group represented by —OY, and examples of Y may include a methyl group, an ethyl group, a propyl group, an isopropyl group, a n-butyl group, a s-butyl group, an isobutyl group, a t-butyl group, a n-pentyl group, a n-hexyl group, a n-heptyl group, a n-octyl group, a hydroxymethyl group, a 1-hydroxyethyl group, a 2-hydroxyethyl group, a 2-hydroxyisobutyl group, a 1,2-dihydroxyethyl group, a 1,3-dihydroxyisopropyl group, a 2,3-dihydroxy-t-butyl group, a 1,2,3-trihydroxypropyl group, a chloromethyl group, a 1-chloroethyl group, a 2-chloroethyl group, a 2-chloroisobutyl group, a 1,2-dichloroethyl group, a 1,3-dichloroisopropyl group, a 2,3-dichloro-t-butyl group, a 1,2,3-trichloropropyl group, a bromomethyl group, a 1-bromoethyl group, a 2-bromoethyl group, a 2-bromoisobutyl group, a 1,2-dibromoethyl group, a 1,3-dibromoisopropyl group, a 2,3-dibromo-t-butyl group, a 1,2,3-tribromopropyl group, an iodomethyl group, a 1-iodoethyl group, a 2-iodoethyl group, a 2-iodoisobutyl group, a 1,2-diiodoethyl group, a 1,3-diiodoisopropyl group, a 2,3-diiodo-t-butyl group, a 1,2,3-triiodopropyl group, an aminomethyl group, a 1-aminoethyl group, a 2-aminoethyl group, a 2-aminoisobutyl group, a 1,2-diaminoethyl group, a 1,3-diaminoisopropyl group, a 2,3-diamino-t-butyl group, a 1,2,3-triaminopropyl group, a cyanomethyl group, a 1-cyanoethyl group, a 2-cyanoethyl group, a 2-cyanoisobutyl group, a 1,2-dicyanoethyl group, a 1,3-dicyanoisopropyl group, a 2,3-dicyano-t-butyl group, a 1,2,3-tricyanopropyl group, a nitromethyl group, a 1-nitroethyl group, a 2-nitroethyl group, a 2-nitroisobutyl group, a 1,2-dinitroethyl group, a 1,3-dinitroisopropyl group, a 2,3-dinitro-t-butyl group, a 1,2,3-trinitropropyl group, and the like.

A halogen atom represented by R and Ra may be fluorine, chlorine, bromine, or iodine.

In an implementation, the hole transport compound included in the first layer 121 may include a suitable hole transport compound. For example, compounds having a carbazolyl group may be used. In an implementation, the hole transport compound having the carbazolyl group may be, e.g., an amine-containing compound represented by the following Formula 2.

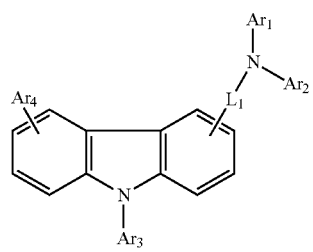

[Formula 2]

In Formula 2, $Ar_1$, $Ar_2$, and $Ar_3$ may each independently be or include, e.g., a substituted or unsubstituted aryl group having 6 to 50 ring carbon atoms or a substituted or unsubstituted heteroaryl group having 5 to 50 ring carbon atoms, $Ar_4$ may be or may include, e.g., a substituted or unsubstituted aryl group having 6 to 50 ring carbon atoms, a substituted or unsubstituted heteroaryl group having 5 to 50 ring carbon atoms, or a substituted or unsubstituted alkyl group having 1 to 50 carbon atoms, and $L_1$ may be or may include, e.g., a single bond, a substituted or unsubstituted arylene group having 6 to 18 ring carbon atoms or a substituted or unsubstituted heteroarylene group having 5 to 15 ring carbon atoms.

In an implementation, $Ar_1$ to $Ar_3$ may each independently include, e.g., a phenyl group, a biphenyl group, a terphenyl group, a naphthyl group, an anthryl group, a phenanthryl group, a fluorenyl group, an indenyl group, a pyrenyl group, an acenaphthenyl group, a fluoranthenyl group, a triphenylenyl group, a pyridyl group, a pyranyl group, a quinolyl group, an isoquinolyl group, a benzofuranyl group, a benzothienyl group, an indolyl group, a carbazolyl group, a benzoxazolyl group, a benzothiazolyl group, a quinoxalyl group, a benzoxazolyl group, a dibenzofuranyl group, or a dibenzothienyl group. In an implementation, the phenyl group, the biphenyl group, the terphenyl group, the fluorenyl group, the carbazolyl group, the dibenzofuranyl group, or the like may be used.

In an implementation, $Ar_4$ may include, e.g., the aryl group and the heteroaryl group that are the same as the groups described as examples of $Ar_1$ to $Ar_3$, and the alkyl group may be a methyl group or an ethyl group.

In an implementation, $L_1$ may include, other than a single bond, e.g., a phenylene group, a biphenylylene group, a terphenylylene group, a naphthalene group, an anthrylene group, a phenanthrylene group, a fluorirane group, an indanediyl group, a pyrenediyl group, an acenaphthenediyl group, a fluoranthenediyl group, a triphenylenediyl group, a pyridinediyl group, a pyranediyl group, a quinolinediyl group, an isoquinolinediyl group, a benzofuranediyl group, a benzothiophenediyl group, an indolediyl group, a carbazolediyl group, a benzoxazolediyl group, a benzothiazolediyl group, a quinoxalyldiyl group, a benzoimidazolediyl group, a dibenzofuranediyl group, or the like. In an implementation, the phenylene group, the terphenylene group, the fluorenediyl group, the carbazolediyl group, the dibenzofuranediyl group, or the like may be used.

The compound represented by Formula 2 may include, e.g., one of the following Compounds 23 to 38.

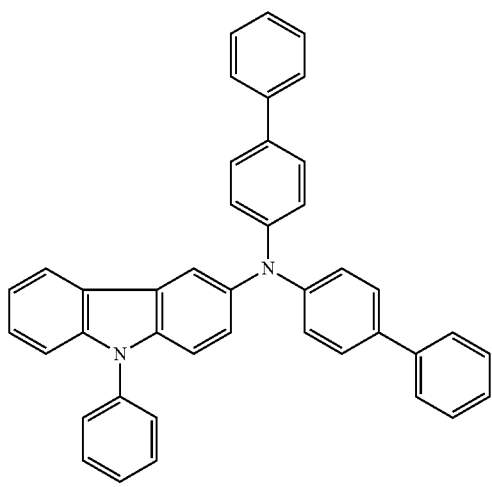
23
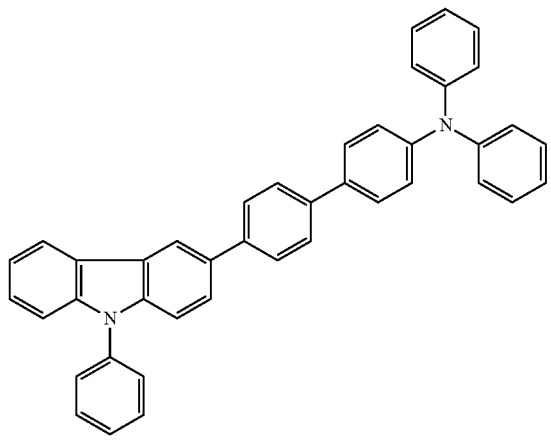
26
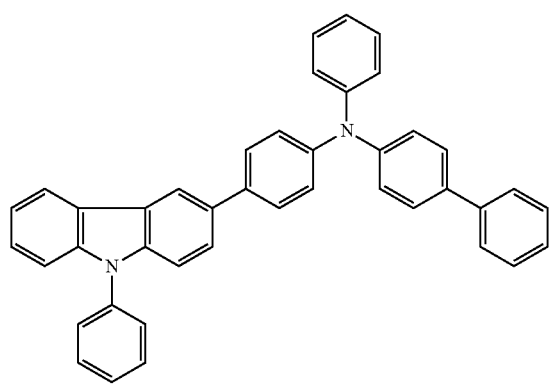
24
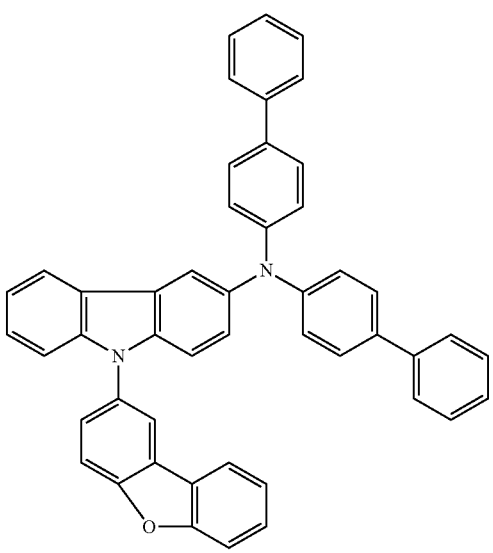
27
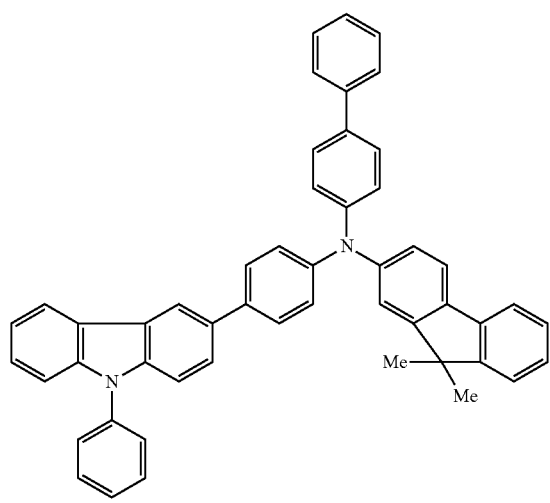
25
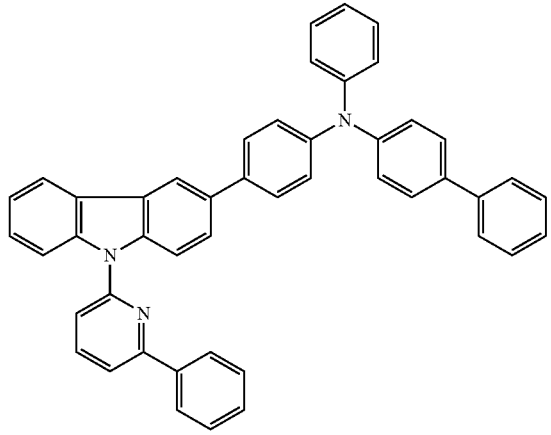
28

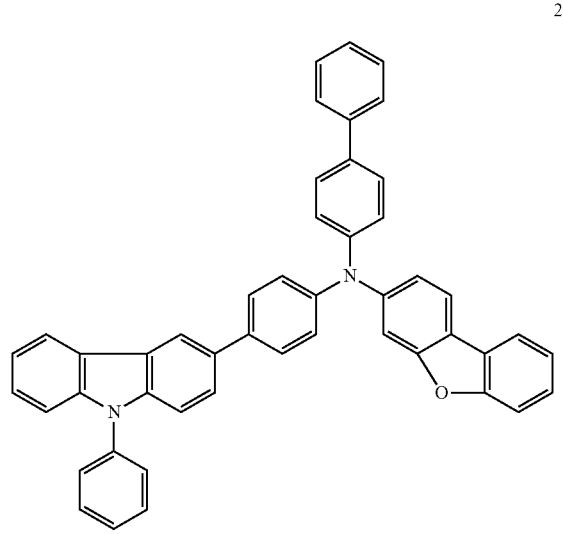
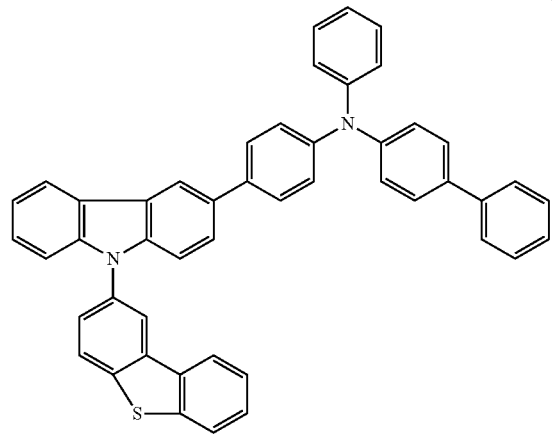
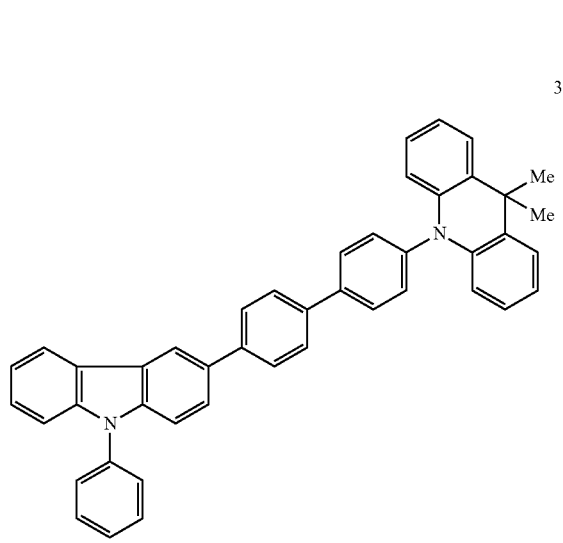
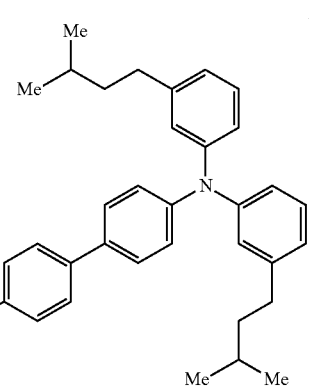
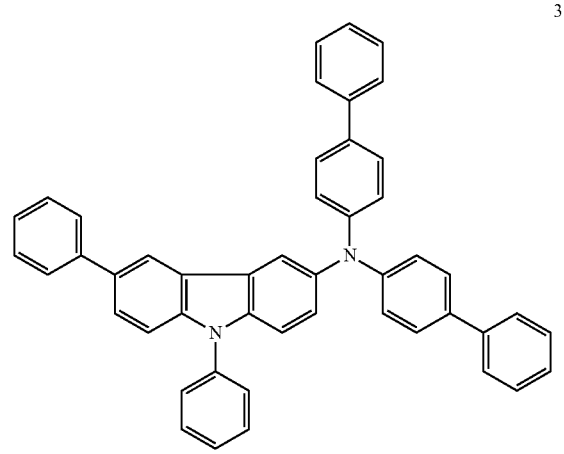

35

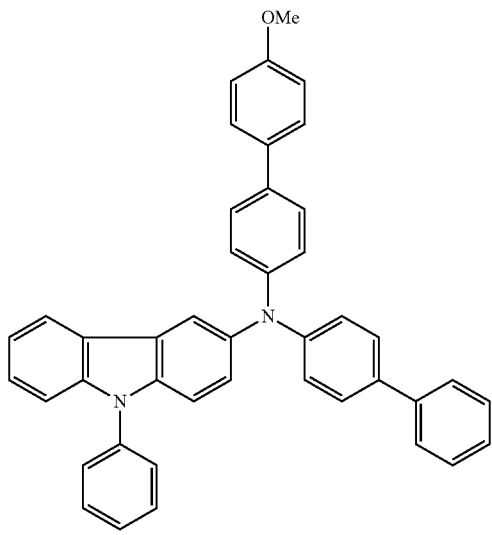

36

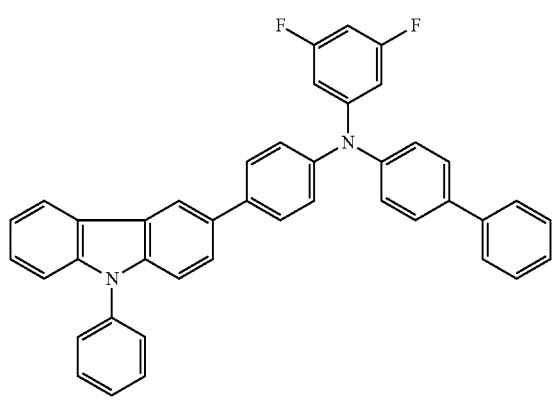

37

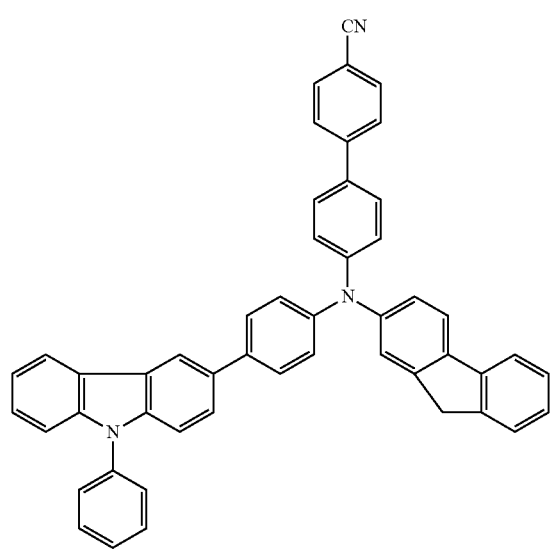

38

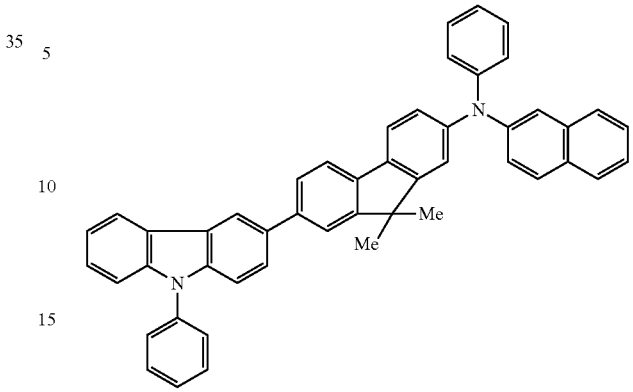

In an implementation, in the hole transport band 120 of the organic EL device 100, the laminated structure of at least three layers may be provided with at least one layer (e.g., a third layer 123) including a compound represented by the above Formula 2 between the anode 110 and the second layer 125. In the laminated structure, the position of the third layer 123 is not specifically limited, and the third layer may be disposed between the first layer 121 and the second layer 125. The compound represented by Formula 2 and included in the third layer 123 may include one of the above-described Compounds 23 to 38, which are explained as the compounds having a carbazolyl group included in the first layer 121.

In the organic EL device 100, in the laminated structure of at least three layers having different components disposed in the hole transport band 120, at least one of the first layer 121 (including the hole transport compound doped with an electron accepting compound having a LUMO level from about −9.0 eV to about −4.0 eV) may be disposed adjacent to, e.g., directly adjacent to the anode 110, and at least one of the second layer 125 (including the compound represented by Formula 1) may be disposed adjacent to, e.g., directly adjacent to, the emission layer 130. The organic EL device 100 according to an embodiment may include an amine-containing compound (having a carbazolyl group) in the hole transport second layer 125 disposed adjacent to the emission layer 130 in the laminated structure, and the hole transport laminated structure may be passivated from electrons not consumed in the emission layer 130. In addition, the diffusion of energy of an excited state generated in the emission layer 130 into the hole transport laminated structure may be prevented, and the whole charge balance of the organic EL device 100 may be controlled.

In the organic EL device 100, the first layer 121 (including the electron accepting compound) may be disposed toward the anode 100, e.g., adjacent to or directly adjacent to, the anode 110. By disposing the layer including the electron accepting compound adjacent to the anode 110, hole injection properties from the anode may be improved. In addition, by including the hole transport compound (having the carbazolyl group and represented by Formula 2) in the first layer 121, charge transport properties and current flow durability may be improved.

In the organic EL device 100, the third layer 123 (including the compound having the carbazolyl group and represented by Formula 2) may be disposed closer to the emission layer 130 than the first layer 121, e.g., the third layer 123 may be between the emission layer 130 and the first layer 121. By including the compound having the carbazolyl group in the hole transport laminated structure, charge transport properties and current flow durability may be improved. In addition, by including the compound represented by Formula 2 in the third layer 123, the hole transport laminated structure may be passivated from electrons not consumed in the emission layer 130, and the diffusion of energy of an excited state generated in the emission layer 130 into the hole transport laminated structure may be prevented. In addition, the amine derivative having the carbazolyl group and represented by Formula 2 may help restrain the diffusion of the electron accepting compound into the emission layer 130.

In addition, by disposing the second layer 125 (including the compound represented by Formula 1) adjacent to the emission layer 130, the diffusion of the electron accepting compound included in the first layer 121 into the emission layer 130 may be restrained, the hole transport first layer 121 and second layer 123 may be passivated from electrons not consumed in the emission layer 130, and the diffusion of energy of an excited state generated in the emission layer 130 into the hole transport first layer 121 and third layer 123 may be prevented. In addition, by including the amine derivative having the carbazolyl group and represented by Formula 1 in the second layer 125, the hole transport properties and the current flow durability of the laminated structure may be improved.

In addition, in the laminated structure disposed in the hole transport band 120 between the anode 110 and the emission layer 130 in the organic EL device 100, the compound having the carbazolyl group may be included in at least three layers. By including the compound having the carbazolyl group in the hole transport laminated structure, charge transport properties and current flow durability may be improved. In addition, in the laminated structure disposed in the hole transport band 120 between the anode 110 and the emission layer 130 in the organic EL device 100, a compound represented by Formula 1 or Formula 2 may be included in at least three layers. Thus, the hole transport laminated structure may be passivated from electrons not consumed in the emission layer 130, and the diffusion of energy of an excited state generated in the emission layer 130 into the hole transport laminated structure may be prevented.

In the organic EL device 100, light emission mainly via a singlet excited state may be obtained in the emission layer 130. As the material of the emission layer 130, suitable luminescent materials may be used, e.g., a fluoranthene derivative, a pyrene derivative, an arylacetylene derivative, a fluorene derivative, a perylene derivative, a chrysene derivative, or the like. In an implementation, the pyrene derivative, the perylene derivative, and/or the anthracene derivative may be used. For example, an anthracene derivative or anthracene-containing compound represented by the following Formula 3 may be used as the material of the emission layer 130.

[Formula 3]

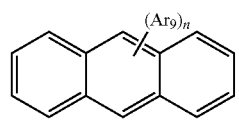

In Formula 3, each $Ar_9$ may independently be or include, e.g., a hydrogen atom, a deuterium atom, a substituted or unsubstituted alkyl group having 1 to 50 carbon atoms, a substituted or unsubstituted cycloalkyl group having 3 to 50 ring carbon atoms, a substituted or unsubstituted alkoxy group having 1 to 50 carbon atoms, a substituted or unsubstituted aralkyl group having 7 to 50 carbon atoms, a substituted or unsubstituted aryloxy group having 6 to 50 ring carbon atoms, a substituted or unsubstituted arylthio group having 6 to 50 ring carbon atoms, a substituted or unsubstituted alkoxycarbonyl group having 2 to 50 carbon atoms, a substituted or unsubstituted aryl group having 6 to 50 ring carbon atoms, a substituted or unsubstituted heteroaryl group having 5 to 50 ring carbon atoms, a substituted or unsubstituted silyl group, a carboxyl group, a halogen atom, a cyano group, a nitro group or a hydroxyl group, and n may be an integer of 1 to 10.

In an implementation, $Ar_9$ may include, e.g., a phenyl group, a biphenyl group, a terphenyl group, a naphthyl group, a phenylnaphthyl group, a naphthylphenyl group, an anthryl group, a phenanthryl group, a fluorenyl group, an indenyl group, a pyrenyl group, an acetonaphthenyl group, a fluoranthenyl group, a triphenylenyl group, a pyridyl group, a furanyl group, a pyranyl group, a thienyl group, a quinolyl group, an isoquinolyl group, a benzofuranyl group, a benzothienyl group, an indolyl group, a carbazolyl group, a benzoxazolyl group, a benzothiazolyl group, a quinoxalyl group, a benzoxazolyl group, a pyrazolyl group, a dibenzofuranyl group, or a dibenzothienyl group. In an implementation, the phenyl group, the biphenyl group, the terphenyl group, the fluorenyl group, the carbazolyl group, the dibenzofuranyl group, or the like may be used.

In an implementation, the compound represented by Formula 3 may be, e.g., one of the following Compounds a-1 to a-12.

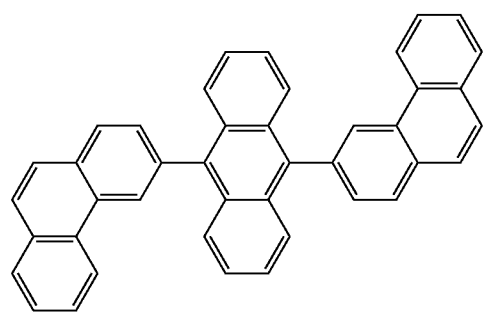

a-1

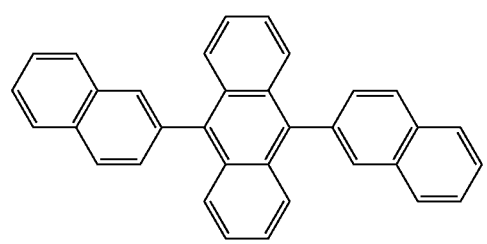

a-2 a-3
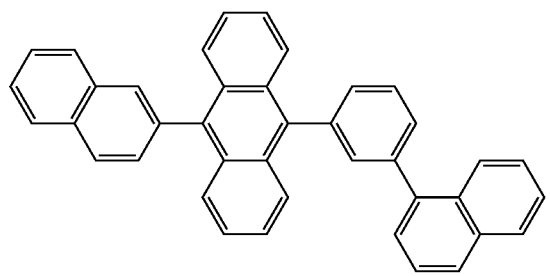
a-4
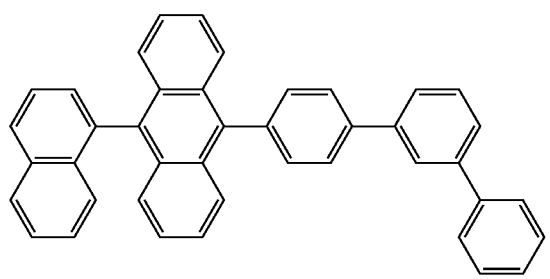
a-5
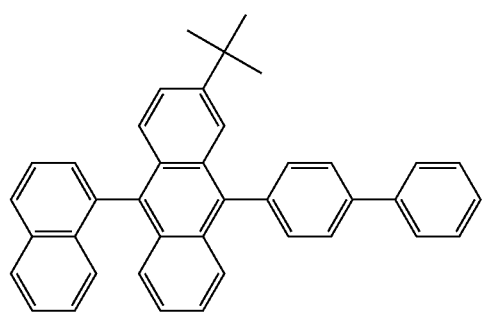
a-6
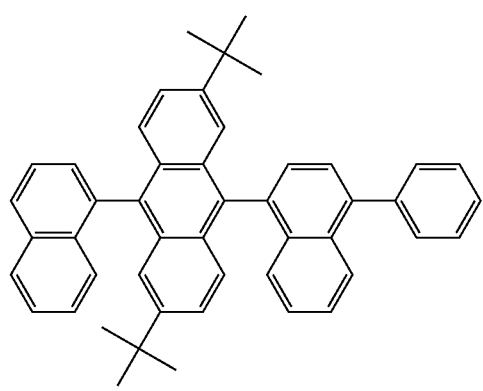
a-7
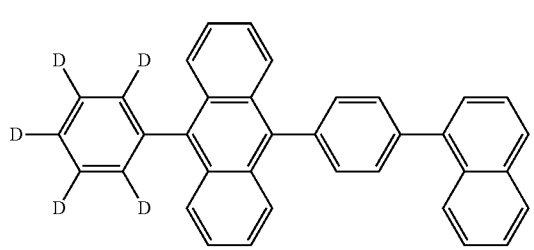
a-8
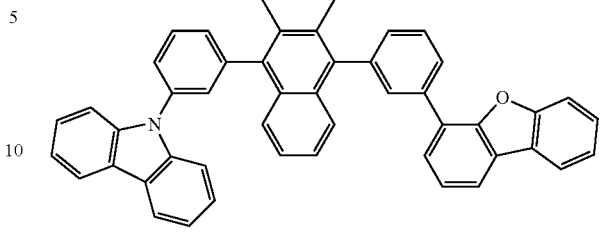
a-9
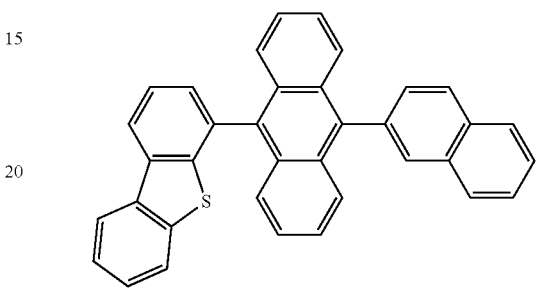
a-10
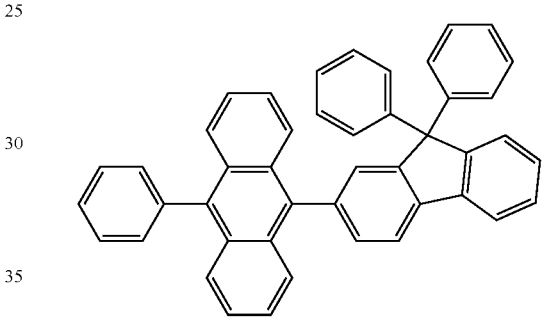
a-11
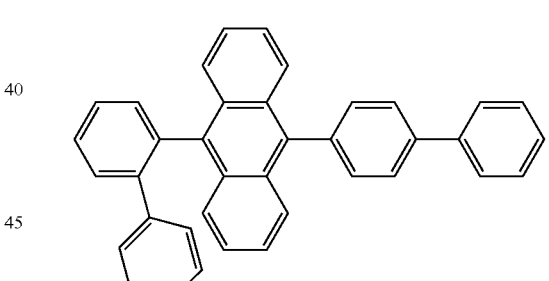
a-12
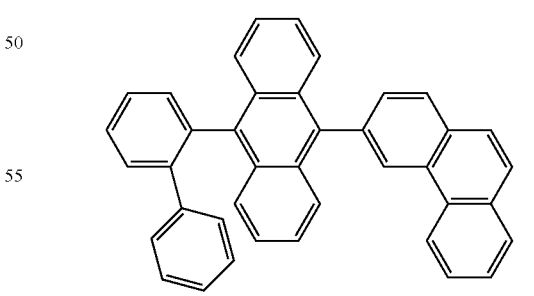
As described above, the organic EL device 100 according to an embodiment may improve hole injection properties from the anode 110 by disposing at least one layer of the first layer 121 including the hole transport compound doped with the electron accepting compound having a LUMO level from about −9.0 eV to about −4.0 eV. The above-described effects may be remarkable when combined with the emission layer 130 including the compound represented by Formula 3, and the driving at a low voltage of the organic EL device 100 may be realized.

The organic EL device according to an embodiment will be explained in more detail referring to the organic EL device 100 shown in FIG. 1. In the organic EL device 100 according to an embodiment, the substrate 101 may be, e.g., a transparent glass substrate, a semiconductor substrate formed using silicon, etc., or a flexible substrate of a resin, etc. The anode 110 may be disposed on the substrate 101, and may be formed using indium tin oxide (ITO), indium zinc oxide (IZO), etc.

As described above, the hole transport band 120 may be disposed between the anode 110 and the emission layer 130. In an embodiment, a hole injection layer may be formed as the first layer 121 on the anode 110 by, e.g., doping the electron accepting compound into the hole transport compound. As the hole transport compound, the compound represented by Formula 2 may be used.

The hole transport layer may be formed as the third layer 123 using a material including the hole transport material represented by Formula 2 and may be closer to the emission layer 130 than the hole injection layer 121. In addition, the hole transport layer 123 may be laminated in plural, and in this case, the hole transport layer disposed adjacent to the hole injection layer 121 may include the electron accepting compound.

An intermediate layer may be formed as the second layer 125 using a material including the hole transport material represented by Formula 1 and may be closer to the emission layer 130 than the hole transport layer 123. In an implementation, the intermediate layer 125 may be formed adjacent to, e.g., directly adjacent to, the emission layer 130. Thus, the diffusion of the electron accepting compound included in the hole injection layer 121 and/or the hole transport layer 123 into the emission layer 130 may be restrained, the hole transport laminated structure may be passivated from electrons not consumed in the emission layer 130, and the diffusion of energy of an excited state generated in the emission layer 130 into the hole transport laminated structure may be prevented. Accordingly, the emission efficiency and the life of the organic EL device may be improved.

The emission layer 130 may be formed adjacent to the intermediate layer 125. As the host material of the emission layer 130, e.g., an anthracene-containing compound represented by Formula 3 may be used. In addition, the emission layer 130 may include a suitable p-type dopant, e.g., 2,5,8,11-tetra-t-butylperylene (TBP).

On the emission layer 130, an electron transport layer 140 may be formed using, e.g., a material including tris(8-hydroxyquinolinato)aluminum (Alq3). On the electron transport layer 140, the electron injection layer 150 may be formed using a material including, e.g., lithium fluoride, lithium 8-quinolinato, etc. In addition, on the electron injection layer 150, the cathode 160 may be formed using a metal such as Al, Ag, etc. or a transparent material such as ITO, IZO, etc. Each of the above-described layers may be formed by selecting an appropriate layer forming method according to a material, such as a vacuum deposition method, a sputtering method, various coating methods, etc.

In the organic EL device according to an embodiment, the material for an organic EL device may be applied in an organic EL display of an active-matrix type using a TFT.

In addition, in the organic EL device 100 according to an embodiment, through the combination of the above-described layer structure and the materials, the hole transport laminated structure may be passivated from electrons not consumed in the emission layer 130, the diffusion of energy of an excited state generated in the emission layer 130 into the hole transport laminated structure may be prevented, and the whole charge balance of the organic EL device 100 may be controlled. In addition, by disposing the intermediate layer 125 toward the emission layer 130, the diffusion of the electron accepting compound into the emission layer 130 may be restrained, and the emission efficiency and the life of the organic EL device may be improved.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLES

Preparation Method

Figure 2:
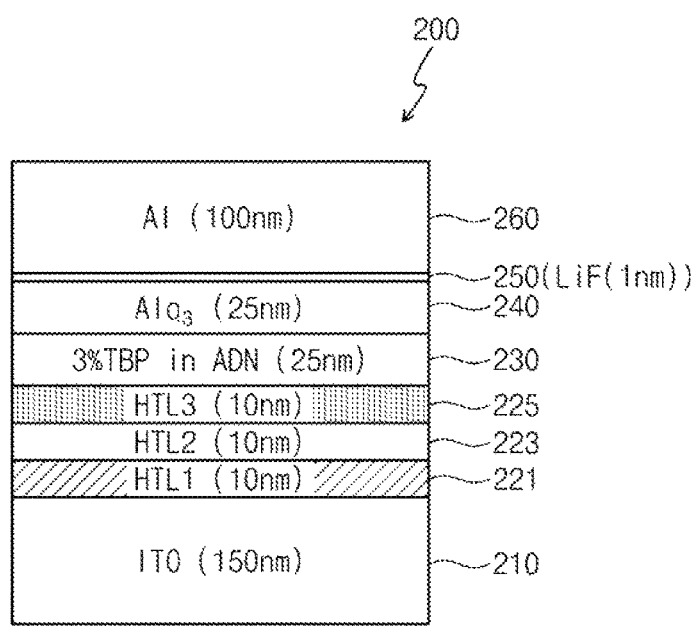
FIG. 2 illustrates a schematic diagram of an organic EL device according to an embodiment.

An organic EL device was manufactured using the above-described materials. FIG. 2 illustrates a schematic diagram of an organic EL device 200 according to an embodiment. In the Examples, an anode 110 was formed using ITO to have a layer thickness of about 150 nm. A layer HTL1 was formed (as a hole injection layer 221) by using Compound 25 (as a compound represented by Formula 2) or Compound 41 (described below), forming a layer having a thickness of about 10 nm, and doping Compound 39 (a compound represented by Formula ac14, as the electron accepting compound) in an amount of about 3 wt % with respect to a total weight of the materials constituting the layer HTL1. Another layer HTL2 was formed (as a hole transport layer 223) by using Compound 25 or Compound 42 (described below) to have a layer thickness of about 10 nm. In addition, another layer HTL3 was formed (as an intermediate layer 225) by using Compound 4 (as a compound represented by Formula 2) to have a layer thickness of about 10 nm.

4

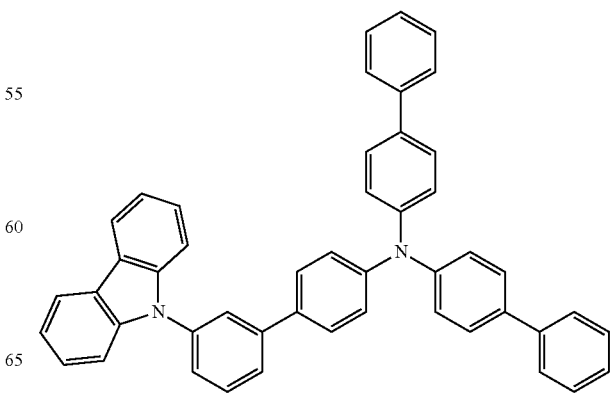

25

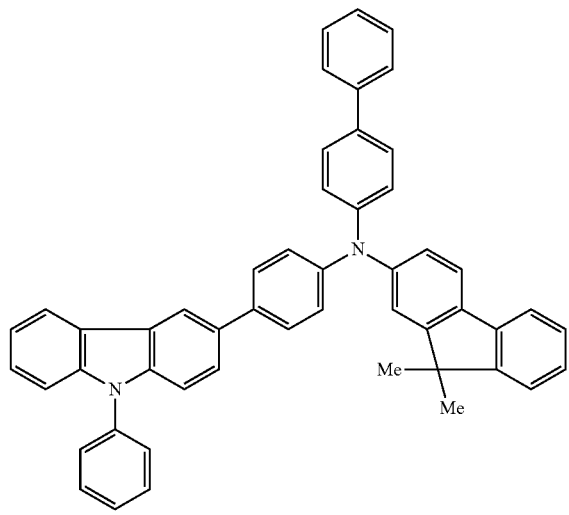

39

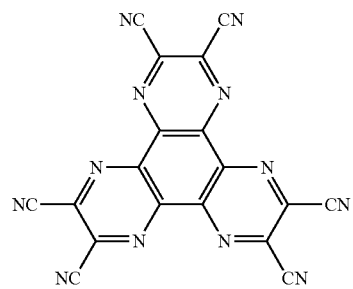

Then, an emission layer 130 was formed using a host material including 9,10-di(2-naphthyl)anthracene (ADN) (as a compound represented by Formula 3) doped with about 3% of TBP to have a layer thickness of about 25 nm. An electron transport layer 140 was formed using Alq3 to have a layer thickness of about 25 nm, an electron injection layer 150 was formed using LiF to have a layer thickness of about 1 nm, and a cathode 116 was formed using Al to have a layer thickness of about 100 nm.

In addition, organic EL devices were manufactured using the following Compounds 40 to 43, as opposed to the above-described compounds in HTL1 to HTL3, as Comparative Examples.

40

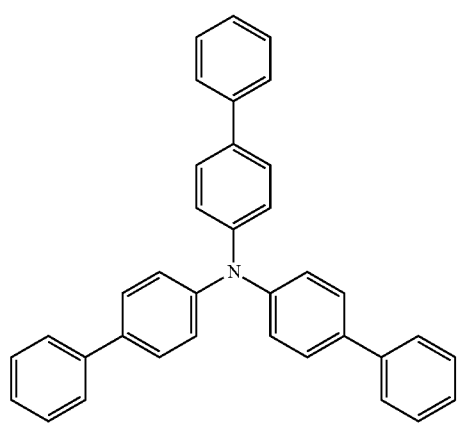

41

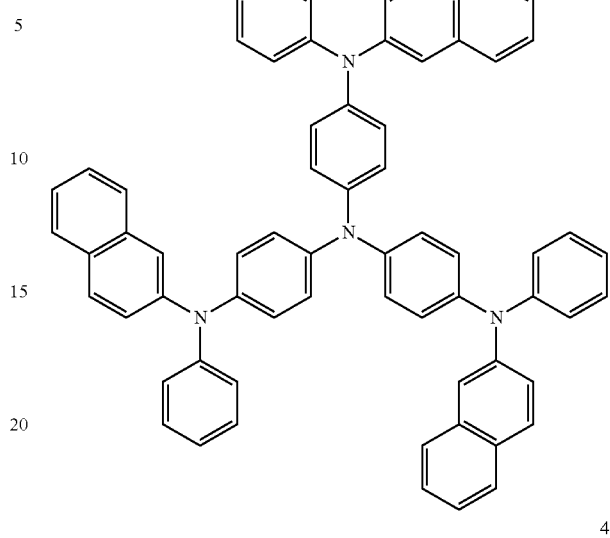

42

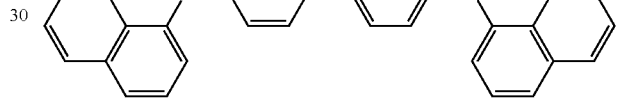

43

In Examples 1-1 to 1-3 and Comparative Examples 1-1 to 1-4, combinations of the compounds used in the HTL1 to HTL3 of the organic EL devices thus manufactured are summarized in the following Table 1.

TABLE 1

|  | HTL1 | HTL2 | HTL3 |
|---|---|---|---|
| Example 1-1 | Compounds 25 + 39 | Compound 25 | Compound 4 |
| Example 1-2 | Compounds 41 + 39 | Compound 25 | Compound 4 |
| Example 1-3 | Compounds 25 + 39 | Compound 42 | Compound 4 |

TABLE 1-continued

| | HTL1 | HTL2 | HTL3 |
|---|---|---|---|
| Comparative Example 1-1 | Compounds 25 + 39 | Compound 4 | Compound 25 |
| Comparative Example 1-2 | Compounds 25 | Compound 25 | Compound 4 |
| Comparative Example 1-3 | Compound 25 + 39 | Compounds 25 | Compound 40 |
| Comparative Example 1-4 | Compounds 25 + 39 | Compound 25 | Compound 43 |

With respect to the organic EL devices manufactured in the Examples and the Comparative Examples, voltage, power efficiency, and current efficiency were evaluated. In addition, current density was about 10 mA/cm$^2$. Evaluation results are illustrated in the following Table 2.

TABLE 2

| | Voltage (V) | Emission efficiency (cd/A) | Half life (h) |
|---|---|---|---|
| Example 1-1 | 6.3 | 7.7 | 3,700 |
| Example 1-2 | 6.4 | 7.5 | 3,300 |
| Example 1-3 | 6.3 | 7.4 | 2,800 |
| Comparative Example 1-1 | 6.4 | 7.3 | 2,200 |
| Comparative Example 1-2 | 7.5 | 6.3 | 2,000 |
| Comparative Example 1-3 | 6.4 | 7.3 | 2,300 |
| Comparative Example 1-4 | 6.6 | 7.3 | 2,600 |

As may be seen in Table 2, the driving voltage was lowered and the half life was improved for the organic EL device of Example 1-1, when compared to that of Comparative Example 1-2, in which the electron accepting compound, Compound 39, was not doped in HTL1. In addition, emission efficiency and half life of the device was improved in Example 1-2, in which the electron accepting compound was doped in a non-carbazole-based hole transport material, Compound 41. In addition, the emission efficiency and the life of the device was improved in Example 1-3, in which the non-carbazole-based hole transport compound, Compound 42, was used in the hole transport layer HTL2. When comparing Example 1-1 with Comparative Example 1-1, in which the compound included in the hole transport layers of HTL2 and HTL3 were reversed, a slight decrease in driving voltage and an increase of the emission efficiency and the half-life were observed. In addition, when comparing Examples 1-1 and 1-3 with Comparative Examples 1-3 and 1-4, which included a non-carbazole hole transport material in HTL3 or a carbazole hole transport material having a different structure, respectively, the same or slightly decreased driving voltage and an improvement in the emission efficiency and the life were observed.

As described above, in the laminated structure of at least three layers having different components in a hole transport band in an organic EL device, an organic EL device having high efficiency and long life may be provided by including at least one layer that includes the hole transport compound doped with the electron accepting compound having a LUMO level from about −9.0 eV to about −4.0 eV adjacent to the anode and including at least one layer having a compound represented by Formula 1 closer to the emission layer than the layer that includes the hole transport compound doped with the electron accepting compound.

Hereinafter, an organic EL device according to another embodiment will be explained. Referring to FIGS. 1 and 2, according to an embodiment, to realize an organic EL device having improved emission efficiency and long life, a laminated structure of at least three layers having different components may be provided in the hole transport band 120 between the anode 110 and the emission layer 130. The laminated structure may include at least a first layer 121 and a second layer 125. At least one layer (e.g., the first layer 121) adjacent to the anode 110 of the laminated structure may include an electron accepting compound having a LUMO level from about −9.0 eV to about −4.0 eV as a main component. Here, "including the electron accepting compound as a main component" means that including the electron accepting compound in an amount of greater than or equal to about 50 wt % with respect to a total weight of all materials constituting the first layer 121. At least one layer (e.g., the second layer 125) between the first layer 121 and the emission layer 130 and adjacent to the emission layer 130 may include a compound represented by the following Formula 1.

[Formula 1]

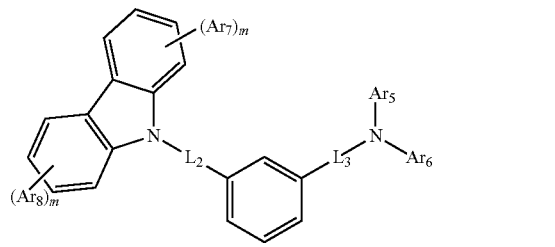

In Formula 1, Ar$_5$ to Ar$_8$ may each independently be or may include, e.g., a substituted or unsubstituted aryl group having 6 to 50 ring carbon atoms or a substituted or unsubstituted heteroaryl group having 5 to 50 ring carbon atoms, each m may independently be an integer of 0 to 4, and L$_2$ and L$_3$ may each independently be or may include, e.g., a single bond, a substituted or unsubstituted arylene group having 6 to 18 ring carbon atoms or a substituted or unsubstituted heteroarylene group having 5 to 15 ring carbon atoms. In an implementation, adjacent one of Ar$_5$ to Ar$_8$ may form a ring. For example, adjacent Ar$_5$ and Ar$_6$ may be combined to form a ring. In an implementation, adjacent Ar$_7$s and/or adjacent Ar$_8$s may be combined to form a ring.

In an implementation, Ar$_5$ to Ar$_8$ may each independently include, e.g., a phenyl group, a biphenyl group, a terphenyl group, a naphthyl group, an anthryl group, a phenanthryl group, a fluorenyl group, an indenyl group, a pyrenyl group, an acetonaphthenyl group, a fluoranthenyl group, a triphenylenyl group, a pyridyl group, a pyranyl group, a quinolyl group, an isoquinolyl group, a benzofuranyl group, a benzothienyl group, an indolyl group, a carbazolyl group, a benzoxazolyl group, a benzothiazolyl group, a quinoxalyl group, a benzoxazolyl group, a dibenzofuranyl group, or a dibenzothienyl group. In an implementation, the phenyl group, the biphenyl group, the terphenyl group, the fluorenyl group, the carbazolyl group, the dibenzofuranyl group, or the like may be used.

In an implementation, L$_2$ and L$_3$ may each independently include, e.g., other than a single bond, a phenylene group, a biphenylene group, a terphenylylene group, a naphthylene group, an anthrylene group, a phenanthrylene group, a fluorirane group, an indanediyl group, a pyrenediyl group, an acenaphthenediyl group, a fluoranthenediyl group, a triphenylenediyl group, a pyridinediyl group, a pyranediyl group, a quinolinediyl group, an isoquinolinediyl group, a benzofuranediyl group, a benzothiophenediyl group, an indolediyl group, a carbazolediyl group, a benzoxazolediyl group, a benzothiazolediyl group, a quinoxalinediyl group, a benzoimidazolediyl group, a dibenzofuranediyl group, or the like. In an implementation, the phenylene group, the terphenylene group, the fluorenediyl group, the carbazolediyl group, the dibenzofuranediyl group, or the like may be used.

Examples of the compound represented by Formula 1 may include one of the following Compounds 1 to 22.

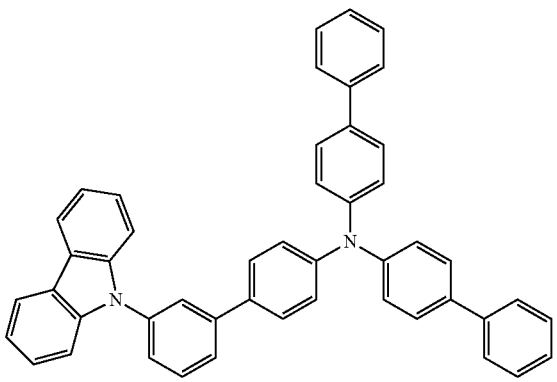

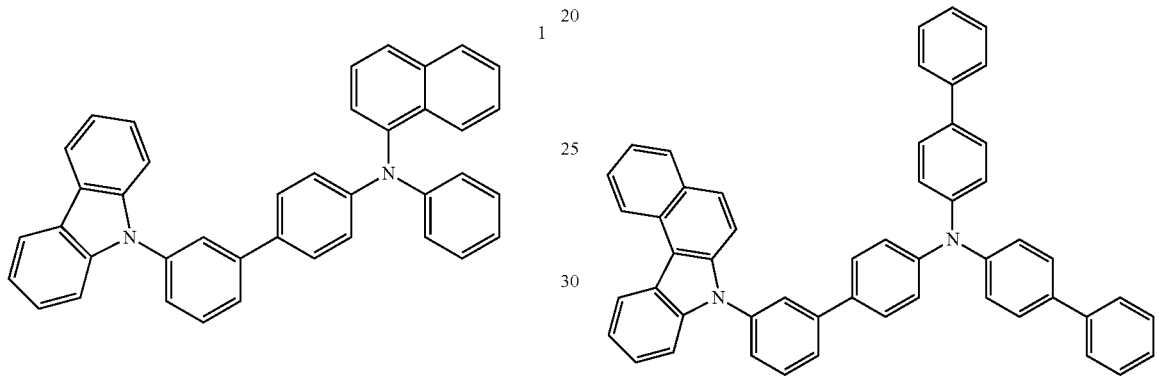

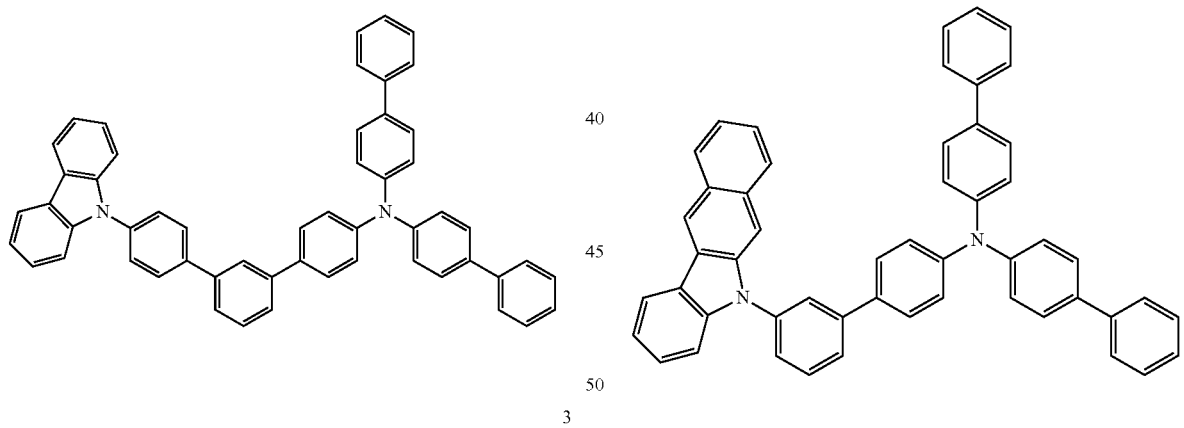

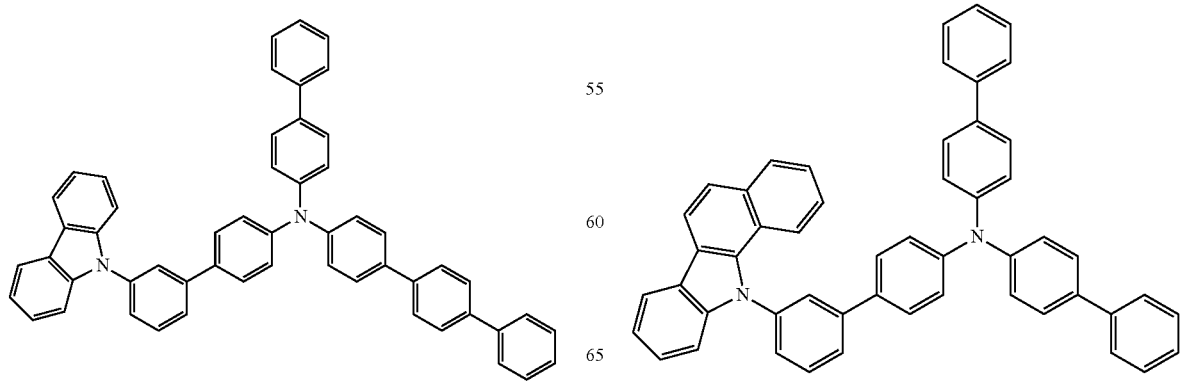

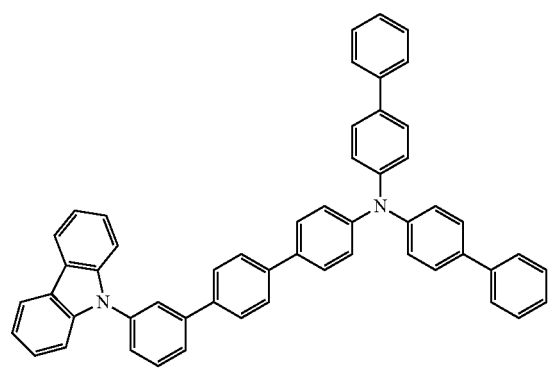
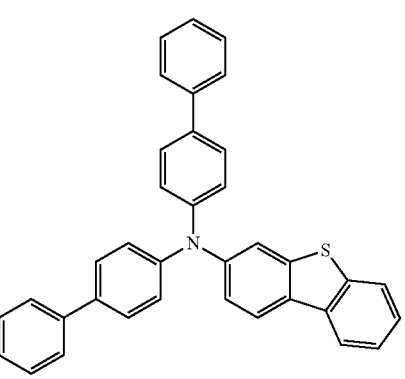
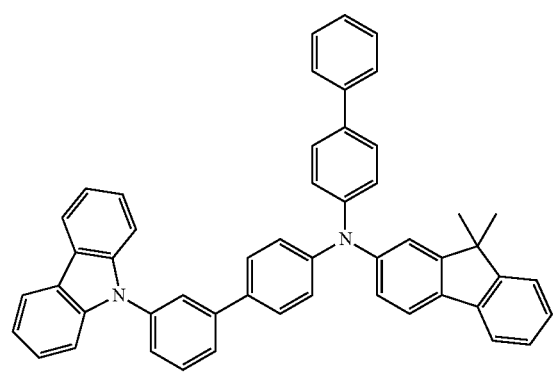
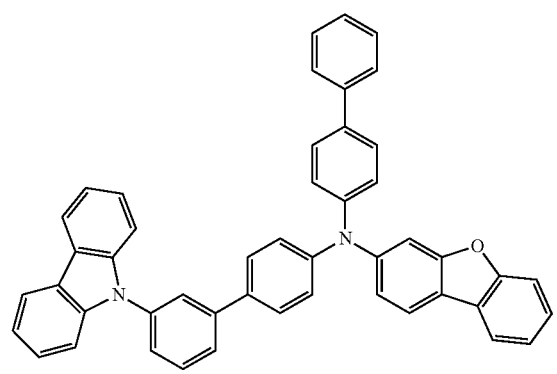

16

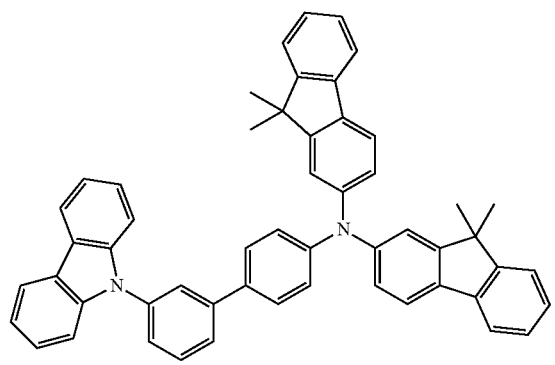

17

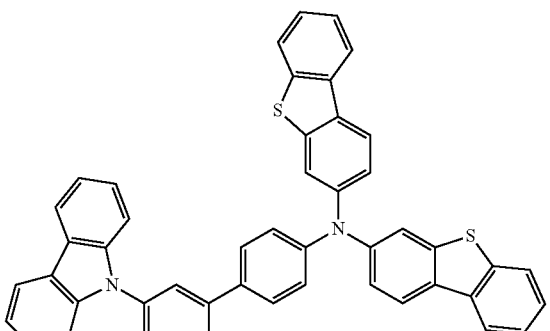

18

19

20

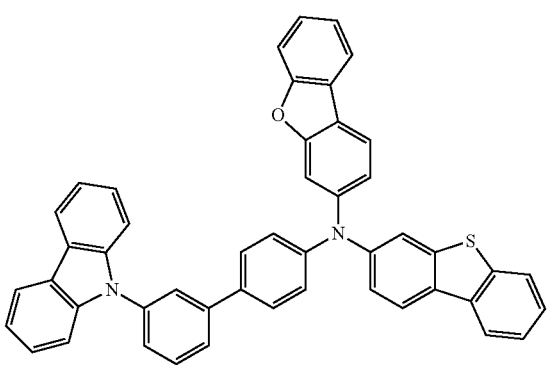

21

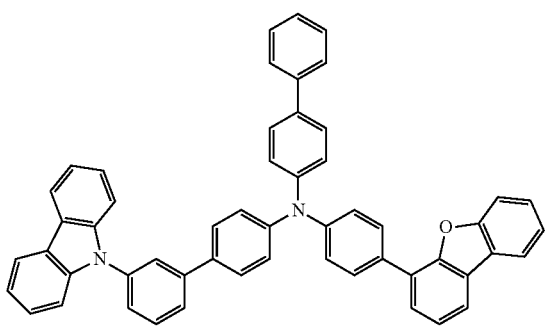

22

At least one layer (e.g., the first layer 121) adjacent to the anode 110 of the laminated structure may include an electron accepting compound having a LUMO level from about −9.0 eV to about −4.0 eV as a main component. The amount of the electron accepting compound in the first layer 121 may be greater than or equal to about 50 wt %, with respect to a total weight of all materials constituting the first layer 121. In an implementation, the electron accepting compound may be, e.g., represented by one of the following Formulae ac1 to ac14.

ac1

-continued ac2
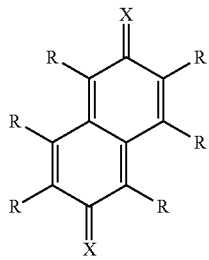

ac3
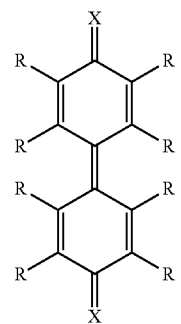

ac4
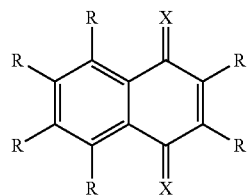

ac5
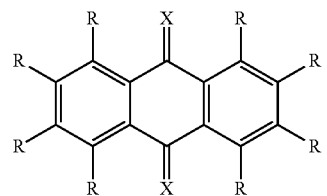

ac6
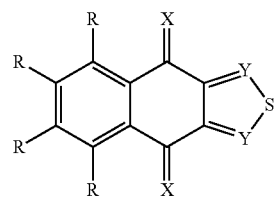

ac7
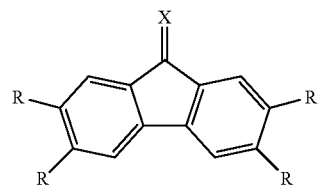

ac8
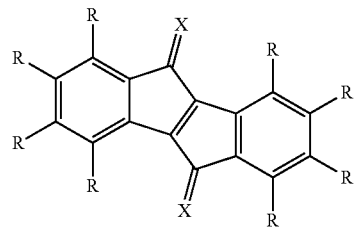

-continued ac9
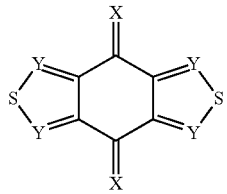

ac10
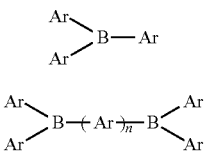

ac11
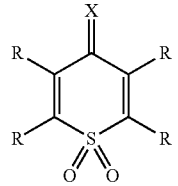

ac12 ac13 ac14

In Formulae ac1 to ac14, each R may independently be, e.g., a hydrogen atom, a deuterium atom, a halogen atom, a fluoroalkyl group having 1 to 10 carbon atoms, a cyano group, an alkoxy group having 1 to 10 carbon atoms, an alkyl group having 1 to 10 carbon atoms, or an aryl group having 6 to 30 ring carbon atoms. In an implementation, Rs may not all be hydrogen atoms, deuterium atoms, and/or the fluorine atoms in the same molecule. Each Ar may independently be or include, e.g., a substituted or unsubstituted electron withdrawing aryl group having 6 to 30 carbon atoms or a substituted or unsubstituted heteroaryl group having 3 to 30 carbon atoms. Each Y may independently be, e.g., a methine group (—CH═) or a nitrogen atom (—N═). Z may be, e.g., pseudohalogen or sulfur (S). Each X may independently be a group represented by one of the following Formulae x1 to x7.

x1

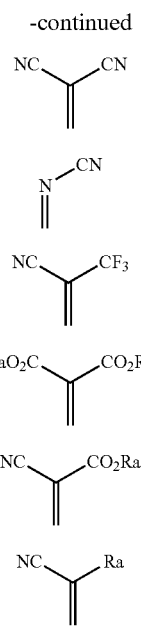

In Formulae x1 to x7, Ra may be or may include, e.g., a hydrogen atom, a deuterium atom, a halogen atom, a fluoroalkyl group having 1 to 10 carbon atoms, a cyano group, an alkoxy group having 1 to 10 carbon atoms, an alkyl group having 1 to 10 carbon atoms, a substituted or unsubstituted aryl group having 6 to 30 ring carbon atoms or a substituted or unsubstituted heteroaryl group having 3 to 30 ring carbon atoms.

Examples of the substituted or unsubstituted aryl group having 6 to 30 ring carbon atoms or the substituted or unsubstituted heteroaryl group having 3 to 30 ring carbon atoms, represented by R, Ar, and/or Ra, may include a phenyl group, a 1-naphthyl group, a 2-naphthyl group, a 1-anthryl group, a 2-anthryl group, a 9-anthryl group, a 1-phenanthryl group, a 2-phenanthryl group, a 3-phenanthryl group, a 4-phenanthryl group, a 9-phenanthryl group, a 1-naphthacenyl group, a 2-naphthacenyl group, a 9-naphthacenyl group, a 1-pyrenyl group, a 2-pyrenyl group, a 4-pyrenyl group, a 2-biphenylyl group, a 3-biphenylyl group, a 4-biphenylyl group, a p-terphenyl-4-yl group, a p-terphenyl-3-yl group, a p-terphenyl-2-yl group, a m-terphenyl-4-yl group, a m-terphenyl-3-yl group, a m-terphenyl-2-yl group, an o-tolyl group, a m-tolyl group, a p-tolyl group, a p-t-butylphenyl group, a p-(2-phenylpropyl)phenyl group, a 3-methyl-2-naphthyl group, a 4-methyl-1-naphthyl group, a 4-methyl-1-anthryl group, a 4'-methylbiphenylyl group, a 4"-t-butyl-p-terphenyl-4-yl group, a fluoranthenyl group, a fluorenyl group, a 1-pyrrolyl group, a 2-pyrrolyl group, a 3-pyrrolyl group, a pyrazinyl group, a 2-pyridinyl group, a 3-pyridinyl group, a 4-pyridinyl group, a 1-indolyl group, a 2-indolyl group, a 3-indolyl group, a 4-indolyl group, a 5-indolyl group, a 6-indolyl group, a 7-indolyl group, a 1-isoindolyl group, a 2-isoindolyl group, a 3-isoindolyl group, a 4-isoindolyl group, a 5-isoindolyl group, a 6-isoindolyl group, a 7-isoindolyl group, a 2-furyl group, a 3-furyl group, a 2-benzofuranyl group, a 3-benzofuranyl group, a 4-benzofuranyl group, a 5-benzofuranyl group, a 6-benzofuranyl group, a 7-benzofuranyl group, a 1-isobenzofuranyl group, a 3-isobenzofuranyl group, a 4-isobenzofuranyl group, a 5-isobenzofuranyl group, a 6-isobenzofuranyl group, a 7-isobenzofuranyl group, a quinolyl group, a 3-quinolyl group, a 4-quinolyl group, a 5-quinolyl group, a 6-quinolyl group, a 7-quinolyl group, a 8-quinolyl group, a 1-isoquinolyl group, a 3-isoquinolyl group, a 4-isoquinolyl group, a 5-isoquinolyl group, a 6-isoquinolyl group, a 7-isoquinolyl group, a 8-isoquinolyl group, a 2-quinoxalinyl group, a 5-quinoxalinyl group, a 6-quinoxalinyl group, a 1-carbazolyl group, a 2-carbazolyl group, a 3-carbazolyl group, a 4-carbazolyl group, a 9-carbazolyl group, a 1-phenanthridinyl group, a 2-phenanthridinyl group, a 3-phenanthridinyl group, a 4-phenanthridinyl group, a 6-phenanthridinyl group, a 7-phenanthridinyl group, a 8-phenanthridinyl group, a 9-phenanthridinyl group, a 10-phenanthridinyl group, a 1-acridinyl group, a 2-acridinyl group, a 3-acridinyl group, a 4-acridinyl group, a 9-acridinyl group, a 1,7-phenanthroline-2-yl group, a 1,7-phenanthroline-3-yl group, a 1,7-phenanthroline-4-yl group, a 1,7-phenanthroline-5-yl group, a 1,7-phenanthroline-6-yl group, a 1,7-phenanthroline-8-yl group, a 1,7-phenanthroline-9-yl group, a 1,7-phenanthroline-10-yl group, a 1,8-phenanthroline-2-yl group, a 1,8-phenanthroline-3-yl group, a 1,8-phenanthroline-4-yl group, a 1,8-phenanthroline-5-yl group, a 1,8-phenanthroline-6-yl group, a 1,8-phenanthroline-7-yl group, a 1,8-phenanthroline-9-yl group, a 1,8-phenanthroline-10-yl group, a 1,9-phenanthroline-2-yl group, a 1,9-phenanthroline-3-yl group, a 1,9-phenanthroline-4-yl group, a 1,9-phenanthroline-5-yl group, a 1,9-phenanthroline-6-yl group, a 1,9-phenanthroline-7-yl group, a 1,9-phenanthroline-8-yl group, a 1,9-phenanthroline-10-yl group, a 1,10-phenanthroline-2-yl group, a 1,10-phenanthroline-3-yl group, a 1,10-phenanthroline-4-yl group, a 1,10-phenanthroline-5-yl group, a 2,9-phenanthroline-1-yl group, a 2,9-phenanthroline-3-yl group, a 2,9-phenanthroline-4-yl group, a 2,9-phenanthroline-5-yl group, a 2,9-phenanthroline-6-yl group, a 2,9-phenanthroline-7-yl group, a 2,9-phenanthroline-8-yl group, a 2,9-phenanthroline-10-yl group, a 2,8-phenanthroline-1-yl group, a 2,8-phenanthroline-3-yl group, a 2,8-phenanthroline-4-yl group, a 2,8-phenanthroline-5-yl group, a 2,8-phenanthroline-6-yl group, a 2,8-phenanthroline-7-yl group, a 2,8-phenanthroline-9-yl group, a 2,8-phenanthroline-10-yl group, a 2,7-phenanthroline-1-yl group, a 2,7-phenanthroline-3-yl group, a 2,7-phenanthroline-4-yl group, a 2,7-phenanthroline-5-yl group, a 2,7-phenanthroline-6-yl group, a 2,7-phenanthroline-8-yl group, a 2,7-phenanthroline-9-yl group, a 2,7-phenanthroline-10-yl group, a 1-phenazinyl group, a 2-phenazinyl group, a 1-phenothiazinyl group, a 2-phenothiazinyl group, a 3-phenothiazinyl group, a 4-phenothiazinyl group, a 10-phenothiazinyl group, a 1-phenoxazinyl group, a 2-phenoxazinyl group, a 3-phenoxazinyl group, a 4-phenoxazinyl group, a 10-phenoxazinyl group, a 2-oxazolyl group, a 4-oxazolyl group, a 5-oxazolyl group, a 2-oxadiazolyl group, a 5-oxadiazolyl group, a 3-furazanyl group, a 2-thienyl group, a 3-thienyl group, a 2-methylpyrrole-1-yl group, a 2-methylpyrrole-3-yl group, a 2-methylpyrrole-4-yl group, a 2-methylpyrrole-5-yl group, a 3-methylpyrrole-1-yl group, a 3-methylpyrrole-2-yl group, a 3-methylpyrrole-4-yl group, a 3-methylpyrrole-5-yl group, a 2-t-butylpyrrole-4-yl group, a 3-(2-phenylpropyl)pyrrole-1-yl group, a 2-methyl-1-indolyl group, a 4-methyl-1-indolyl group, a 2-methyl-3-indolyl group, a 4-methyl-3-indolyl group, a 2-t-butyl-1-indolyl group, a 4-t-butyl-1-indolyl group, a 2-t-butyl-3-indolyl group, a 4-t-butyl-3-indolyl group, or the like.

Examples of the substituted or unsubstituted fluoroalkyl group having 1 to 10 carbon atoms, represented by R and Ra, may include a perfluoroalkyl group such as a trifluoromethyl group, a pentafluoroethyl group, a heptafluoropropyl group, a heptadecafluorooctane group, etc. or a monofluoromethyl group, a difluoromethyl group, a trifluoroethyl group, a tetrafluoropropyl group, an octafluoropentyl group, or the like.

Examples of the alkyl group having 1 to 10 carbon atoms, represented by R and Ra, may include a methyl group, an ethyl group, a propyl group, an isopropyl group, a n-butyl group, a s-butyl group, an isobutyl group, a t-butyl group, a n-pentyl group, a n-hexyl group, a n-heptyl group, a n-octyl group, a hydroxymethyl group, a 1-hydroxyethyl group, a 2-hydroxyethyl group, a 2-hydroxyisobutyl group, a 1,2-dihydroxyethyl group, a 1,3-dihydroxyisopropyl group, a 2,3-dihydroxy-t-butyl group, a 1,2,3-trihydroxypropyl group, a chloromethyl group, a 1-chloroethyl group, a 2-chloroethyl group, a 2-chloroisobutyl group, a 1,2-dichloroethyl group, a 1,3-dichloroisopropyl group, a 2,3-dichloro-t-butyl group, a 1,2,3-trichloropropyl group, a bromomethyl group, a 1-bromoethyl group, a 2-bromoethyl group, a 2-bromoisobutyl group, a 1,2-dibromoethyl group, a 1,3-dibromoisopropyl group, a 2,3-dibromo-t-butyl group, a 1,2,3-tribromopropyl group, an iodomethyl group, a 1-iodoethyl group, a 2-iodoethyl group, a 2-iodoisobutyl group, a 1,2-diiodoethyl group, a 1,3-diiodoisopropyl group, a 2,3-diiodo-t-butyl group, a 1,2,3-triiodopropyl group, an aminomethyl group, a 1-aminoethyl group, a 2-aminoethyl group, a 2-aminoisobutyl group, a 1,2-diaminoethyl group, a 1,3-diaminoisopropyl group, a 2,3-diamino-t-butyl group, a 1,2,3-triaminopropyl group, a cyanomethyl group, a 1-cyanoethyl group, a 2-cyanoethyl group, a 2-cyanoisobutyl group, a 1,2-dicyanoethyl group, a 1,3-dicyanoisopropyl group, a 2,3-dicyano-t-butyl group, a 1,2,3-tricyanopropyl group, a nitromethyl group, a 1-nitroethyl group, a 2-nitroethyl group, a 2-nitroisobutyl group, a 1,2-dinitroethyl group, a 1,3-dinitroisopropyl group, a 2,3-dinitro-t-butyl group, a 1,2,3-trinitropropyl group, a cyclopropyl group, a cyclobutyl group, a cyclopentyl group, a cyclohexyl group, a 4-methylcyclohexyl group, a 1-adamantyl group, a 2-adamantyl group, a 1-norbornyl group, a 2-norbornyl group, or the like.

The alkoxy group having 1 to 10 carbon atoms, represented by R and Ra, is a group represented by —OY, and examples of Y may include a methyl group, an ethyl group, a propyl group, an isopropyl group, a n-butyl group, a s-butyl group, an isobutyl group, a t-butyl group, a n-pentyl group, a n-hexyl group, a n-heptyl group, a n-octyl group, a hydroxymethyl group, a 2-hydroxyethyl group, a 2-hydroxyethyl group, a 2-hydroxyisobutyl group, a 1,2-dihydroxyethyl group, a 1,3-dihydroxyisopropyl group, a 2,3-dihydroxy-t-butyl group, a 1,2,3-trihydroxypropyl group, a chloromethyl group, a 1-chloroethyl group, a 2-chloroethyl group, a 2-chloroisobutyl group, a 1,2-dichloroethyl group, a 1,3-dichloroisopropyl group, a 2,3-dichloro-t-butyl group, a 1,2,3-trichloropropyl group, a bromomethyl group, a 1-bromoethyl group, a 2-bromoethyl group, a 2-bromoisobutyl group, a 1,2-dibromoethyl group, a 1,3-dibromoisopropyl group, a 2,3-dibromo-t-butyl group, a 1,2,3-tribromopropyl group, an iodomethyl group, a 1-iodoethyl group, a 2-iodoethyl group, a 2-iodoisobutyl group, a 1,2-diiodoethyl group, a 1,3-diiodoisopropyl group, a 2,3-diiodo-t-butyl group, a 1,2,3-triiodopropyl group, an aminomethyl group, a 1-aminoethyl group, a 2-aminoethyl group, a 2-aminoisobutyl group, a 1,2-diaminoethyl group, a 1,3-diaminoisopropyl group, a 2,3-diamino-t-butyl group, a 1,2,3-triaminopropyl group, a cyanomethyl group, a 1-cyanoethyl group, a 2-cyanoethyl group, a 2-cyanoisobutyl group, a 1,2-dicyanoethyl group, a 1,3-dicyanoisopropyl group, a 2,3-dicyano-t-butyl group, a 1,2,3-tricyanopropyl group, a nitromethyl group, a 1-nitroethyl group, a 2-nitroethyl group, a 2-nitroisobutyl group, a 1,2-dinitroethyl group, a 1,3-dinitroisopropyl group, a 2,3-dinitro-t-butyl group, a 1,2,3-trinitropropyl group, or the like.

A halogen atom represented by R and Ra may be fluorine, chlorine, bromine, and iodine.

In an implementation, in the hole transport band 120 of the organic electroluminescent device 100, the laminated structure of at least three layers may include at least one layer (e.g., the third layer 123) including a compound represented by the following Formula 2, between the first layer 121 and the second layer 125.

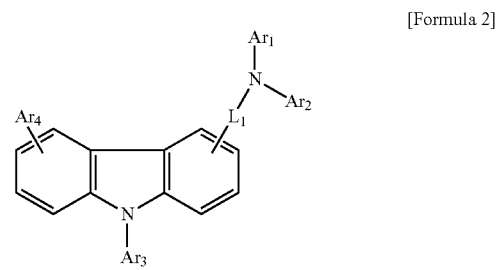

[Formula 2]

In Formula 2, $Ar_1$, $Ar_2$, and $Ar_3$ may each independently be or may include, e.g., a substituted or unsubstituted aryl group having 6 to 50 ring carbon atoms or a substituted or unsubstituted heteroaryl group having 5 to 50 ring carbon atoms. $Ar_4$ may be or may include, e.g., a substituted or unsubstituted aryl group having 6 to 50 ring carbon atoms, a substituted or unsubstituted heteroaryl group having 5 to 50 ring carbon atoms, or a substituted or unsubstituted alkyl group having 1 to 50 carbon atoms. $L_1$ may be or may include, e.g., a single bond, a substituted or unsubstituted arylene group having 6 to 18 ring carbon atoms, or a substituted or unsubstituted heteroarylene group having 5 to 15 ring carbon atoms.

In an implementation, $Ar_1$ to $Ar_3$ may each independently include, e.g., a phenyl group, a biphenyl group, a terphenyl group, a naphthyl group, an anthryl group, a phenanthryl group, a fluorenyl group, an indenyl group, a pyrenyl group, an acetonaphthenyl group, a fluoranthenyl group, a triphenylenyl group, a pyridyl group, a pyranyl group, a quinolyl group, an isoquinolyl group, a benzofuranyl group, a benzothienyl group, an indolyl group, a carbazolyl group, a benzoxazolyl group, a benzothiazolyl group, a quinoxalyl group, a benzoxazolyl group, a dibenzofuranyl group, or a dibenzothienyl group. In an implementation, the phenyl group, the biphenyl group, the terphenyl group, the fluorenyl group, the carbazolyl group, the dibenzofuranyl group, or the like may be used.

In an implementation, in $Ar_4$, the aryl group and the heteroaryl group may be the same as the groups described as examples of $Ar_1$ to $Ar_3$, and the alkyl group may be a methyl group or an ethyl group.

In an implementation, $L_1$ may include, e.g., other than a single bond, a phenylene group, a biphenylene group, a terphenylene group, a naphthalene group, an anthrylene group, a phenanthrylene group, a fluorirane group, an indanediyl group, a pyrenediyl group, an acenaphthenediyl group, a fluoranthenediyl group, a triphenylenediyl group, a pyridinediyl group, a pyranediyl group, a quinolilnediyl group, an isoquinolinediyl group, a benzofuranediyl group, a benzothiophenediyl group, an indolediyl group, a carbazolediyl group, a benzoxazolediyl group, a benzothiazolediyl group, a quinoxalinediyl group, a benzoimidazolediyl group, a dibenzofuranediyl group, or the like. In an implementation, the phenylene group, the terphenylene group, the fluorenediyl group, the carbazolediyl group, the dibenzofuranediyl group, or the like may be used.
Examples of the compound represented by Formula 2 may include one of the following Compounds 23 to 38.
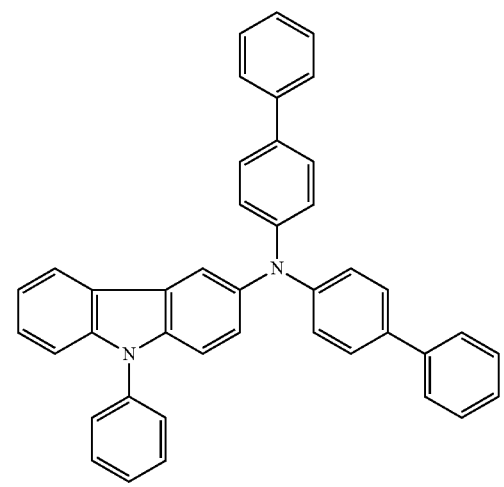
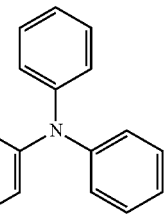
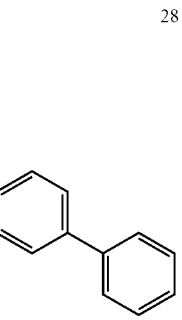

-continued
29
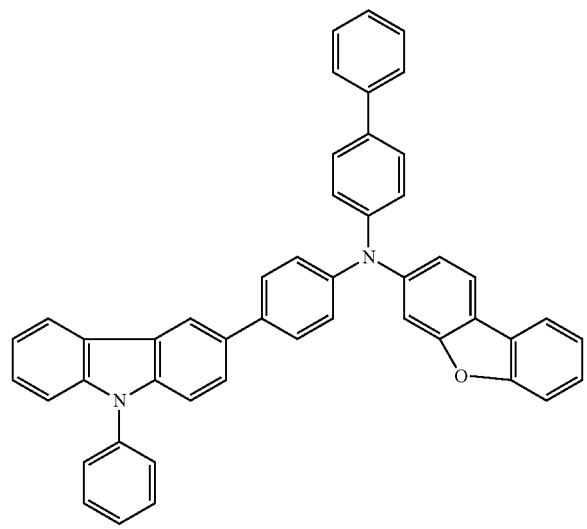
30
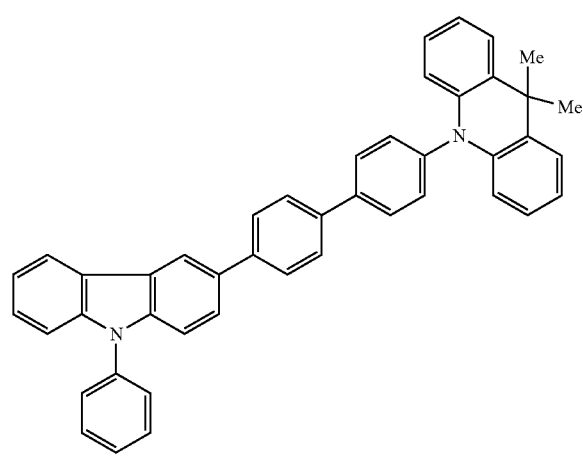
31
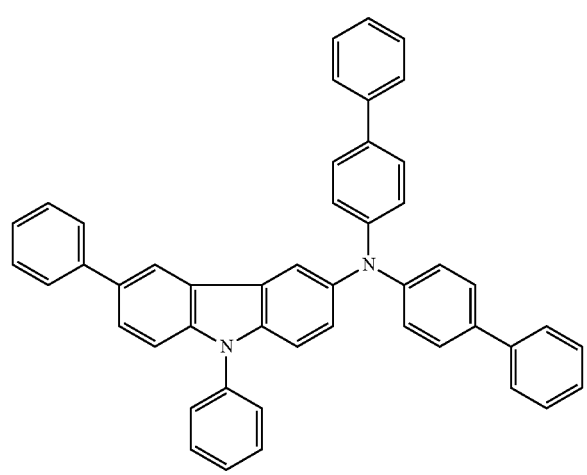
-continued
32
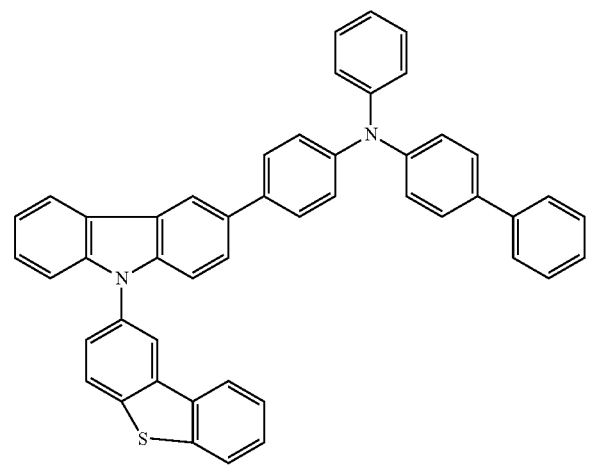
33
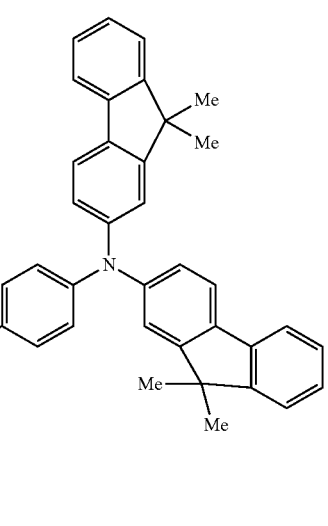
34
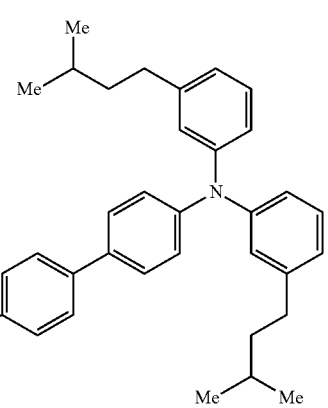

35

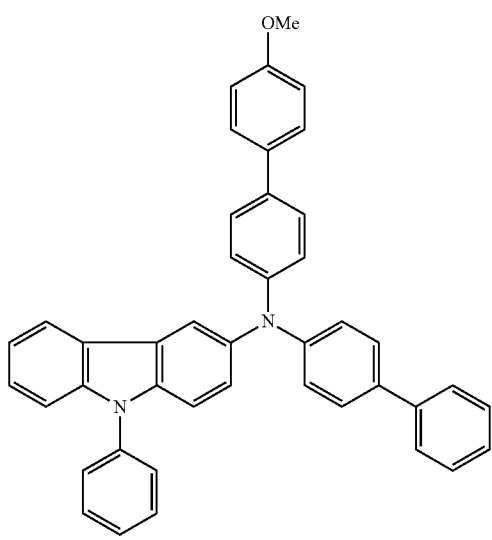

36

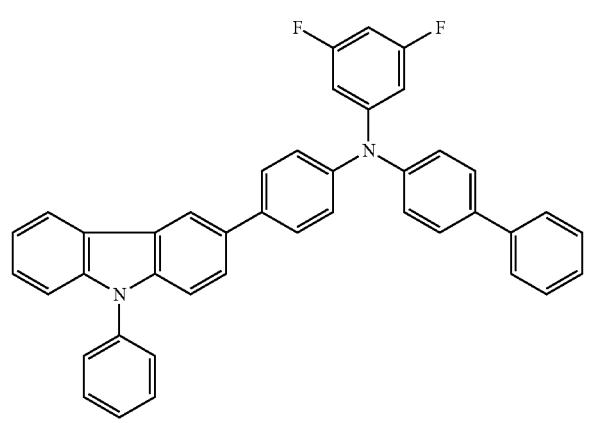

37

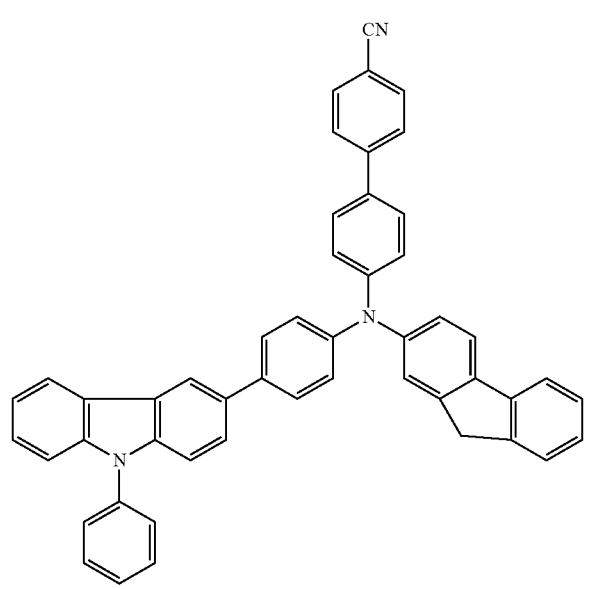

38

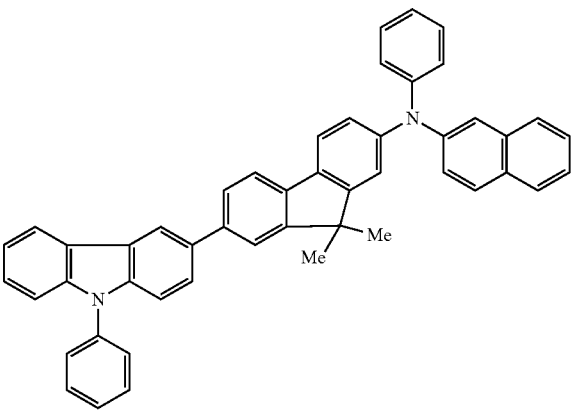

In the laminated structure of at least three layers having different components in the hole transport band 120 in the organic EL device 100, at least one layer (e.g., the first layer 121) formed by using the electron accepting compound having a LUMO level from about −9.0 eV to about −4.0 eV as a main component may be adjacent to the anode 110, and at least one layer (e.g., the second layer 125) including the compound represented by Formula 1 may be adjacent to the emission layer 130. For example, the first layer 121 may be between the anode 110 and the second layer 125. For example, the second layer 125 may be between the first layer 121 and the emission layer 130.

By forming the first layer 121 using the electron accepting compound having a LUMO level from about −9.0 eV to about −4.0 eV as a main component, hole injection properties from the anode 110 may be improved. Thus, in an embodiment, the first layer 121 including the electron accepting compound may be disposed toward or adjacent to the anode 110, and hole injection properties from the anode 110 of the organic EL device 100 may be markedly improved.

The organic EL device 100 according to an embodiment may include an amine derivative or amine-containing compound having a carbazolyl group, e.g., a compound represented by Formula 1, in the hole transport second layer 125 adjacent to the emission layer 130. The hole transport laminated structure may be passivated from electrons not consumed in the emission layer 130. In addition, the diffusion of energy of an excited state generated in the emission layer 130 into the hole transport laminated structure may be prevented, and a whole charge balance of the organic EL device 100 may be controlled.

In the organic EL device 100, the third layer 123 including the compound having the carbazolyl group, e.g., represented by Formula 2, may be disposed closer to the emission layer 130 than the first layer 121. By including the compound having the carbazolyl group in the hole transport laminated structure, charge transport properties and current flow durability may be improved. In an implementation, by including the compound represented by Formula 2 in the third layer 123, the hole transport laminated structure may be passivated from electrons that are not consumed in the emission layer 130, and the diffusion of energy of an excited state generated in the emission layer 130 into the hole transport laminated structure may be prevented. In addition, the amine derivative having the carbazolyl group and represented by Formula 2 may help restrain diffusion of the electron accepting compound into the emission layer 130.

In addition, by disposing the second layer 125 (including the compound represented by Formula 1) adjacent to the emission layer 130, diffusion of the electron accepting compound included in the first layer 121 into the emission layer 130 may be restrained or prevented, the hole transport first layer 121 and second layer 123 may be passivated from electrons not consumed in the emission layer 130, and the diffusion of energy of an excited state generated in the emission layer 130 into the hole transport first layer 121 and third layer 123 may be prevented. In addition, by including the amine derivative having the carbazolyl group represented by Formula 1 in the second layer 125, the hole transport properties and the current flow durability of the laminated structure may be improved.

In an implementation, in a layer constituting the laminated structure of the hole transport band 120 between the anode 110 and the emission layer 130 in the organic EL device 100, the compound having the carbazolyl group may be included. By including the compound having the carbazolyl group in the layer constituting the laminated structure of the hole transport band 120, charge transport properties and current flow durability may be improved. In an implementation, in the layer constituting the laminated structure of the hole transport band 120 between the anode 110 and the emission layer 130 in the organic EL device 100, the compound represented by Formula 1 or 2 may be included. Thus, the hole transport laminated structure may be passivated from electrons not consumed in the emission layer 130 and the diffusion of energy of an excited state generated in the emission layer 130 into the hole transport laminated structure may be prevented.

In the organic EL device 100, light emission, mainly via a singlet excited state, may be obtained in the emission layer 130. As the material of the emission layer 130, suitable luminescent materials may be used, e.g., a fluoranthene derivative, a pyrene derivative, an arylacetylene derivative, a fluorene derivative, a perylene derivative, a chrysene derivative, or the like. In an implementation, the pyrene derivative, the perylene derivative, and/or the anthracene derivative may be used. For example, an anthracene derivative or anthracene-containing compound represented by the following Formula 3 may be used as the material of the emission layer 130.

[Formula 3]

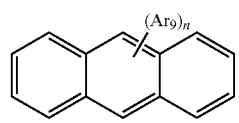

In Formula 3, each $Ar_9$ may independently be or include, e.g., a hydrogen atom, a deuterium atom, a substituted or unsubstituted alkyl group having 1 to 50 carbon atoms, a substituted or unsubstituted cycloalkyl group having 3 to 50 ring carbon atoms, a substituted or unsubstituted alkoxy group having 1 to 50 carbon atoms, a substituted or unsubstituted aralkyl group having 7 to 50 carbon atoms, a substituted or unsubstituted aryloxy group having 6 to 50 ring carbon atoms, a substituted or unsubstituted arylthio group having 6 to 50 ring carbon atoms, a substituted or unsubstituted alkoxycarbonyl group having 2 to 50 carbon atoms, a substituted or unsubstituted aryl group having 6 to 50 ring carbon atoms, a substituted or unsubstituted heteroaryl group having 5 to 50 ring carbon atoms, a substituted or unsubstituted silyl group, a carboxyl group, a halogen atom, a cyano group, a nitro group or a hydroxyl group, and n may be an integer of 1 to 10.

In an implementation, $Ar_9$ in the above Formula 3 may include, e.g., a phenyl group, a biphenyl group, a terphenyl group, a naphthyl group, a phenylnaphthyl group, a naphthylphenyl group, an anthryl group, a phenanthryl group, a fluorenyl group, an indenyl group, a pyrenyl group, an acetonaphthenyl group, a fluoranthenyl group, a triphenylenyl group, a pyridyl group, a furanyl group, a pyranyl group, a thienyl group, a quinolyl group, an isoquinolyl group, a benzofuranyl group, a benzothienyl group, an indolyl group, a carbazolyl group, a benzoxazolyl group, a benzothiazolyl group, a quinoxalyl group, a benzoxazolyl group, a pyrazolyl group, a dibenzofuranyl group, or a dibenzothienyl group. In an implementation, the phenyl group, the biphenyl group, the terphenyl group, the fluorenyl group, the carbazolyl group, the dibenzofuranyl group, or the like may be used.

In an implementation, the compound represented by Formula 3 may be, e.g., one of the following Compounds a-1 to a-12.

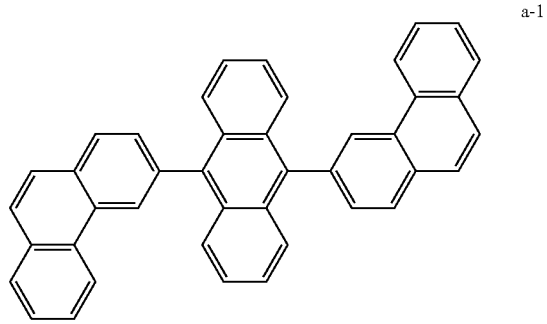

a-1

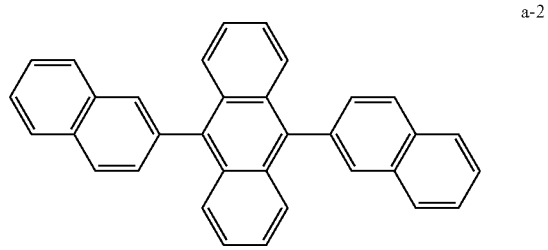

a-2

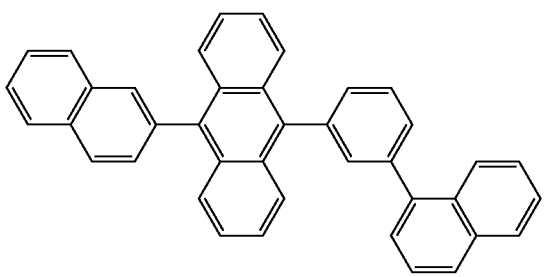

a-3

-continued a-4
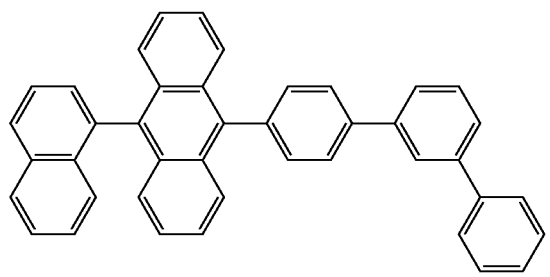

a-5
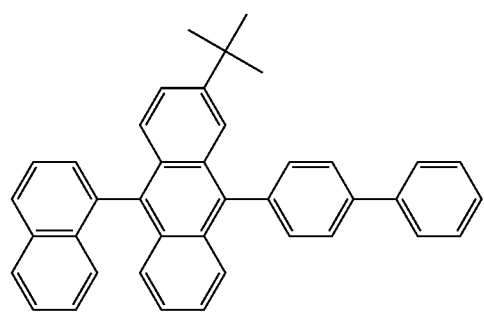

a-6
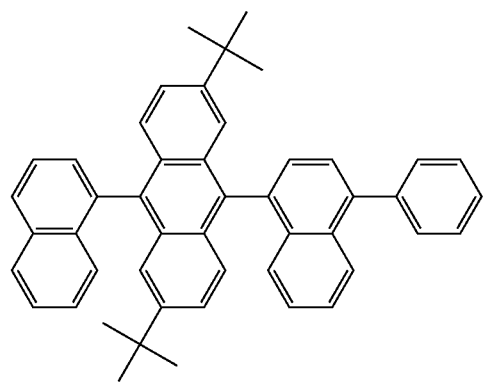

a-7
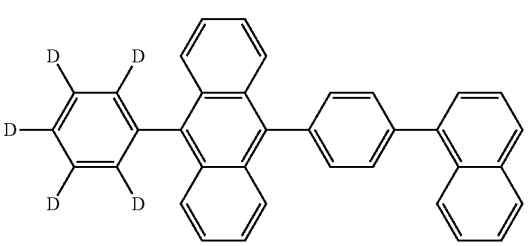

a-8
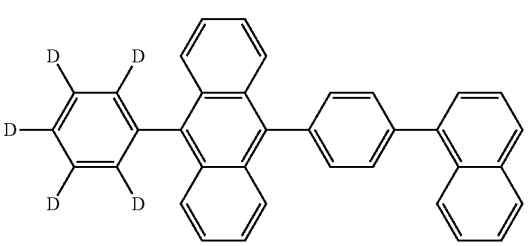

-continued a-9
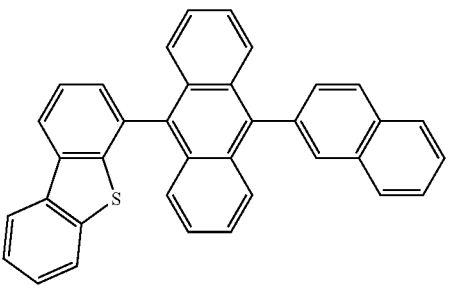

a-10
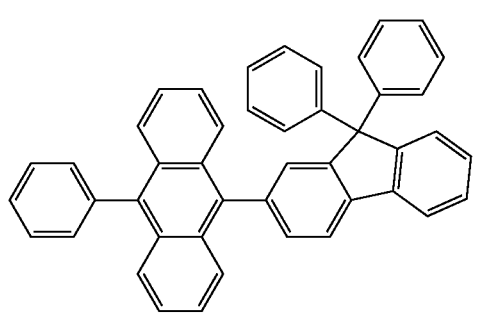

a-11
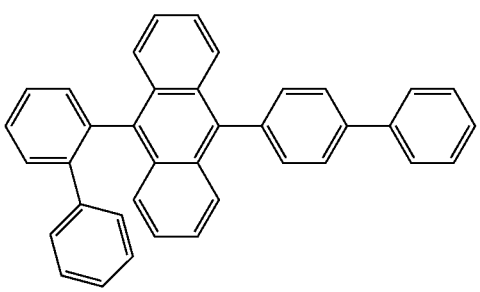

a-12
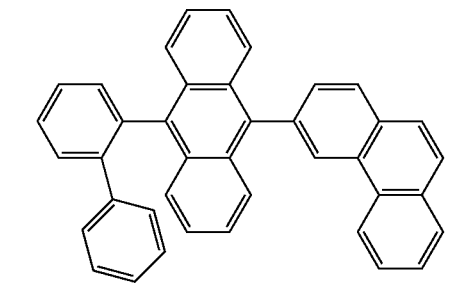

As described above, the organic EL device 100 according to an embodiment may help improve hole injection properties from the anode 110 by forming the first layer 121 using or including the electron accepting compound having a LUMO level from about −9.0 eV to about −4.0 eV as a main component. However, the above-described effects are remarkable when combined with the emission layer 130 including the compound represented by Formula 3, and the driving at a low voltage of the organic EL device 100 may be realized.

The organic EL device according to an embodiment will be explained in more detail referring to the organic EL device 100 shown in FIG. 1. In the organic EL device 100 according to an embodiment, the substrate 101 may be, e.g., a transparent glass substrate, a semiconductor substrate formed using silicon, or the like, or a flexible substrate of a resin, etc. The anode 110 may be disposed on the substrate 101 and may be formed using, e.g., ITO, IZO, or the like.

As described above, the hole transport band 120 may be disposed between the anode 110 and the emission layer 130. In an implementation, a hole injection layer may be formed as the first layer 121 (by using the electron accepting compound as a main component) on the anode 110.

The hole transport layer may be formed as the third layer 123 (using a material including the hole transport material represented by Formula 2) closer to the emission layer 130 than the hole injection layer 121, e.g., between the emission layer 130 and the hole injection layer 121. In an implementation, the hole transport layer 123 may be laminated in plural, and in this case, the hole transport layer disposed adjacent to the hole injection layer 121 may include the electron accepting compound.

An intermediate layer may be formed as the second layer 125 (using a material including the hole transport material represented by Formula 1) closer to the emission layer 130 than the hole transport layer 123, e.g., between the emission layer 130 and the hole transport layer 123. The intermediate layer 125 may be formed adjacent to, e.g., directly adjacent to or directly contacting, the emission layer 130. Thus, the diffusion of the electron accepting compound included in the hole injection layer 121 and/or the hole transport layer 123 into the emission layer 130 may be restrained or prevented, the hole transport laminated structure may be passivated from electrons not consumed in the emission layer 130, and the diffusion of energy of an excited state generated in the emission layer 130 into the hole transport laminated structure may be prevented. Accordingly, the emission efficiency and the life of the organic EL device may be improved.

The emission layer 130 may be formed adjacent to, e.g., directly adjacent to, the intermediate layer 125. As the host material of the emission layer 130, e.g., an anthracene-containing compound represented by Formula 3 may be used. In an implementation, the emission layer 130 may include a suitable p-type dopant such as TBP.

On the emission layer 130, an electron transport layer 140 may be formed using, e.g., a material including Alq3. On the electron transport layer 140, the electron injection layer 150 may be formed using a material including lithium fluoride, lithium 8-quinolinato, etc. In addition, on the electron injection layer 150, the cathode 160 may be formed using a metal such as Al, Ag, etc. or a transparent material such as ITO, IZO, etc. Each of the above-described layers may be formed by selecting an appropriate layer forming method according to a material, such as a vacuum deposition method, a sputtering method, various coating methods, etc.

In the organic EL device according to an embodiment, the material for an organic EL device may be applied in an organic EL display of an active-matrix type using a TFT.

In addition, in the organic EL device 100 according to an embodiment, through the combination of the layer structure and the materials, the hole transport laminated structure may be passivated from electrons not consumed in the emission layer 130, the diffusion of energy of an excited state generated in the emission layer 130 into the hole transport laminated structure may be prevented, and the whole charge balance of the organic EL device 100 may be controlled. In addition, by disposing the intermediate layer 125 toward or directly adjacent to the emission layer 130, the diffusion of the electron accepting compound into the emission layer 130 may be restrained, and the emission efficiency and the life of the organic EL device may be improved.

Example 2

Preparation Method

An organic EL device was manufactured using the above-described materials.

FIG. 2 illustrates a schematic diagram of an organic EL device 200 according to an embodiment. In this embodiment, an anode 110 was formed using ITO to have a layer thickness of about 150 nm. A layer HTL1 as a hole injection layer 221 having a layer thickness of about 10 nm was formed using Compound 39 as the electron accepting compound. HTL2 was formed as a hole transport layer 223 using Compound 25 (represented by Formula 2) or Compound 41 (described below) to have a layer thickness of about 10 nm. In addition, HTL3 was formed as an intermediate layer 225 using Compound 4 (as a compound represented by Formula 1) to have a layer thickness of about 10 nm.

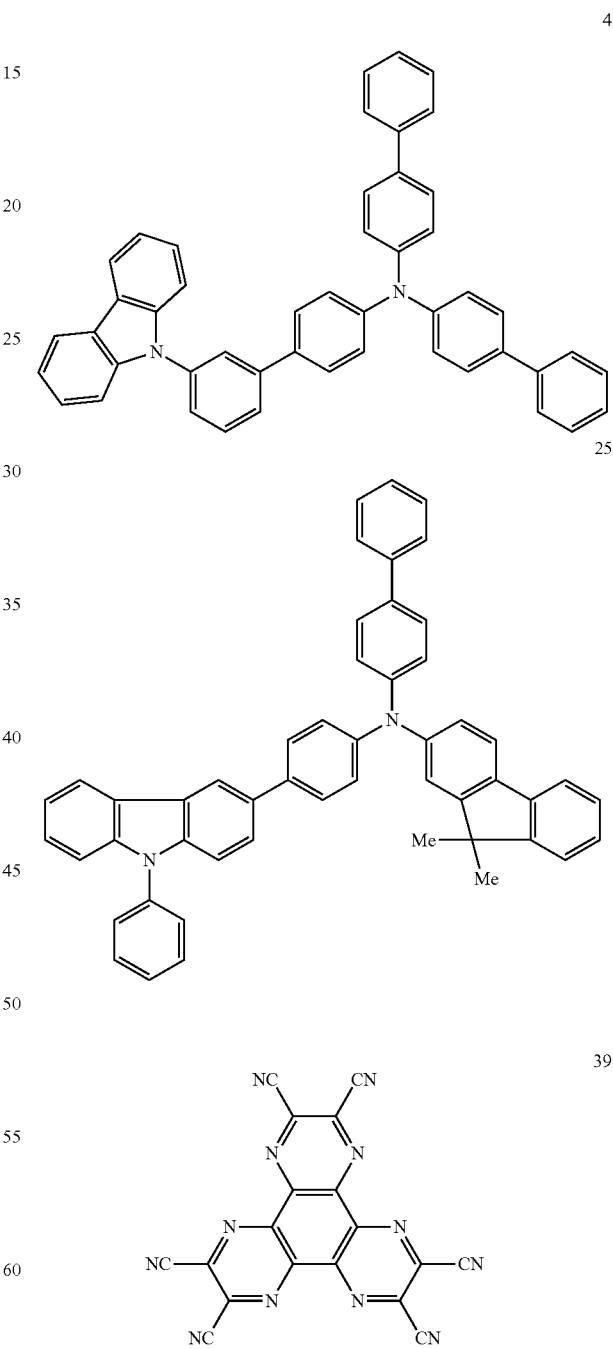

Then, an emission layer 130 was formed using a host material including ADN (as the compound represented by Formula 3), doped with about 3% of TBP to have a layer thickness of about 25 nm. An electron transporting layer 140 was formed using Alq3 to have a layer thickness of about 25 nm, an electron injection layer 150 was formed using LiF to have a layer thickness of about 1 nm, and a cathode 116 was formed using Al to have a layer thickness of about 100 nm.

In addition, organic EL devices were manufactured using the following Compounds 40 to 43, as opposed to the above-described compounds in HTL1 to HTL3, as Comparative Examples.

40

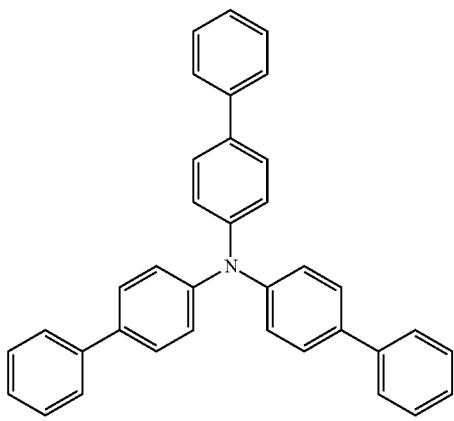

41

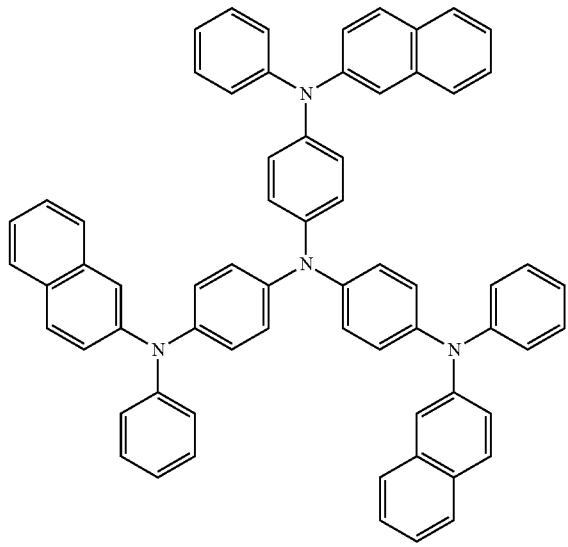

42

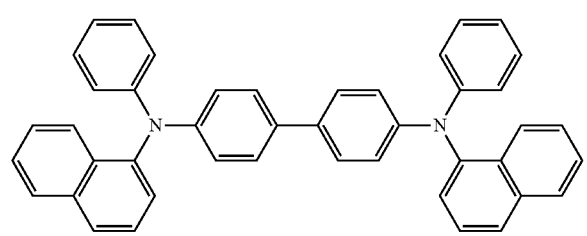

43

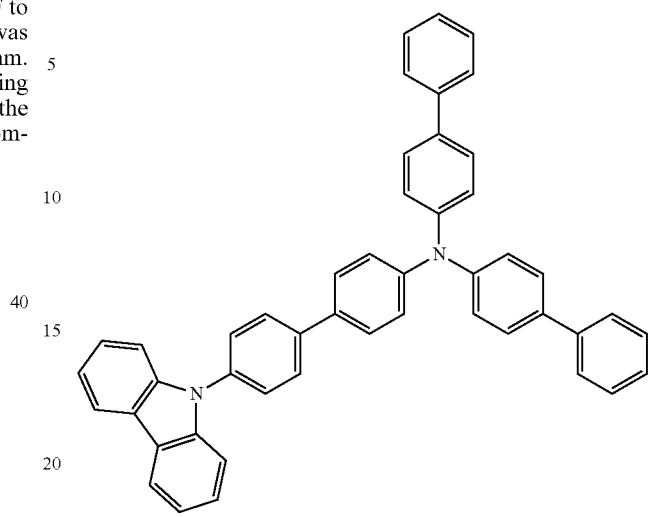

The combinations of the compounds used in the HTL1 to HTL3 of the organic EL devices according to the Examples and Comparative Examples are summarized in the following Table 3.

TABLE 3

|  | HTL1 | HTL2 | HTL3 |
| --- | --- | --- | --- |
| Example 2-1 | Compounds 39 | Compound 25 | Compound 4 |
| Example 2-2 | Compounds 39 | Compound 41 | Compound 4 |
| Comparative Example 2-1 | Compounds 39 | Compound 4 | Compound 25 |
| Comparative Example 2-2 | Compounds 25 | Compound 25 | Compound 4 |
| Comparative Example 2-3 | Compound 39 | Compounds 25 | Compound 40 |
| Comparative Example 2-4 | Compounds 39 | Compound 25 | Compound 42 |

With respect to the organic EL devices manufactured in the Examples and Comparative Examples, voltage, power efficiency, and current efficiency were evaluated. In addition, current density was about 10 mA/cm². Evaluation results are illustrated in the following Table 4.

TABLE 4

|  | Voltage (V) | Emission efficiency (cd/A) | Half life (h) |
| --- | --- | --- | --- |
| Example 1-1 | 6.5 | 7.7 | 3,500 |
| Example 1-2 | 6.6 | 7.5 | 2,900 |
| Comparative Example 1-1 | 6.8 | 6.5 | 2,100 |
| Comparative Example 1-2 | 7.5 | 6.3 | 2,000 |
| Comparative Example 1-3 | 6.5 | 7.3 | 2,400 |
| Comparative Example 1-4 | 6.7 | 7.4 | 2,500 |

As may be seen in Table 4, an improvement of the emission efficiency and the device life were observed for Example 2-1, when compared to a case in which HTL2 and HTL3 were reversed (Comparative Example 2-1) and to a case in which a layer including the electron accepting compound was not used in HTL1 to HTL3 (Comparative Example 2-2). In addition, the improving effects of the emission efficiency and the device life were observed in a case using the non-carbazole-based hole transport material, Compound 41, in the hole transport layer HTL2 (Example 2-2). In addition, when comparing Example 2-1 with a case using the non-carbazole-based hole transport material, Compound 40, in HTL3 (Comparative Example 2-3) or a case using a carbazole-based hole transport material, Compound 42, having a different structure from the compound having the carbazolyl group and represented by Formula 1, in HTL3, the effects of improving the emission efficiency and the device life were observed.

From the above explanation, in the laminated structure of at least three layers having different components disposed in the hole transport band in the organic EL device according to an embodiment, high efficiency and long life may be provided by disposing at least one layer formed by using an electron accepting compound having a LUMO level from about −9.0 eV to about −4.0 eV as a main component adjacent to the anode, e.g., directly adjacent to the anode, and by disposing at least one layer including a compound represented by Formula 1 closer to an emission layer than the layer including the electron accepting compound as a main component.

By way of summation and review, for the application of an organic EL device in a display apparatus, the organic EL device may have high efficiency and long life. For example, in a blue emission region and a green emission region, the emission efficiency and the life of the organic EL device may not be sufficient. To realize the high efficiency of the organic EL device, a band between an anode and an emission layer, and the normalization and the stabilization with the emission layer may be considered. The disposition of a layer formed using an electron accepting material (hereinafter, will be referred to as an acceptor layer) to assist hole transportation may be considered.

As a hole transport material used in a hole transport layer, various compounds such as an anthracene-containing compound or an aromatic amine compound, etc. may be considered. However, an organic EL device using an amine compound including a carbazole part in a hole transport layer or an emission layer may be considered. In addition, an organic EL device including an electron accepting dopant having the lowest unoccupied molecular orbital (LUMO) level from about −9.0 eV to about −4.0 eV in at least one layer of organic material layers disposed between an emission layer and an anode may be considered.

In addition, an organic EL device manufactured by laminating a hole transport layer formed by using an amine-containing compound having a carbazole moiety and a fluorene moiety and being adjacent to an emission layer and having a hole injection layer having a three-layered structure between an anode and the hole transport layer may be considered. The hole injection layer may include from the anode, (1) a layer including a diamine derivative in which each carbazole moiety is combined with two nitrogen atoms, respectively, (2) a layer including a diamine derivative in which each carbazole moiety is combined with two nitrogen atoms, respectively, and an amine derivative in which a carbazole moiety and a fluorine moiety are combined with a nitrogen atom, and (3) a layer including HAT. In addition, an organic EL device having a repeating structure of (1) a layer including an amine derivative having a carbazole moiety and a fluorene moiety, (2) a layer including an amine derivative having a HAT doped carbazole moiety and a fluorene moiety, and (3) a layer including an amine derivative having a carbazole moiety and a fluorene moiety, between an anode and an emission layer, wherein the layer including the amine derivative having the carbazole moiety and the fluorene moiety is adjacent to the emission layer, may be considered.

A material for forming a specific layer of an organic EL device may be considered in view of the configuration of device.

The embodiments may provide an organic electroluminescent device having high efficiency and long life.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. An organic electroluminescent (EL) device, comprising:
   an anode;
   an emission layer for obtaining luminescence via a singlet excited state; and
   a laminated structure between the anode and the emission layer, the laminated structure including at least three layers having different components,
   wherein the laminated structure includes:
   a first layer including a hole transport compound, the hole transport compound being doped with an electron accepting compound that has a lowest unoccupied molecular orbital (LUMO) level of about −9.0 eV to about −4.0 eV;
   a second layer between the first layer and the emission layer, the second layer being closer to the emission layer than the first layer and including a compound represented by the following Formula 1,
   a third layer between the first layer and the second layer, the third layer includes a compound represented by the following Formula 2:

[Formula 1]

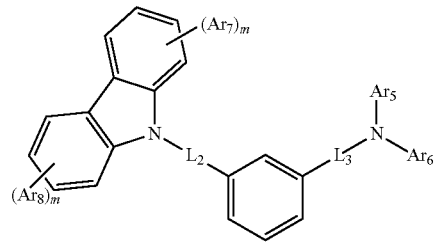

wherein, in Formula 1,
$Ar_5$ to $Ar_8$ are each independently a substituted or unsubstituted aryl group having 6 to 50 ring carbon atoms or a substituted or unsubstituted heteroaryl group having 5 to 50 ring carbon atoms,
adjacent $Ar_7$s can be combined to form a ring, and adjacent $Ar_8$s can be combined to form a ring,
each m is independently an integer of 0 to 4, and L₂ and L₃ are each independently a single bond, a substituted or unsubstituted arylene group having 6 to 18 ring carbon atoms, or a substituted or unsubstituted heteroarylene group having 5 to 15 ring carbon atoms,

[Formula 2]

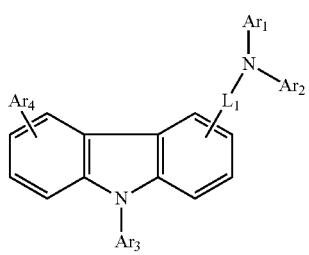

wherein, in Formula 2,
Ar₁, Ar₂, and Ar₃ are each independently a substituted or unsubstituted aryl group having 6 to 50 ring carbon atoms or a substituted or unsubstituted heteroaryl group having 5 to 50 ring carbon atoms,
Ar₄ is a substituted or unsubstituted aryl group having 6 to 50 ring carbon atoms, a substituted or unsubstituted heteroaryl group having 5 to 50 ring carbon atoms, or a substituted or unsubstituted alkyl group having 1 to 50 carbon atoms, and
L₁ is a single bond, a substituted or unsubstituted arylene group having 6 to 18 ring carbon atoms, or a substituted or unsubstituted heteroarylene group having 5 to 15 ring carbon atoms.

2. The organic EL device as claimed in claim 1, wherein the first layer includes a compound represented by Formula 2.

3. The organic EL device as claimed in claim 1, wherein the emission layer includes an anthracene-containing compound represented by the following Formula 3:

[Formula 3]

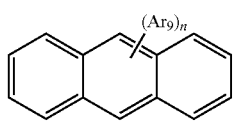

wherein, in Formula 3,
each Ar₉ is independently a hydrogen atom, a deuterium atom, a substituted or unsubstituted alkyl group having 1 to 50 carbon atoms, a substituted or unsubstituted cycloalkyl group having 3 to 50 ring carbon atoms, a substituted or unsubstituted alkoxy group having 1 to 50 carbon atoms, a substituted or unsubstituted aralkyl group having 7 to 50 carbon atoms, a substituted or unsubstituted aryloxy group having 6 to 50 ring carbon atoms, a substituted or unsubstituted arylthio group having 6 to 50 ring carbon atoms, a substituted or unsubstituted alkoxycarbonyl group having 2 to 50 carbon atoms, a substituted or unsubstituted aryl group having 6 to 50 ring carbon atoms, a substituted or unsubstituted heteroaryl group having 5 to 50 ring carbon atoms, a substituted or unsubstituted silyl group, a carboxyl group, a halogen atom, a cyano group, a nitro group, or a hydroxyl group, and
n is an integer of 1 to 10.

4. The organic EL device as claimed in claim 3, wherein the second layer includes one of the following Compounds 1 to 22:

1

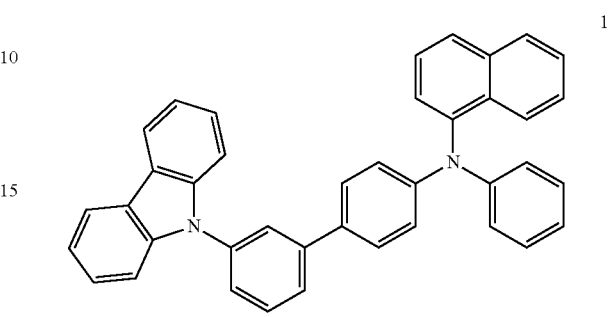

2

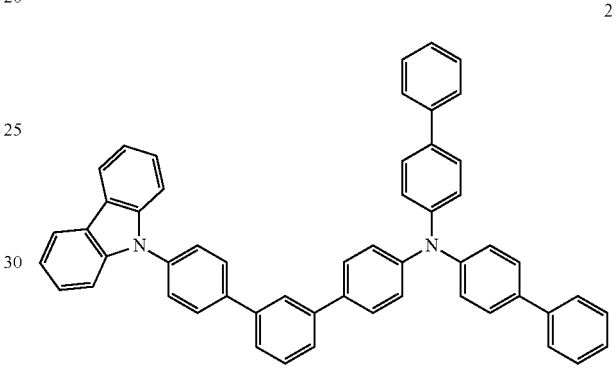

3

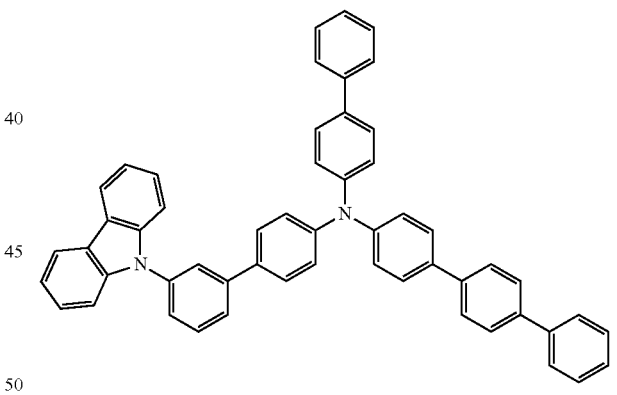

4

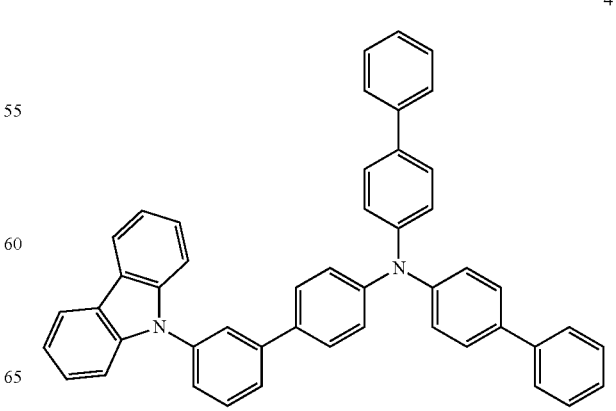

65
-continued
5
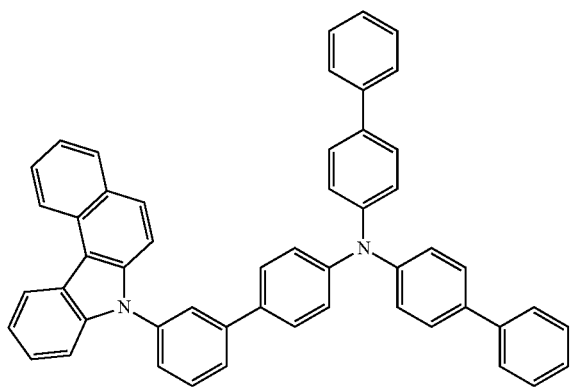
6
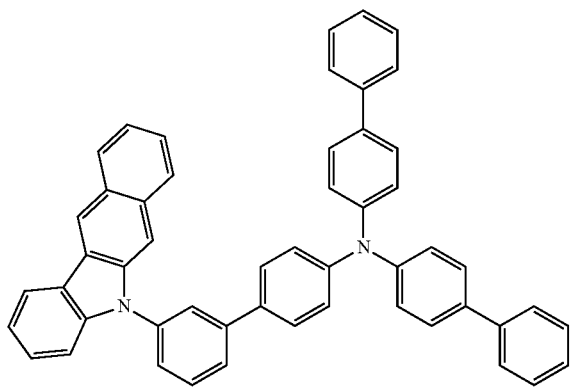
7
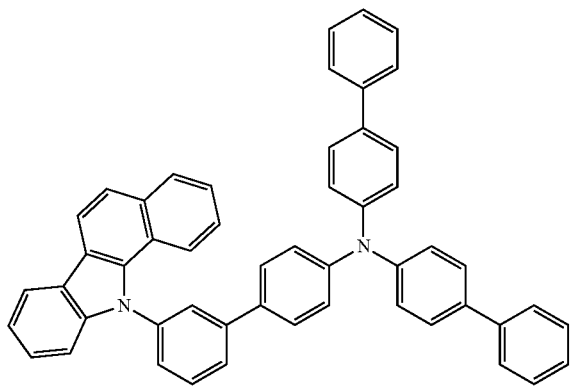
8
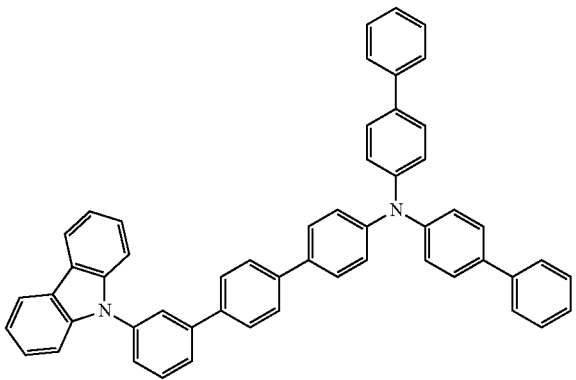
66
-continued
9
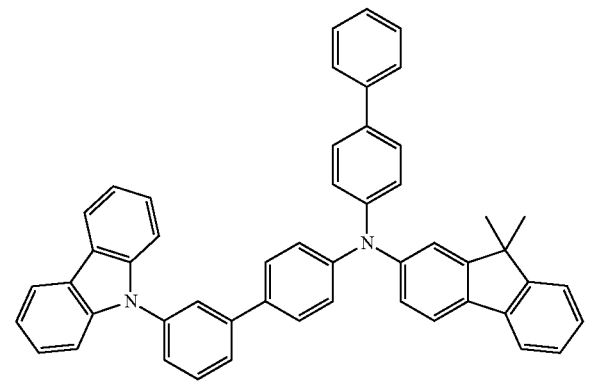
10
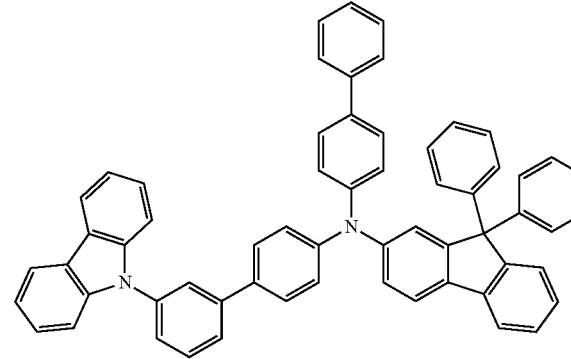
11
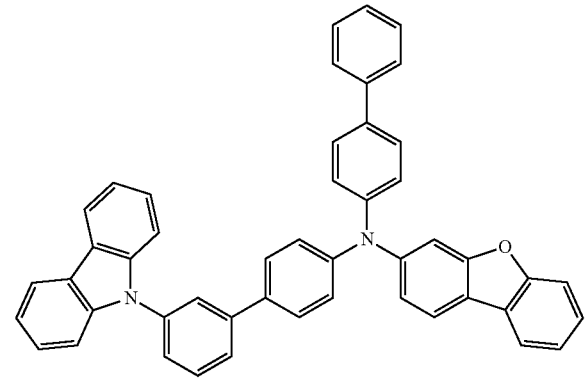
12
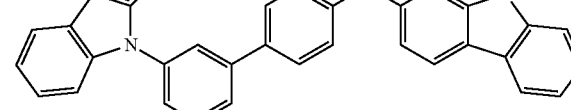

13
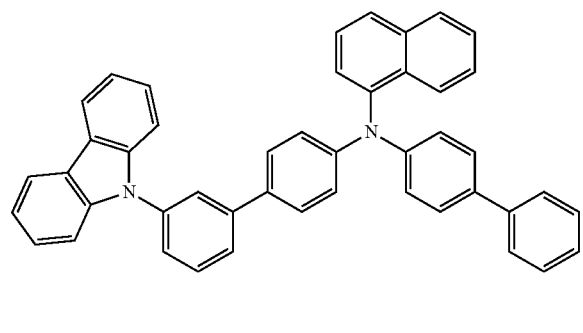
14
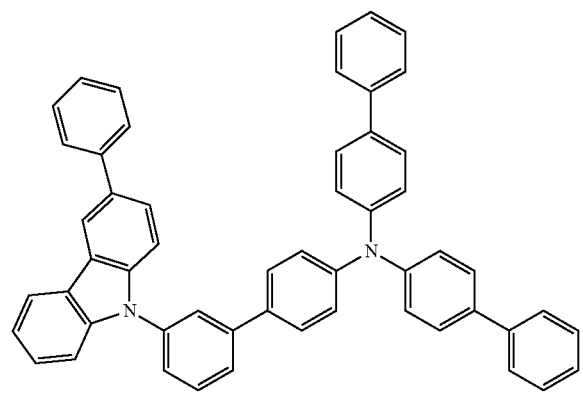
15
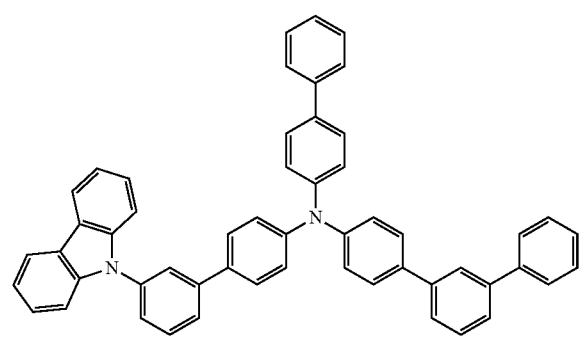
16
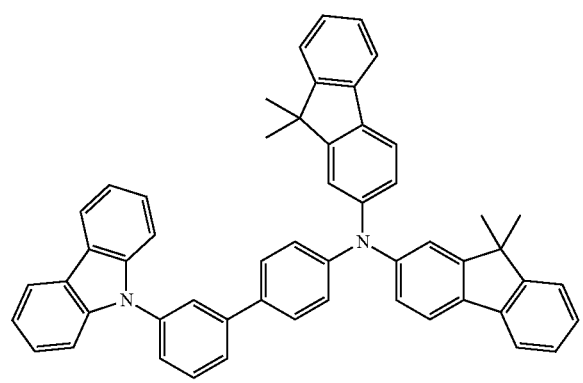
17
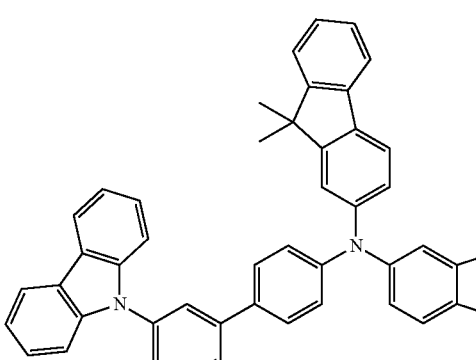
18
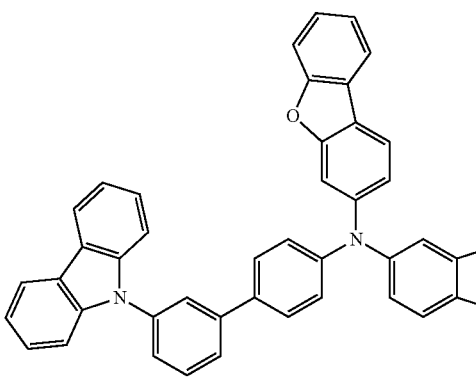
19
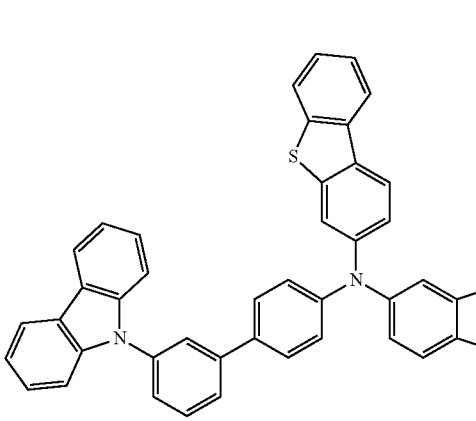

21
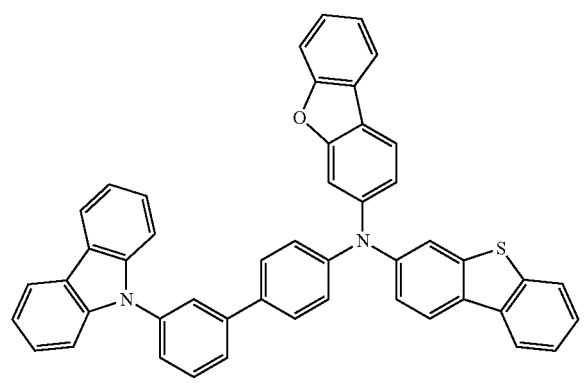
22
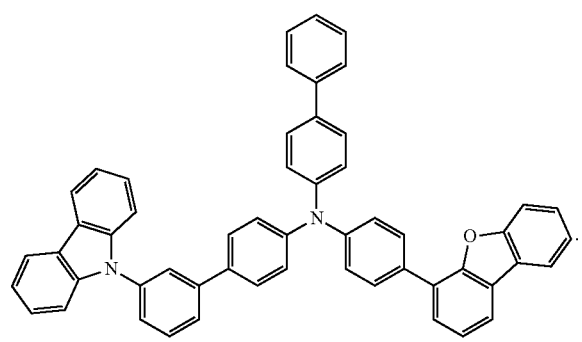
5. The organic EL device as claimed in claim 1, wherein the third layer includes one of the following Compounds 23 to 38:
23
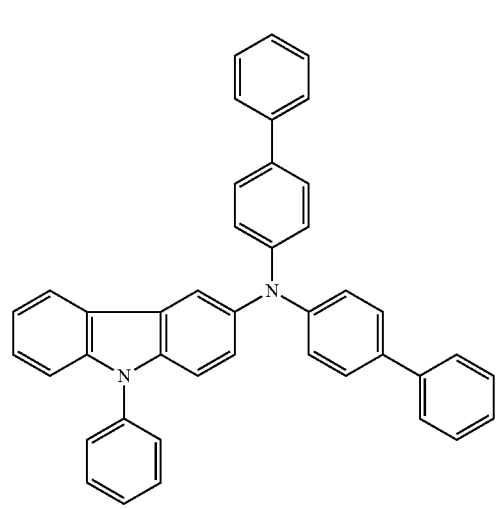
24
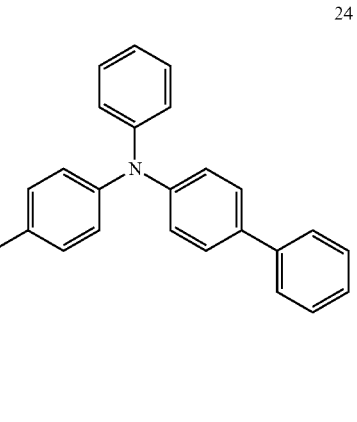
25
25
26

27
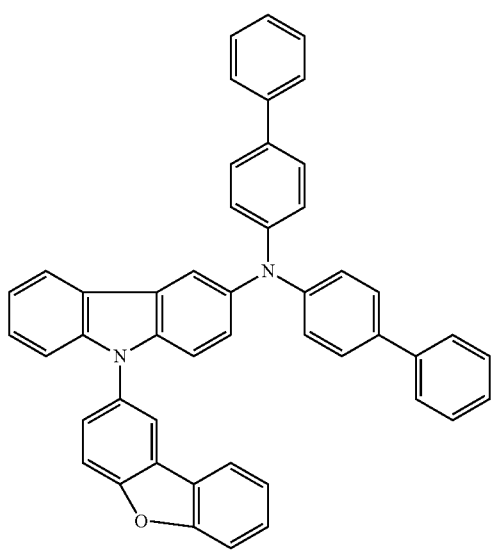
28
30
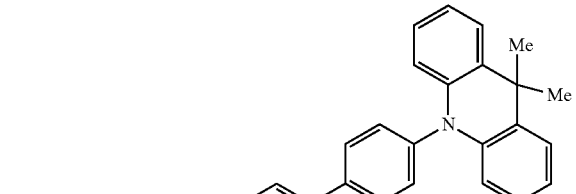
31
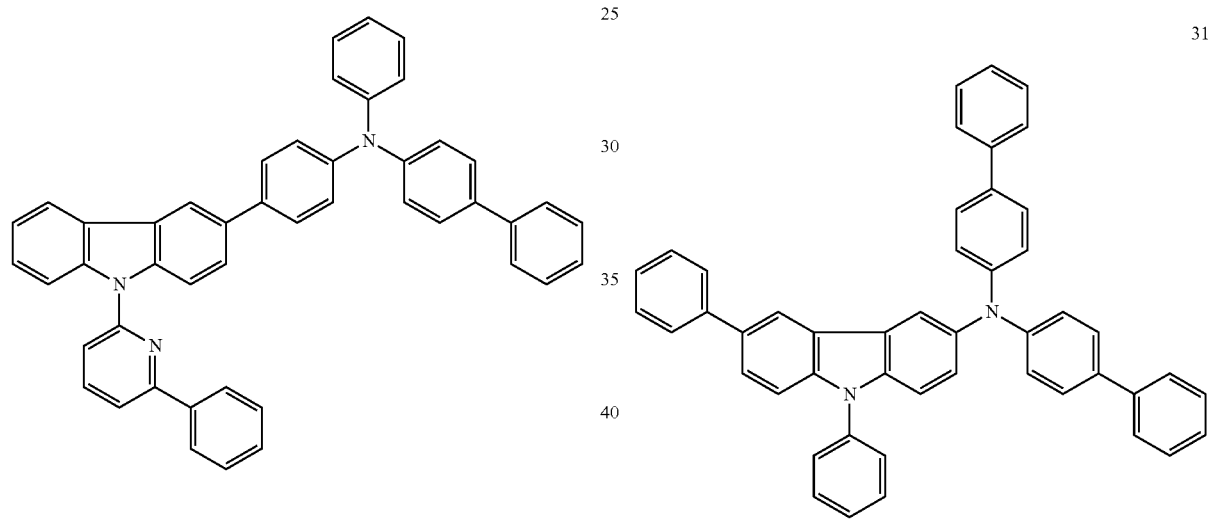
29
32
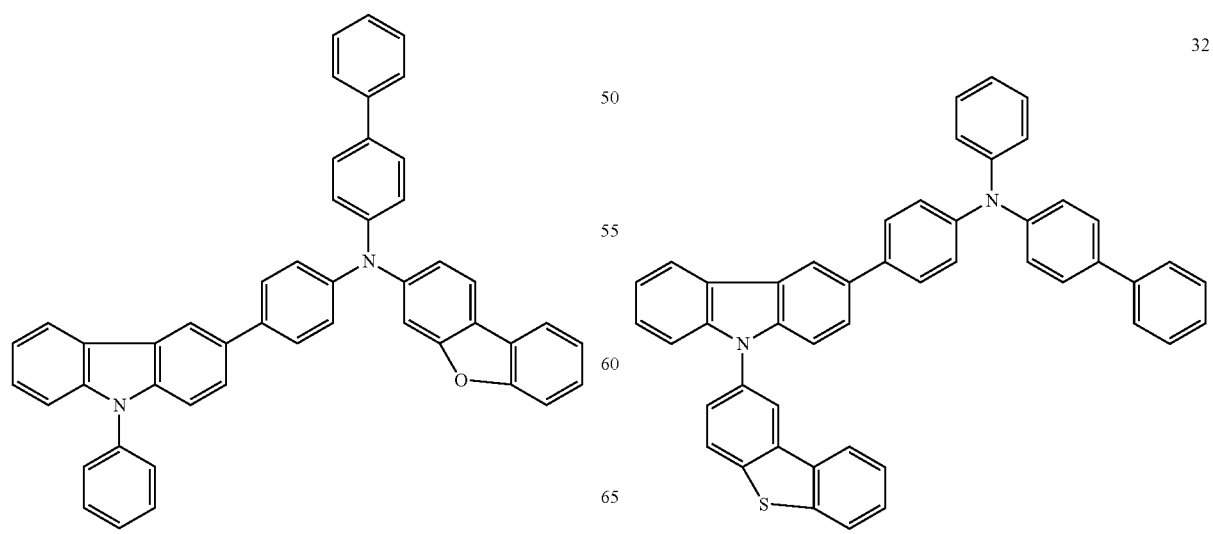

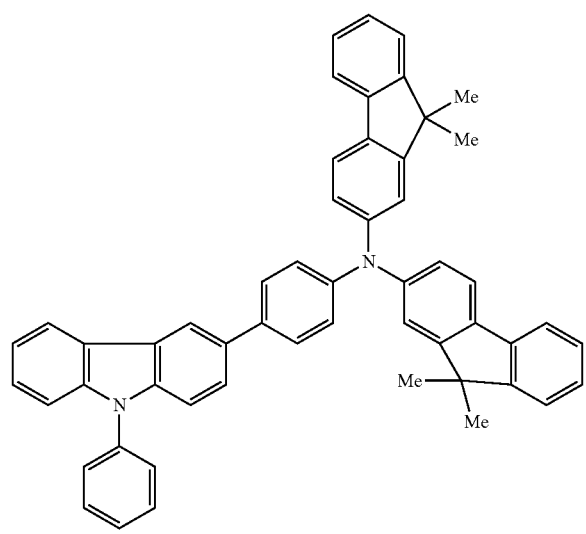
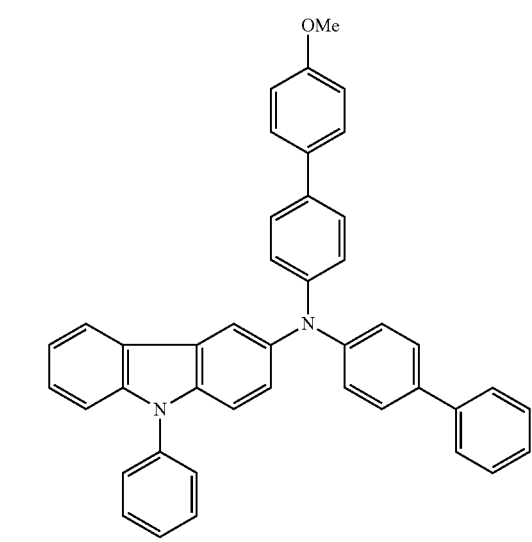
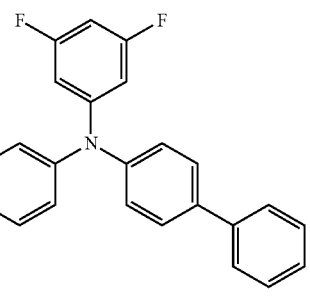
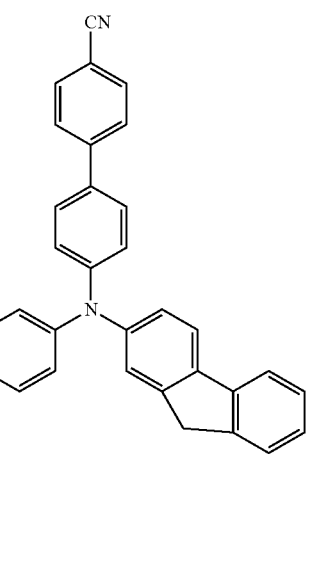
6. The organic EL device as claimed in claim 3, wherein the anthracene-containing compound includes one of the following Compounds a-1 to a-12:

a-1
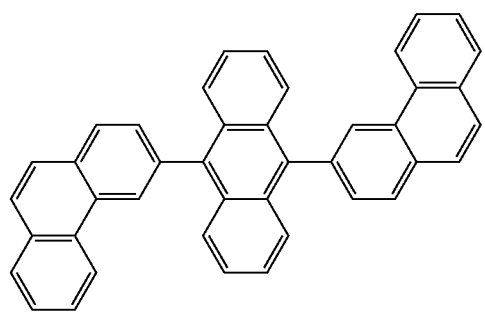
a-2
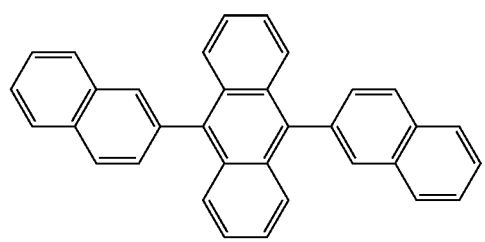
a-3
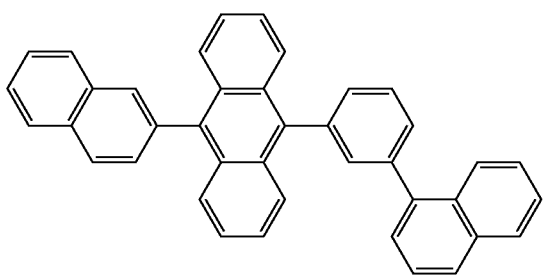
a-4
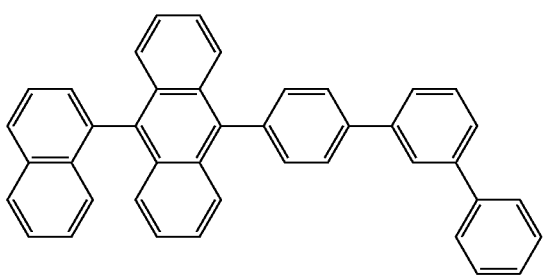
a-5
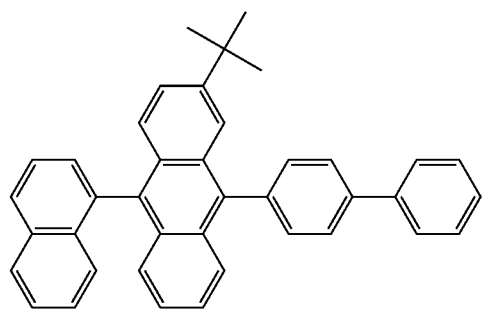
-continued
a-6
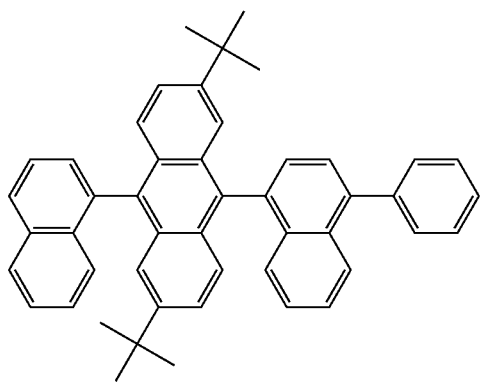
a-7
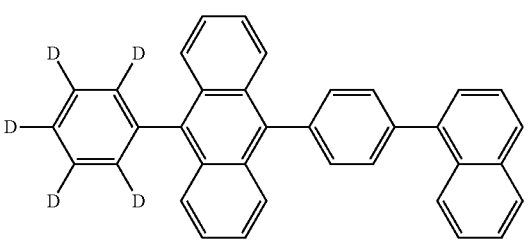
a-8
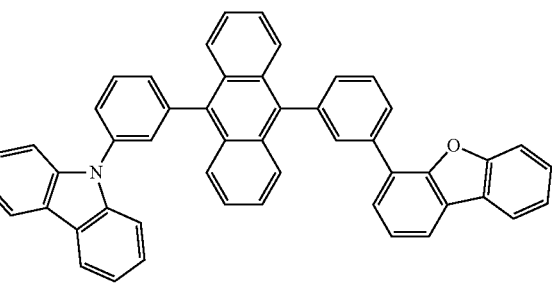
a-9
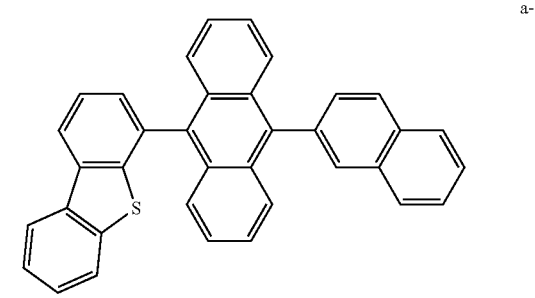
a-10
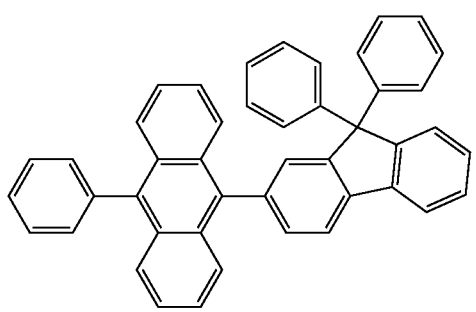

-continued a-11

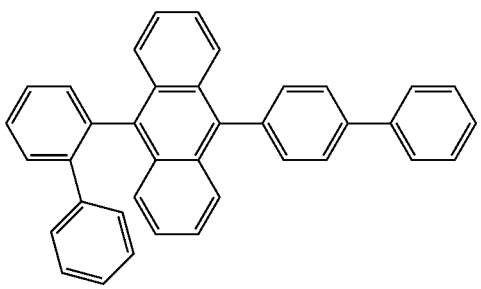

a-12

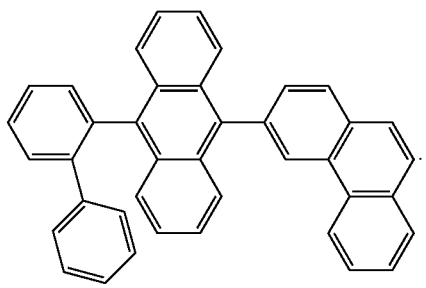

7. An organic electroluminescent (EL) device, comprising:
an anode;
an emission layer for obtaining luminescence via a singlet excited state; and
a laminated structure between the anode and the emission layer, the laminated structure including at least three layers having different components,
wherein the laminated structure includes:
a first layer including an electron accepting compound having a lowest unoccupied molecular orbital (LUMO) level of about −9.0 eV to about −4.0 eV as a main component;
a second layer between the first layer and the emission layer, the second layer being adjacent to the emission layer and including a compound represented by the following Formula 1, and
a third layer between the first layer and the second layer, the third layer includes a compound represented by the following Formula 2:

[Formula 1]

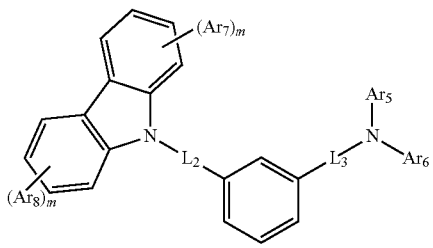

wherein, in Formula 1,
$Ar_5$ to $Ar_8$ are each independently a substituted or unsubstituted aryl group having 6 to 50 ring carbon atoms or a substituted or unsubstituted heteroaryl group having 5 to 50 ring carbon atoms,
adjacent $Ar_7$s can be combined to form a ring, and adjacent $Ar_8$s can be combined to form a ring, each m is independently an integer of 0 to 4, and
$L_2$ and $L_3$ are each independently a single bond, a substituted or unsubstituted arylene group having 6 to 18 ring carbon atoms, or a substituted or unsubstituted heteroarylene group having 5 to 15 ring carbon atoms,

[Formula 2]

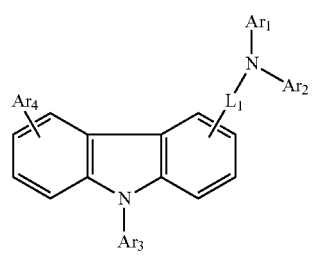

wherein, in Formula 2,
$Ar_1$, $Ar_2$, and $Ar_3$ are each independently a substituted or unsubstituted aryl group having 6 to 50 ring carbon atoms or a substituted or unsubstituted heteroaryl group having 5 to 50 ring carbon atoms,
$Ar_4$ is a substituted or unsubstitute aryl group having 6 to 50 ring carbon atoms, a substituted or unsubstituted heteroaryl group having 5 to 50 ring carbon atoms, or a substituted or unsubstituted alkyl group having 1 to 50 carbon atoms, and
$L_1$ is a single bond, a substituted or unsubstituted arylene group having 6 to 18 ring carbon atoms, or a substituted or unsubstituted heteroarylene group having 5 to 15 ring carbon atoms.

8. The organic EL device as claimed in claim 7, wherein the emission layer includes an anthracene-containing compound represented by the following Formula 3:

[Formula 3]

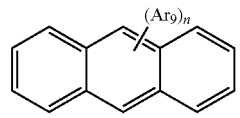

wherein, in Formula 3,
each $Ar_9$ is independently a hydrogen atom, a deuterium atom, a substituted or unsubstituted alkyl group having 1 to 50 carbon atoms, a substituted or unsubstituted cycloalkyl group having 3 to 50 ring carbon atoms, a substituted or unsubstituted alkoxy group having 1 to 50 carbon atoms, a substituted or unsubstituted aralkyl group having 7 to 50 carbon atoms, a substituted or unsubstituted aryloxy group having 6 to 50 ring carbon atoms, a substituted or unsubstituted arylthio group having 6 to 50 ring carbon atoms, a substituted or unsubstituted alkoxycarbonyl group having 2 to 50 carbon atoms, a substituted or unsubstituted aryl group having 6 to 50 ring carbon atoms, a substituted or unsubstituted heteroaryl group having 5 to 50 ring carbon atoms, a substituted or unsubstituted silyl group, a carboxyl group, a halogen atom, a cyano group, a nitro group, or a hydroxyl group, and
n is an integer of 1 to 10.

9. The organic EL device as claimed in claim 7, wherein the second layer includes one of the following Compounds 1 to 22:

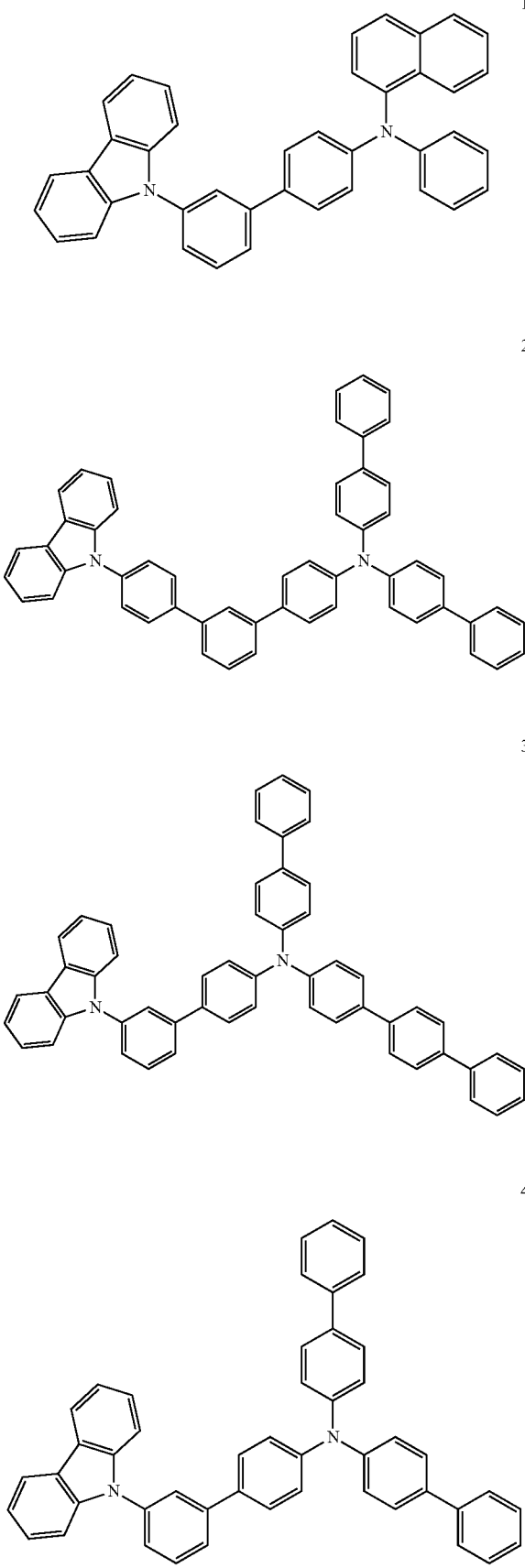 [SMILES: c1ccc(N(c2ccc(-c3cccc(-n4c5ccccc5c5ccccc54)c3)cc2)c2cccc3ccccc23)cc1 ; c1ccc(-c2ccc(N(c3ccc(-c4ccccc4)cc3)c3ccc(-c4cccc(-c5ccc(-n6c7ccccc7c7ccccc76)cc5)c4)cc3)cc2)cc1 ; c1ccc(-c2ccc(-c3ccc(N(c4ccc(-c5ccccc5)cc4)c4ccc(-c5cccc(-n6c7ccccc7c7ccccc76)c5)cc4)cc3)cc2)cc1 ; c1ccc(-c2ccc(N(c3ccc(-c4ccccc4)cc3)c3ccc(-c4cccc(-n5c6ccccc6c6ccccc65)c4)cc3)cc2)cc1]
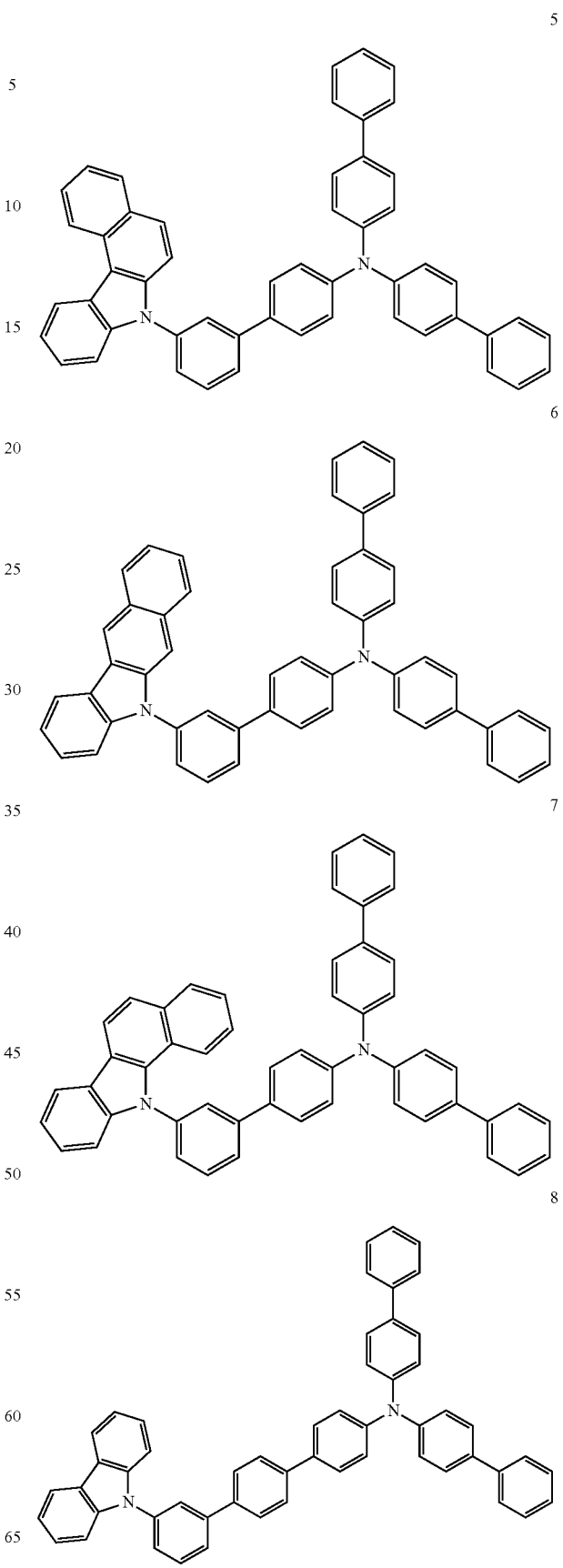

9
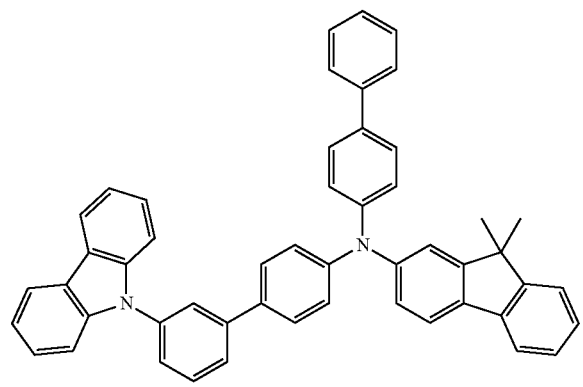
10
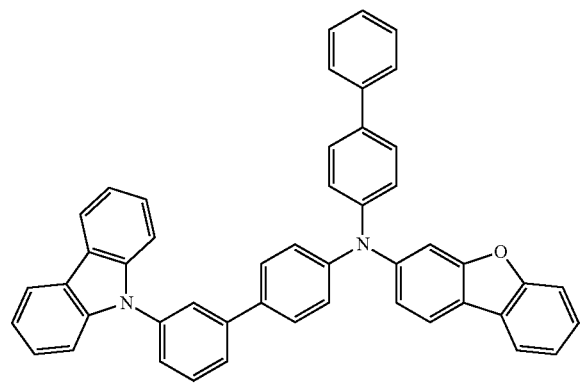
11
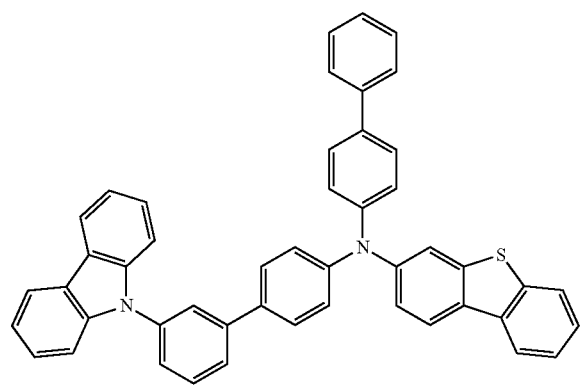
12
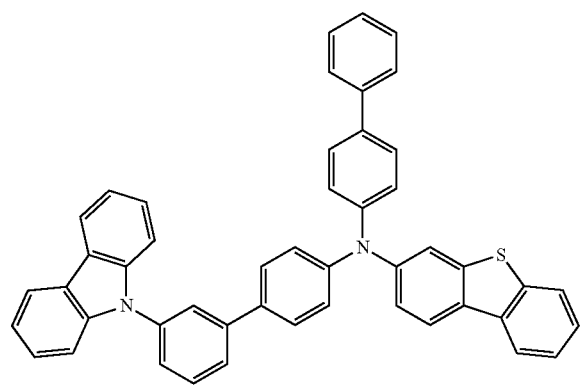
13
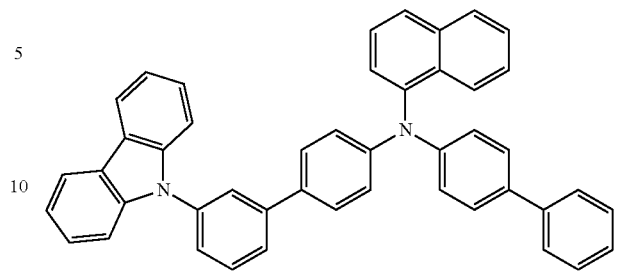
14
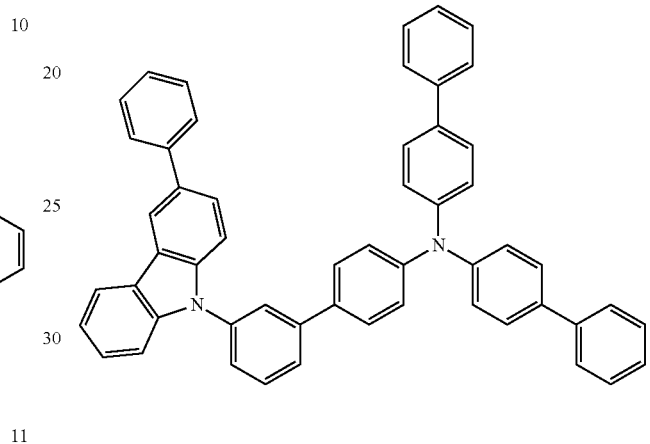
15
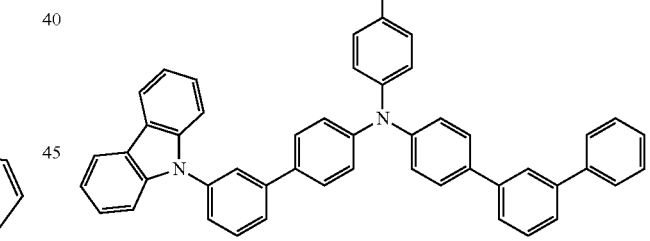
16
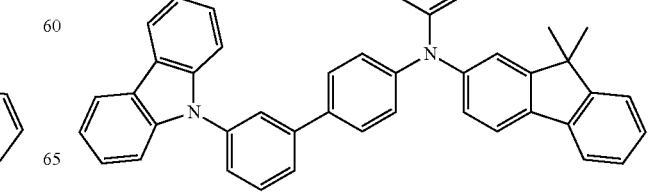

17
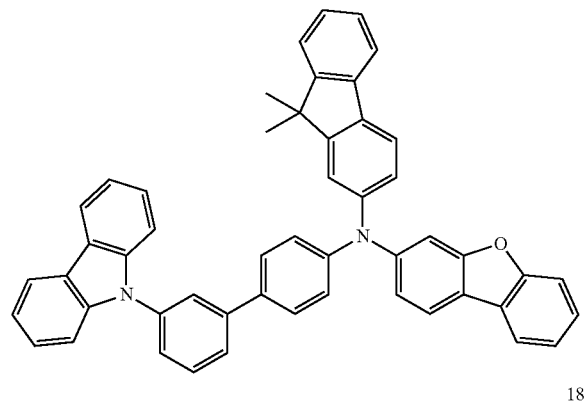
18
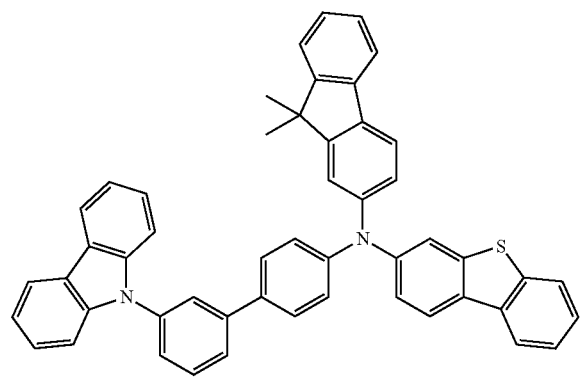
19
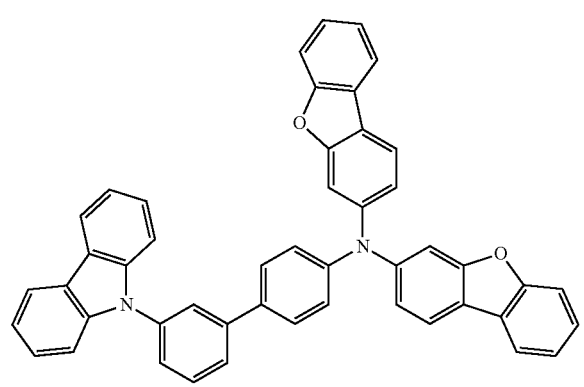
20
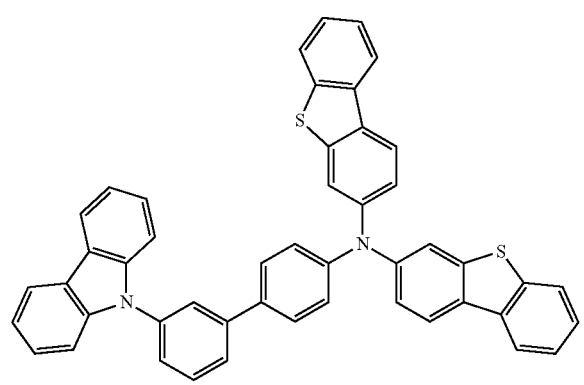
21
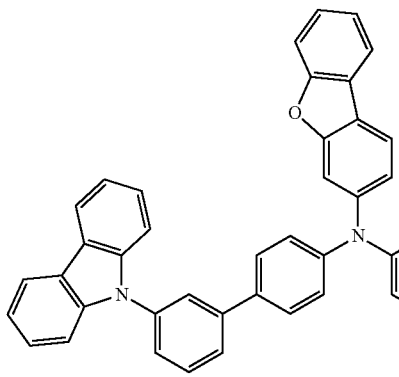
22
10. The organic EL device as claimed in claim 9, wherein the third layer includes one of the following Compounds 23 to 38:
23

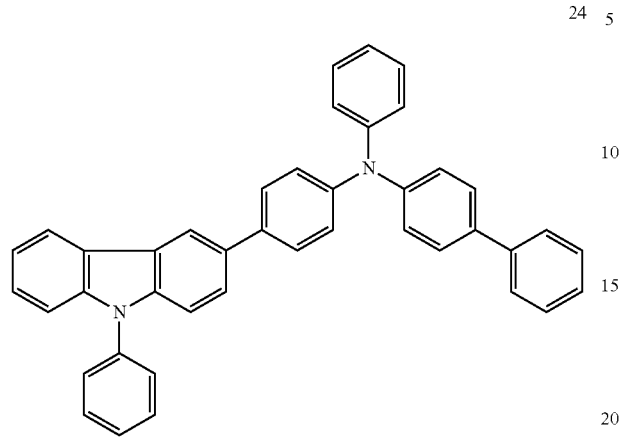
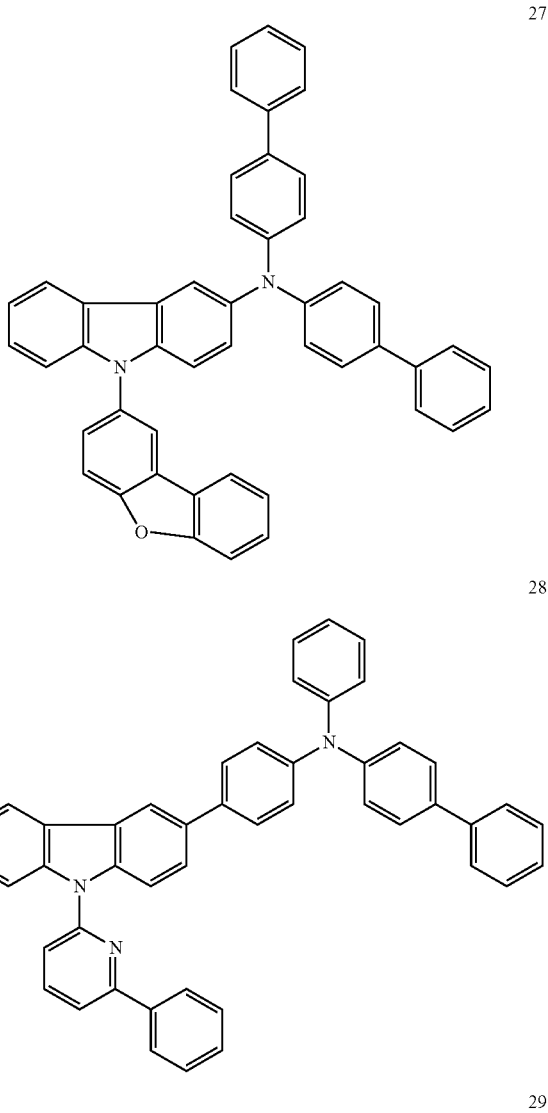
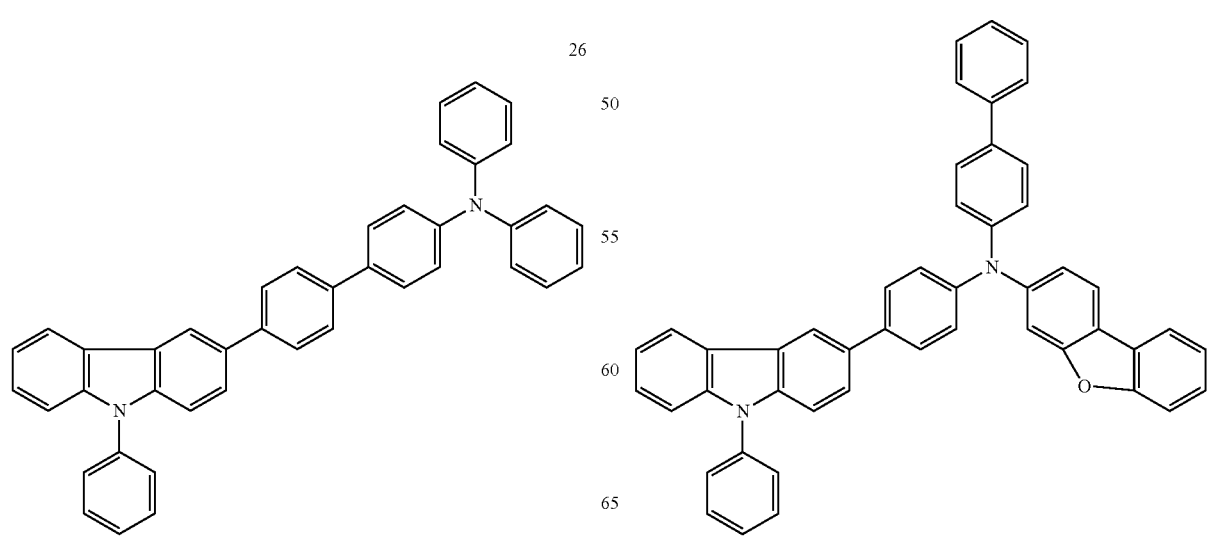

30
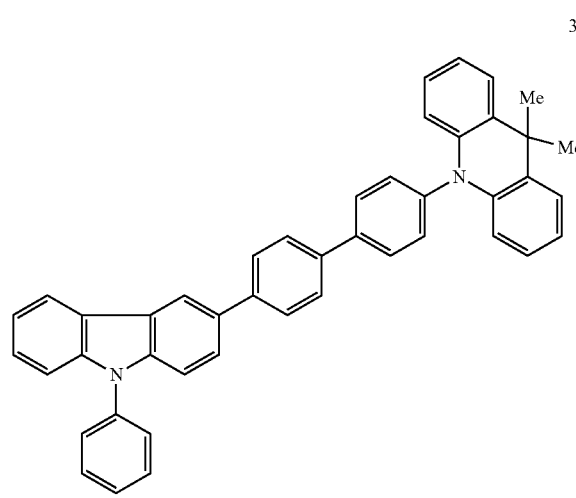
31
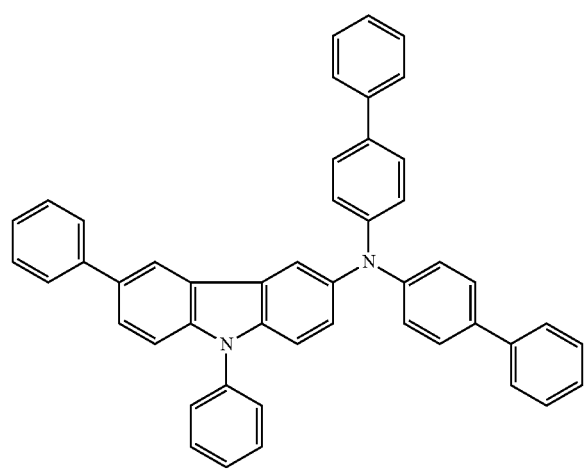
32
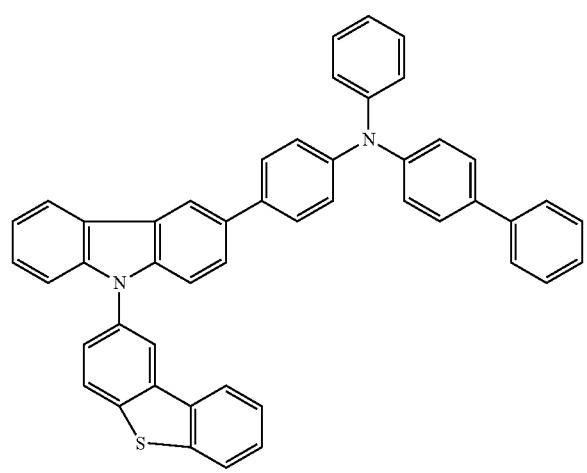
33
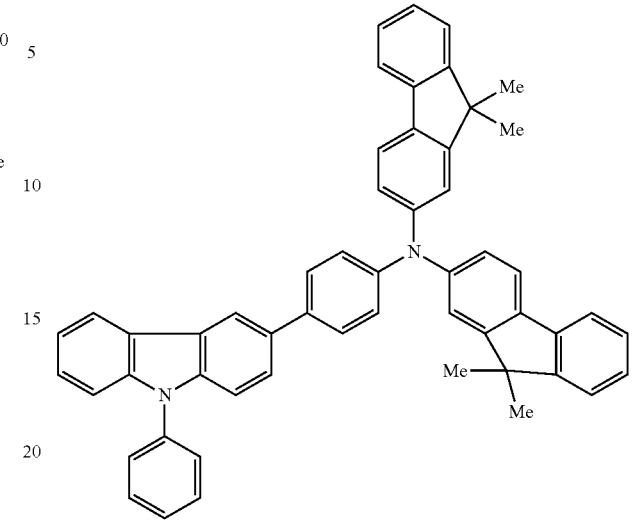
34
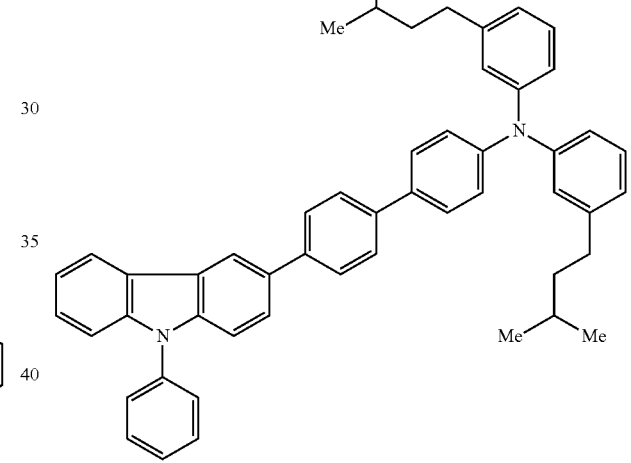
35
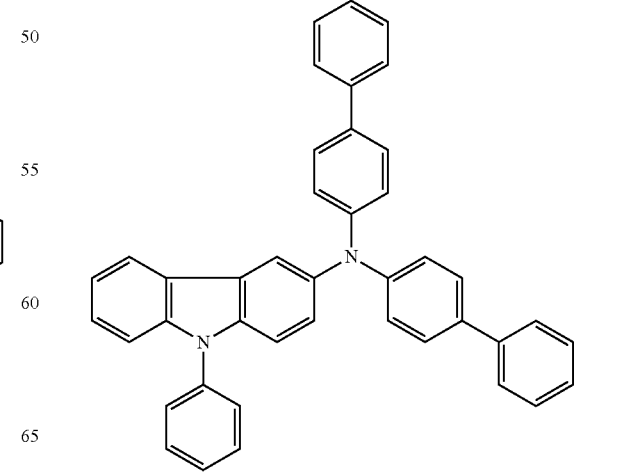

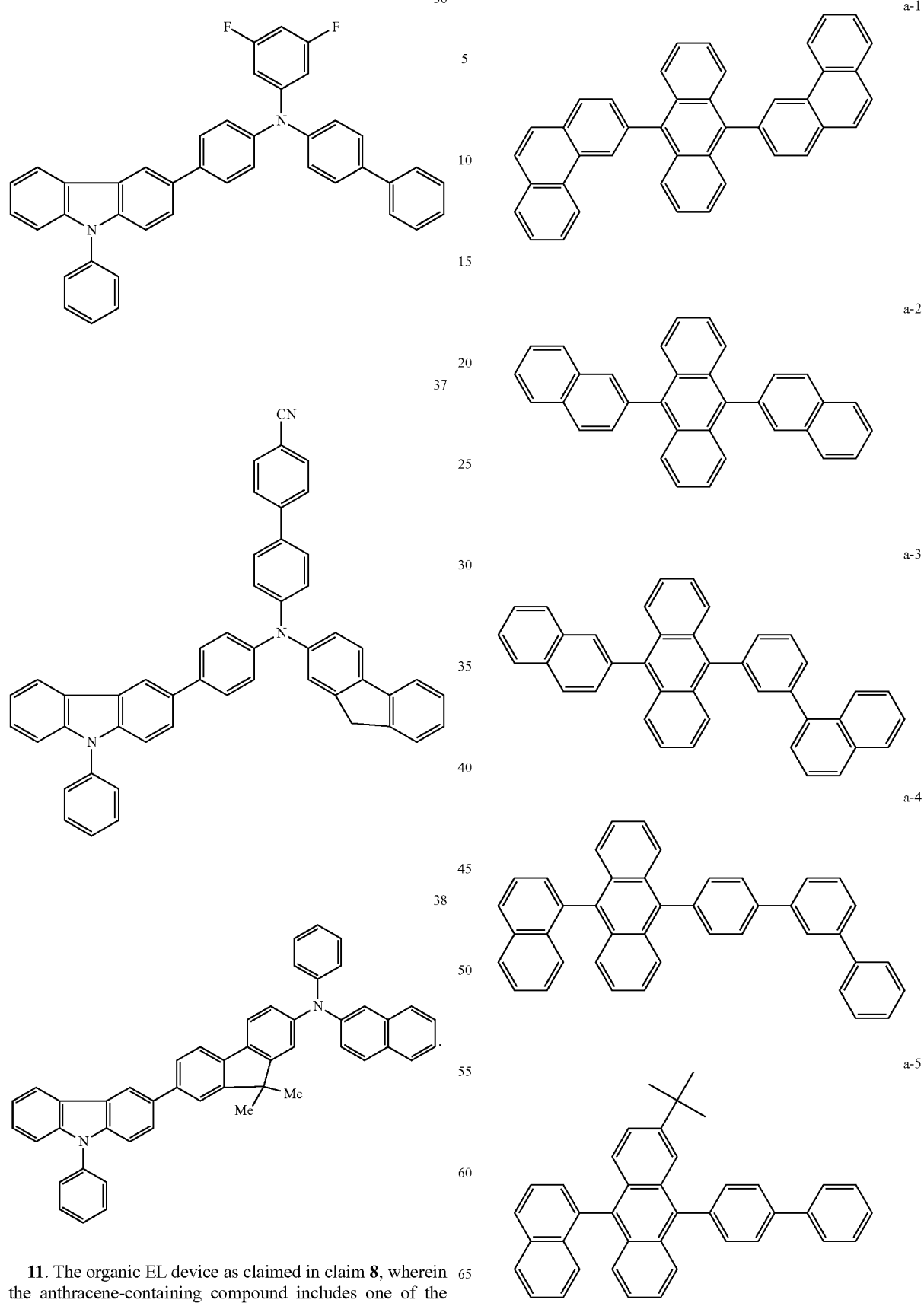
11. The organic EL device as claimed in claim 8, wherein the anthracene-containing compound includes one of the following Compounds a-1 to a-12:

-continued
a-6
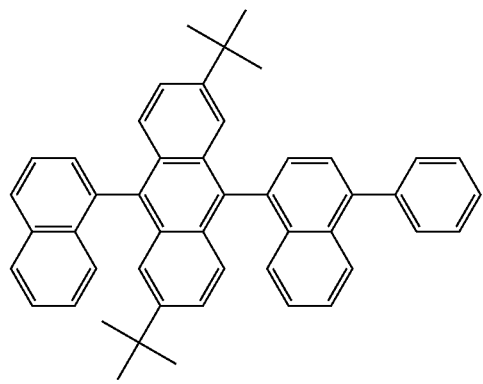
a-7
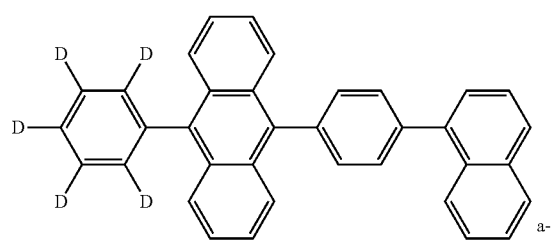
a-8
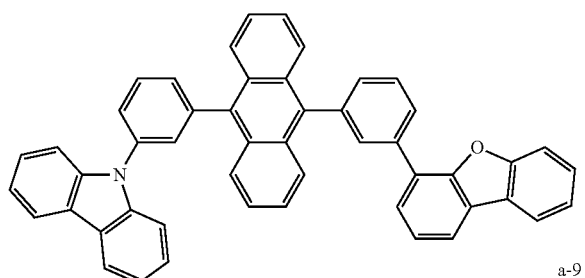
a-9
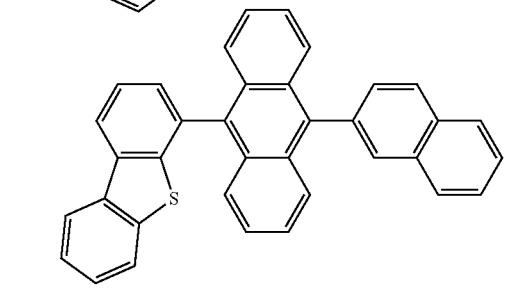
-continued
a-10
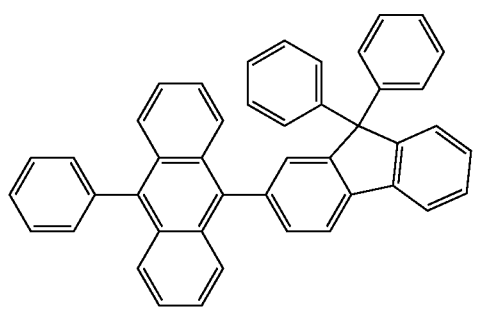
a-11
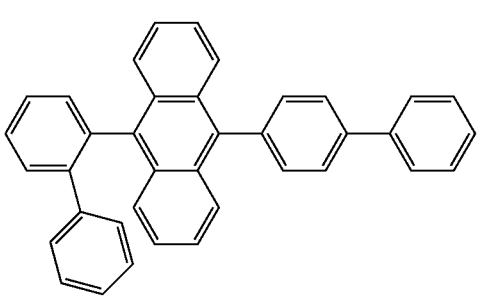
a-12
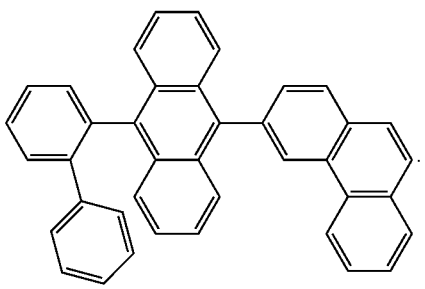
* * * * *